United States Patent
Govind et al.

(10) Patent No.: US 7,489,914 B2
(45) Date of Patent: Feb. 10, 2009

(54) MULTI-BAND RF TRANSCEIVER WITH PASSIVE REUSE IN ORGANIC SUBSTRATES

(75) Inventors: Vinu Govind, Decatur, GA (US); Sidharth Dalmia, Norcross, GA (US); Amit Bavisi, Atlanta, GA (US); Venkatesh Sundraram, Norcross, GA (US); Madhavan Swaminathan, Marietta, GA (US); George White, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 487 days.

(21) Appl. No.: 11/114,733

(22) Filed: Apr. 25, 2005

(65) Prior Publication Data

US 2005/0248418 A1    Nov. 10, 2005

Related U.S. Application Data

(63) Continuation-in-part of application No. 10/402,313, filed on Mar. 28, 2003, now Pat. No. 6,900,708.

(60) Provisional application No. 60/565,254, filed on Apr. 23, 2004.

(51) Int. Cl.
    *H04B 1/18* (2006.01)
(52) U.S. Cl. .................. 455/168.1; 455/252.1; 455/73; 455/552.1; 257/723; 257/724
(58) Field of Classification Search .............. 455/168.1, 455/252.1, 73, 552.1; 257/723, 724
    See application file for complete search history.

(56) References Cited

U.S. PATENT DOCUMENTS

| 4,745,215 A | 5/1988 | Cox et al. |
| 5,106,461 A | 4/1992 | Volfson et al. |
| 5,162,257 A | 11/1992 | Yung |
| 5,247,377 A | 9/1993 | Omeis et al. |

(Continued)

FOREIGN PATENT DOCUMENTS

EP    0 506 476 B1    3/1992

(Continued)

OTHER PUBLICATIONS http://sbir.gsfc.nasa.gov/SBIR/successes/ss/110text.html; Liquid Crystal Polymers for Printed Wiring Boards.

(Continued)

*Primary Examiner*—Sanh D Phu
(74) *Attorney, Agent, or Firm*—Thomas, Kayden, Horstemeyer & Risley, LLP

(57) ABSTRACT

The present invention allows for the use of chip-package co-design of RF transceivers and their components by using discrete active devices in conjunction with passive components. Two particular components are described, including voltage controlled oscillators (VCOs) and low noise amplifiers (LNAs). The high quality passive components for use in the VCOs and LNAs may be obtained by the use of embedded passives in organic substrates. Further, the embedded passives may have multi-band characteristics, thereby allowing multi-band VCOs and LNAs to be implemented with fewer components. In situations where size is a concern, the active devices and passive components utilized in an RF transceiver may be implemented in a low form factor module of less than 1.1 mm thick according to an embodiment of the invention.

20 Claims, 49 Drawing Sheets

U.S. PATENT DOCUMENTS

| | | | |
|---|---|---|---|
| 5,270,493 A | 12/1993 | Inoue et al. | |
| 5,323,128 A | 6/1994 | Ishizaki et al. | |
| 5,349,314 A | 9/1994 | Shimizu et al. | |
| 5,373,271 A | 12/1994 | Hirai et al. | |
| 5,384,434 A | 1/1995 | Mandai et al. | |
| 5,396,201 A | 3/1995 | Ishizaki et al. | |
| 5,401,913 A | 3/1995 | Gerber et al. | |
| 5,416,454 A | 5/1995 | McVeety | |
| 5,450,290 A | 9/1995 | Boyko et al. | |
| 5,497,337 A | 3/1996 | Ponnapalli et al. | |
| 5,517,751 A | 5/1996 | Bross et al. | |
| 5,521,564 A | 5/1996 | Kaneko et al. | |
| 5,532,667 A | 7/1996 | Haertling et al. | |
| 5,545,916 A | 8/1996 | Koullias | |
| 5,559,360 A | 9/1996 | Chiu et al. | |
| 5,610,433 A | 3/1997 | Merrill et al. | |
| 5,635,892 A | 6/1997 | Ashby et al. | |
| 5,654,681 A | 8/1997 | Ishizaki et al. | |
| 5,668,511 A | 9/1997 | Furutani et al. | |
| 5,679,414 A | 10/1997 | Akashi et al. | |
| 5,703,544 A | 12/1997 | Hays III | |
| 5,716,663 A | 2/1998 | Capote et al. | |
| 5,719,354 A | 2/1998 | Jester et al. | |
| 5,719,539 A | 2/1998 | Ishizaki et al. | |
| 5,720,898 A | 2/1998 | Nohira et al. | |
| 5,739,193 A | 4/1998 | Walpita et al. | |
| 5,770,986 A | 6/1998 | Tonegawa et al. | |
| 5,801,100 A | 9/1998 | Lee et al. | |
| 5,818,313 A | 10/1998 | Estes et al. | |
| 5,844,299 A | 12/1998 | Merrill et al. | |
| 5,917,244 A | 6/1999 | Lee et al. | |
| 5,955,931 A | 9/1999 | Kaneko et al. | |
| 5,999,243 A | 12/1999 | Kameyama et al. | |
| 6,005,197 A | 12/1999 | Kola et al. | |
| 6,008,102 A | 12/1999 | Alford et al. | |
| 6,021,050 A | 2/2000 | Ehman et al. | |
| 6,026,286 A | 2/2000 | Long | |
| 6,031,727 A | 2/2000 | Duesman et al. | |
| 6,040,226 A | 3/2000 | Wojnarowski et al. | |
| 6,051,289 A | 4/2000 | Tsujimoto et al. | |
| 6,075,995 A * | 6/2000 | Jensen | 455/552.1 |
| 6,079,100 A | 6/2000 | Farquhar et al. | |
| 6,093,599 A | 7/2000 | Lee et al. | |
| 6,114,925 A | 9/2000 | Lo | |
| 6,127,905 A | 10/2000 | Horie | |
| 6,153,290 A | 11/2000 | Sunahara | |
| 6,166,799 A | 12/2000 | Kameyama et al. | |
| 6,171,716 B1 | 1/2001 | Sasaki et al. | |
| 6,177,853 B1 | 1/2001 | Nagatomi et al. | |
| 6,191,666 B1 | 2/2001 | Sheen | |
| 6,191,669 B1 | 2/2001 | Shigemura | |
| 6,225,696 B1 | 5/2001 | Hathaway et al. | |
| 6,249,962 B1 | 6/2001 | Bergstedt | |
| 6,255,714 B1 | 7/2001 | Kossives et al. | |
| 6,259,037 B1 | 7/2001 | Feilchenfeld et al. | |
| 6,259,148 B1 | 7/2001 | Bartush et al. | |
| 6,261,872 B1 | 7/2001 | Hathaway et al. | |
| 6,281,430 B1 | 8/2001 | Lupo et al. | |
| 6,287,931 B1 | 9/2001 | Chen | |
| 6,303,423 B1 | 10/2001 | Lin | |
| 6,380,608 B1 | 4/2002 | Bentley | |
| 6,395,374 B1 | 5/2002 | McAndrew et al. | |
| 6,421,225 B2 | 7/2002 | Bergstedt | |
| 6,445,266 B1 | 9/2002 | Nagatomi et al. | |
| 6,492,886 B1 | 12/2002 | Kushitani et al. | |
| 6,528,732 B1 | 3/2003 | Okubora et al. | |
| 6,583,687 B2 | 6/2003 | Nosaka | |
| 6,625,037 B2 | 9/2003 | Nakatani et al. | |
| 6,713,162 B2 | 3/2004 | Takaya et al. | |
| 7,224,232 B2 * | 5/2007 | Paul et al. | 330/307 |
| 7,253,681 B2 * | 8/2007 | Ichitsubo et al. | 330/140 |
| 2001/0004228 A1 | 6/2001 | Hirai et al. | |
| 2001/0016980 A1 | 8/2001 | Bergstedt | |
| 2001/0050599 A1 | 12/2001 | Maekawa et al. | |
| 2002/0008301 A1 | 1/2002 | Liou et al. | |
| 2002/0048930 A1 | 4/2002 | Lin | |
| 2002/0064701 A1 | 5/2002 | Hand et al. | |
| 2002/0064922 A1 | 5/2002 | Lin | |
| 2002/0074158 A1 | 6/2002 | St. Lawrence et al. | |
| 2002/0076538 A1 | 6/2002 | St. Lawrence et al. | |
| 2002/0081443 A1 | 6/2002 | Connelly et al. | |
| 2002/0157864 A1 | 10/2002 | Koyama et al. | |
| 2002/0158305 A1 | 10/2002 | Dalmia et al. | |
| 2002/0172021 A1 | 11/2002 | Seri et al. | |
| 2002/0195270 A1 | 12/2002 | Okuboru et al. | |
| 2004/0000425 A1 | 1/2004 | White et al. | |
| 2004/0034489 A1 | 2/2004 | Ogino et al. | |

FOREIGN PATENT DOCUMENTS

| | | |
|---|---|---|
| EP | 0 510 971 B1 | 4/1992 |
| EP | 0 645 952 A1 | 9/1994 |
| EP | 1 235 235 A1 | 2/2002 |
| EP | 1 411 553 A1 | 4/2004 |
| JP | 07161583 | 6/1995 |
| JP | 09 130103 A | 10/1995 |
| WO | WO 01/95679 A1 | 12/2001 |
| WO | WO 01/97582 A1 | 12/2001 |

OTHER PUBLICATIONS www.yamaichi.us/yflex.html; Flexible Printed Circuit—YFLEX.

www.stneasy.org.tmp; Display from INSPEC; Taoka, M., Kanetaka, T., Dec. 4, 2002.

Hong, J.S., et al., "Microstrip Filters for RF/Microwave Applications", Wiley-Interscience PUblication, 2001, pp. 121-159.

Son, M.H., et al., "Low-Cost Realization of ISM Band Pass Filters Using Integrated Combine Structures," 2000, (4 pages).

Matijasevic, G., et al., "MCM-L Substrates Fabricated Using Patterned TLPS Conductive Composites," 1997 International Conference on Multichip Modules, Apr. 2, 1997, pp. 64-69.

Charles, H.K., "Packaging with Multichip Modules", 1992 IEEE/CHMT International Electronics Manufacturing Technology Symposium, pp. 206-210.

Min., S.H., et al., "Design, Fabrication, Measurement and Modeling of Embedded Inductors in Laminate Technology", ASME Int'l Elect. Pkg. Technical Conf, 2001 pp. 1-5.

Dalmia, S., et al. Modeling RF Passive Circuits Using Coupled LInes and Scable Modles, 2001 ECTC, pp. 816-823.

Alvin, L.S. Loke, et al. "Evaluation of Copper Penetration in Low-K Polymer Dielectrics by Bias-Temperature Stress", MRS Spring Meeting, Symp. N/O, Paper 04.4, Apr. 7, 1999.

Wang, et al., "A Full-Wave Analysis Model for Uniplanar Circuits with Lumped Elements", IEEE Transactions on Microwave Theory and Techniques, vol. 51, No. 1., Jan. 2003.

* cited by examiner

| Technology And References | Center Frequency (GHz) | Size, mm² and # of metal layers | Power Consumption (mW) | Phase Noise (dBc/Hz) @ offset Freq | Figure of Merit (dB) |
|---|---|---|---|---|---|
| LCP | 1.80 | 5 x 5.6, five metal layers plus SMDs | 10 | -117 @ 100 KHz | 192.1 |
| LCP | 1.86 | 6 x 7, Two metal layers plus SMDs | 1.8 | -103 @ 100 KHz | 186.5 |
| LTCC | 2.2 | 12 x 11, >10 | 39 | -120 @ 100 KHz | 190.9 |
| Thick Film | 1.75 | 12 x 11, >10 | 35 | -133 @ 100 KHz | 202.4 |
| Murata | 1.92 | 5.5 x 4.8, >10 | 94 | -112 @ 60 KHz | 183 |

FIG. 26

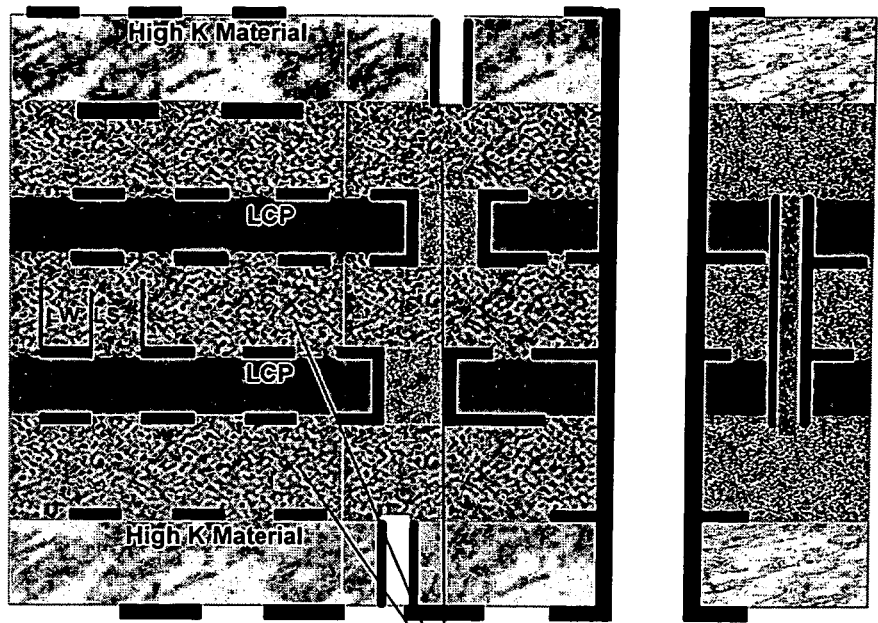
FIG. 38C  Rogers 4450B Prepreg
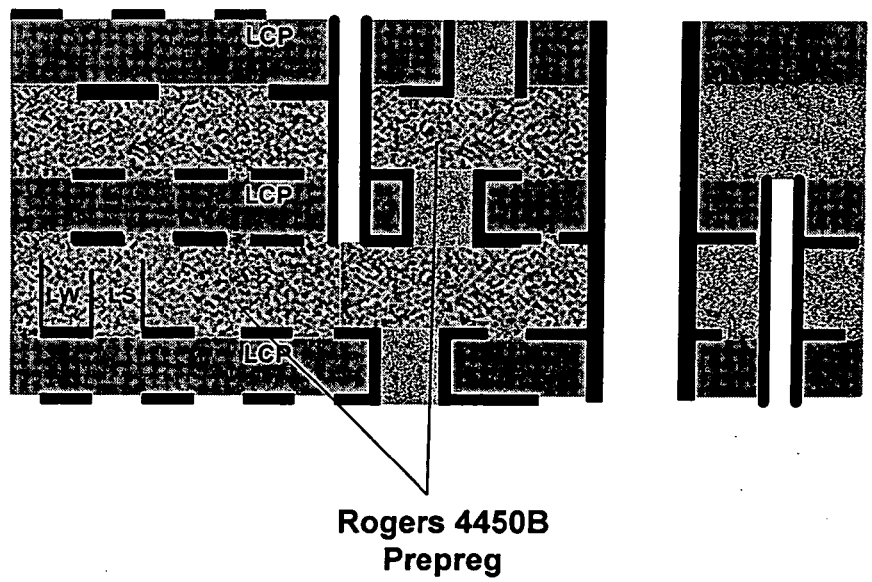
Rogers 4450B Prepreg
FIG. 38D Rogers 4450B
Prepreg Rogers 4350B
Laminate/ High K/ LCP Rogers 4450B Prepreg

MULTI-BAND RF TRANSCEIVER WITH PASSIVE REUSE IN ORGANIC SUBSTRATES

CROSS-REFERENCE TO RELATED APPLICATIONS

This application claims benefit of U.S. Provisional Application No. 60/565,254, filed Apr. 23, 2004, entitled "Digitally Tunable Compact Multiband Low Noise Amplifiers Through Passive Re-use." This application is also a continuation-in-part of U.S. patent application Ser. No. 10/402,313, filed Mar. 28, 2003, now U.S. Pat. No. 6,900,708 entitled "Integrated Passive Devices Fabricated Utilizing Multi-Layer, Organic Laminates." All of the foregoing applications are incorporated herein by reference.

BACKGROUND OF THE INVENTION

I. Field of the Invention

The present invention generally relates to passive components, and more particularly to the chip-package co-design of RF single-band and multi-band transceivers using high quality embedded passive components in organic substrates for use in radio frequency (RF) applications.

II. Description of Related Art

With a proliferation of wireless standards and applications operating at various frequencies, the need for radio frequency (RF) front-ends and interfaces that support multiple bands ("multi-band") and multiple protocols ("multimode") becomes necessary. As an example, a wireless LAN ("WLAN") device may support IEEE 802.11a/b/g protocols operating at 2.4 GHz or 5.2 GHz. Likewise, a cell phone supporting GSM900, DCS1800 and PCS1900 protocols may operate at 900 MHz, 1800 MHz, or 1900 MHz. Further, with the advent of MIMO (multiple-input multiple-output) based systems, optimization for high data rates and high data ranges using spatial and frequency diversity becomes necessary. Thus, there has been an increasing need for devices that are operable with a variety of wireless protocols. Such a need may occur for example, in a situation where voice, video (in the cellular band), and data must be handled by the same cellular device.

Designing multi-band, multi-mode devices such as RF transceivers presents some difficulties in power consumption, compatibility, interference, and integration. For example, the need for the additional design components to support such multi-band, multi-mode capabilities oftentimes presents challenges with power consumption. This may be especially problematic in a portable multi-band, multi-mode device such as a cell phone operating on a battery. The battery life of the cell phone would decrease as the power consumption requirements of the components within the cell phone increase. Further, as many devices continue to decrease in size, the inclusion of additional components becomes increasingly difficult due to problems such as routing, interference, etc. Achieving the required quality factors (Qs) of these components may become more difficult with these size constraints. In addition, the components may have to conform to improved performance characteristics such as high clock speed, low noise, wide bandwidth, and high temperature tolerance.

Therefore, there is a need in the industry for multi-band, multimode RF transceivers that may satisfy one or more of these issues of power consumption, compatibility, interference, and integration.

SUMMARY OF THE INVENTION

The present invention overcomes the difficulties above by describing multi-band, multimode integrated RF transceiver topologies, comprised of on-chip actives and in-package embedded high-Q passives in organic substrates that, in certain circumstances, can be reused at different frequency ranges, thereby reducing the number of components required. Two components of such an RF transceiver include voltage controlled oscillators (VCOs) and low noise amplifiers (LNAs). According to an embodiment, high-performance LNAs with low noise figures (NF) and VCOs with low phase noise may be formed from high-Q passive components embedded in organic substrates such as LCP (liquid crystalline polymer).

According to an embodiment of the present invention, a multi-band RF device operable at a first frequency and a second frequency different from the first frequency includes an active device, a first passive network in communication with the active device, a second passive network in communication with the active device, and an organic-based substrate having at least two metal layers, wherein the two metal layers are patterned to form at least a portion of the first passive network and the second passive network, wherein impedances of the first and second passive networks are different at the first frequency than the second frequency.

According to another embodiment of the present invention, an RF multi-band oscillator for simultaneously generating oscillation signals at a first frequency and a second frequency for a multi-band transceiver includes an organic layer having a top surface and a bottom surface, a first metal layer opposite the top surface, a second metal layer opposite the bottom surface, wherein the first metal layer and the second metal layer are patterned to form a first resonator and a second resonator, wherein a reactance of the first resonator at the first frequency differs from a reactance at the second frequency and wherein a reactance of the second resonator at the first frequency differs from a reactance at the second frequency, and an active device in communication with the first resonator and the second resonator to form a feedback network, thereby simultaneously generating oscillation signals at the first frequency and the second frequency.

According to another embodiment of the present invention, a multi-band low noise amplifier for use in an RF application includes an active device, a first matching network in communication with the active device, wherein an impedance of the first matching network at a first frequency is different than the impedance of the first matching network at a second frequency, a second matching network in communication with the active device, wherein an impedance of the second matching network at the first frequency is different than the impedance of the second matching network at the second frequency, and a multi-layer organic-based substrate having at least one metal layer, wherein the first matching network and the second matching are formed on the at least one metal layer and wherein the active device is mounted on the multi-layer organic substrate, thereby allowing the an output of the multi-band low noise amplifier to have desired power gains at the first frequency and the second frequency based at least in part on each of the first and second matching networks having the different reactance at the first frequency and the second frequency.

According to yet another embodiment of the present invention, an oscillator for use in an RF transceiver includes a first organic layer with a top surface and a bottom surface opposite the top surface, a first conductive layer positioned on the top surface of the first organic layer, a second conductive layer positioned on the bottom surface of the first organic layer, a second organic layer positioned opposite the second conductive layer, a plurality of passive devices patterned on at least one of the first conductive layer and the second conductive layer, and at least one discrete active device positioned on the first conductive layer and in communication with at least a portion of the plurality of passive devices, wherein a feedback network for the active device is created such that the discrete active device becomes unstable and generates at least one signal at a particular frequency.

BRIEF DESCRIPTION OF THE SEVERAL VIEWS OF THE DRAWINGS

Figure 1A:
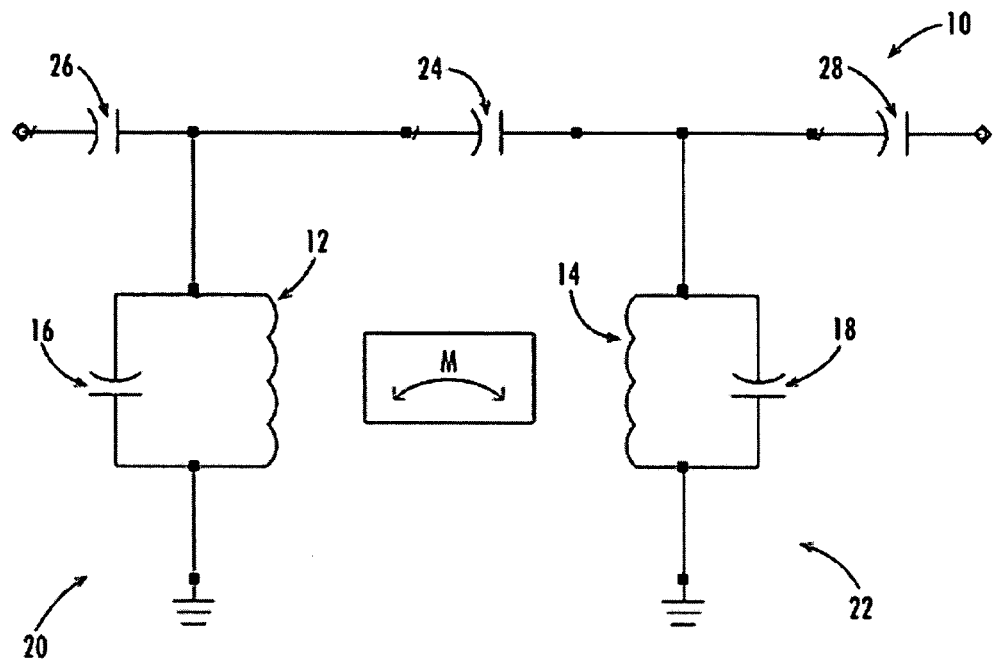

Having thus described the invention in general terms, reference will now be made to the accompanying drawings, which are not necessarily drawn to scale, and wherein:

FIG. 1A is a first equivalent circuit diagram for explaining the operation of the dielectric filters shown in FIGS. 2, 3 and 4.

Figure 1B:
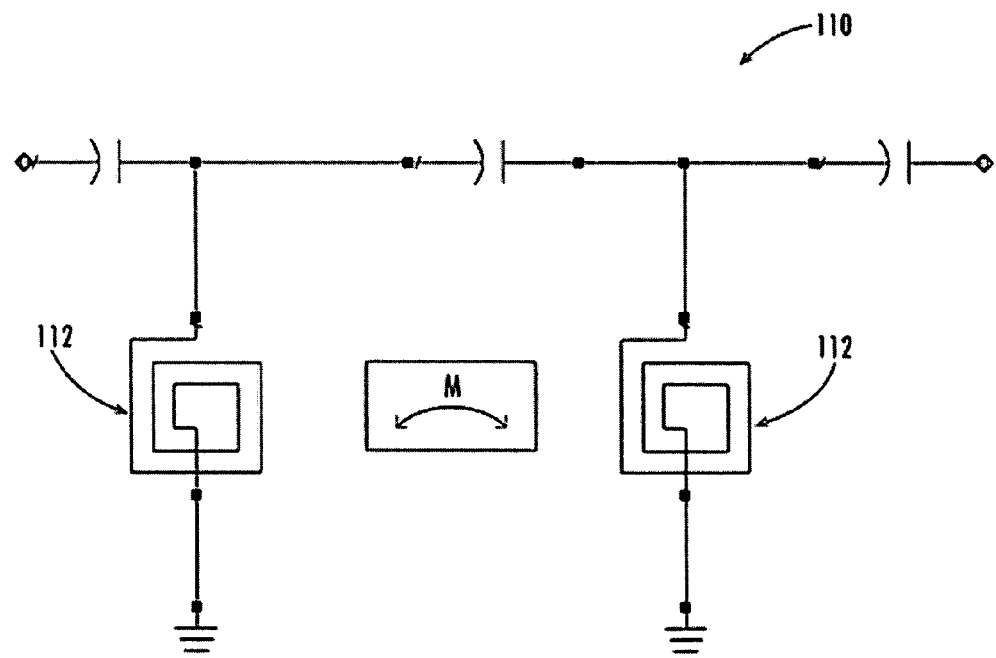

FIG. 1B is a second equivalent circuit diagram for explaining the operation of the dielectric filter of FIG. 1A using transmission lines or inductor resonator elements.

Figure 2A:
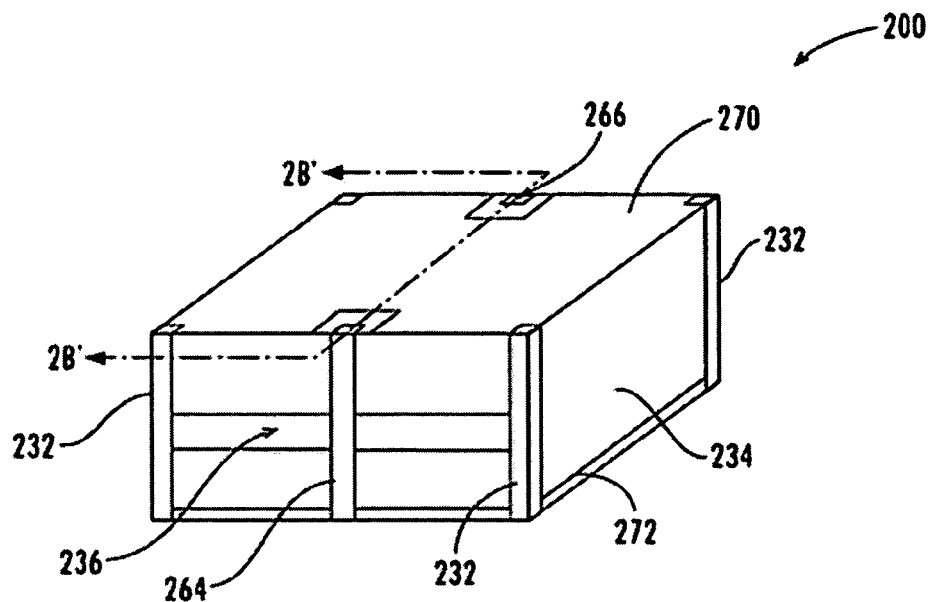
Figure 2B:
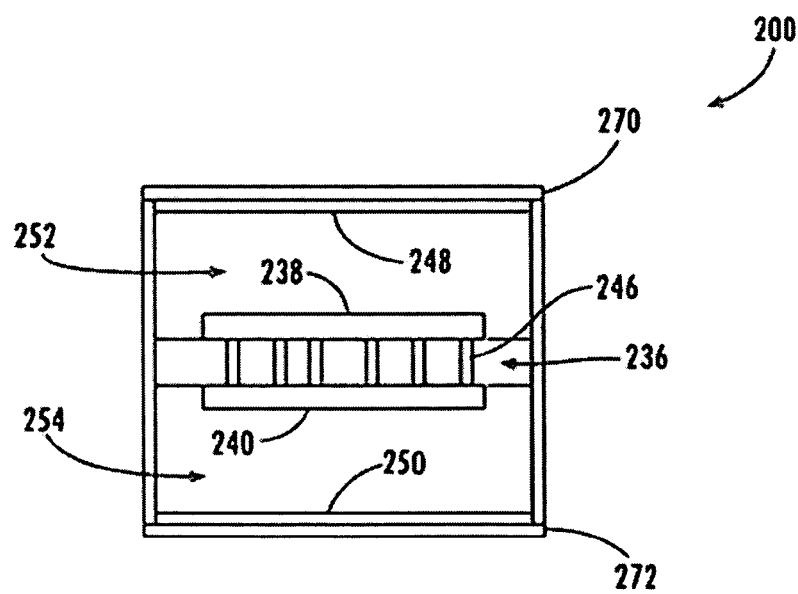
Figure 2C:
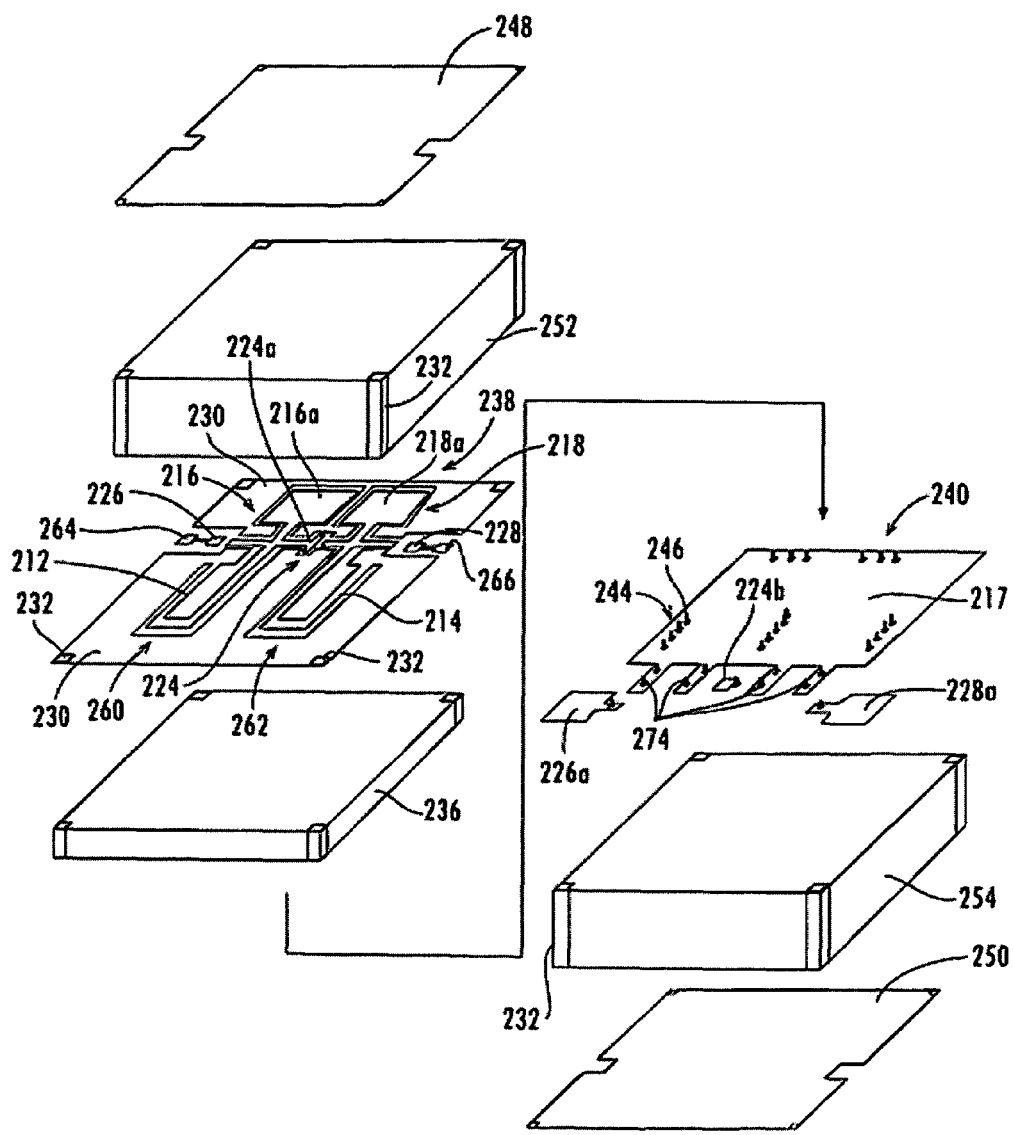

FIGS. 2A-2C show several views of a first organic dielectric filter according to an embodiment of the present invention.

Figure 3A:
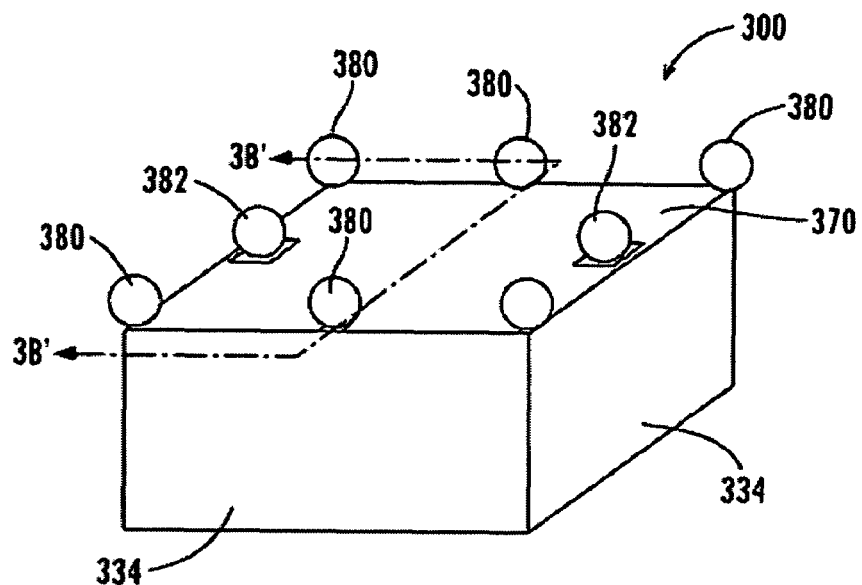
Figure 3B:
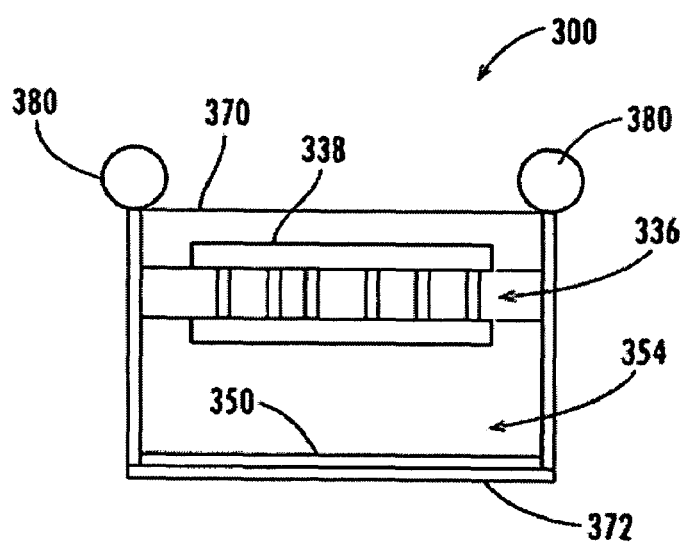
Figure 3C:
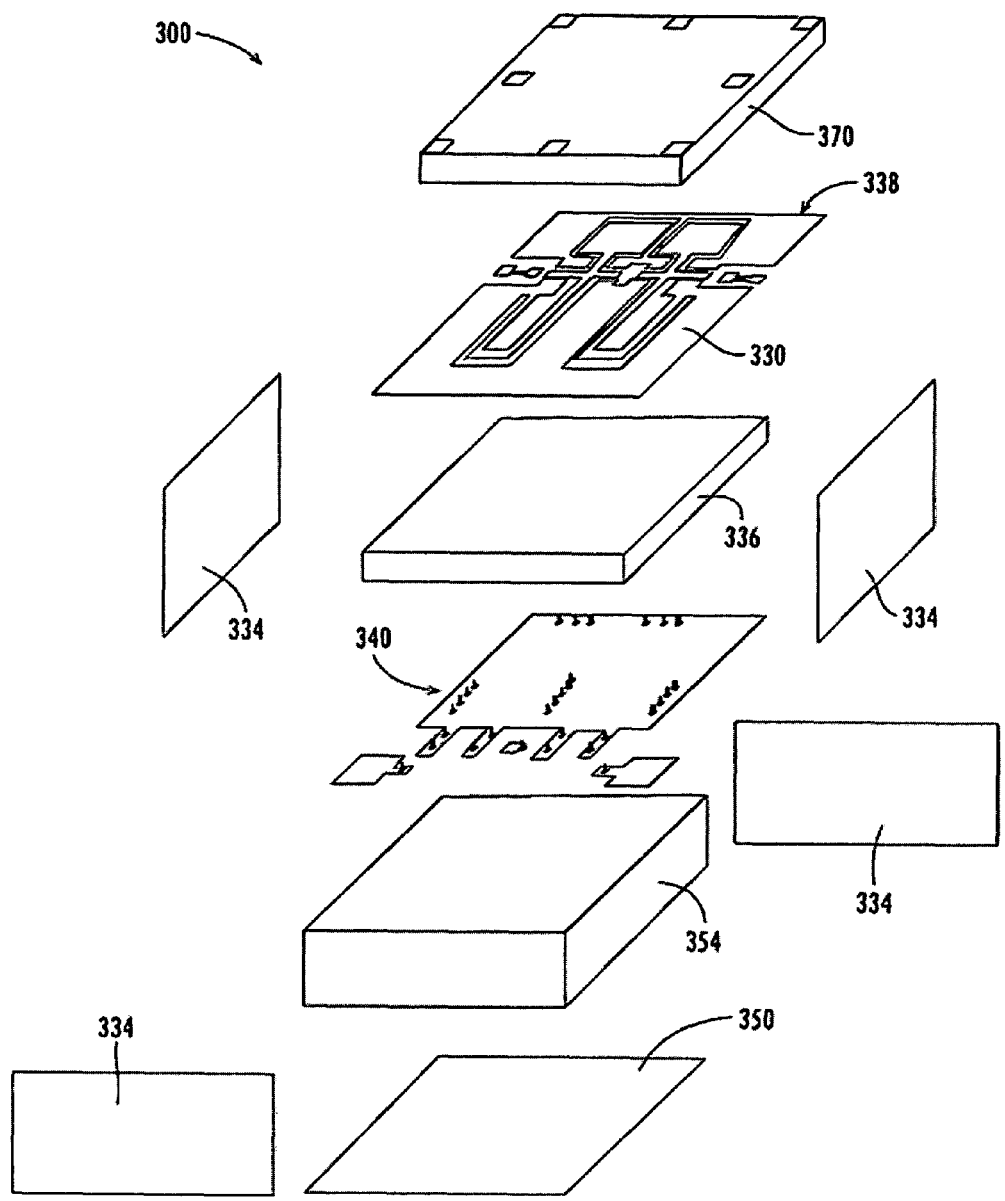

FIGS. 3A-3C show several views of a second organic dielectric filter according to an embodiment of the present invention.

Figure 4A:
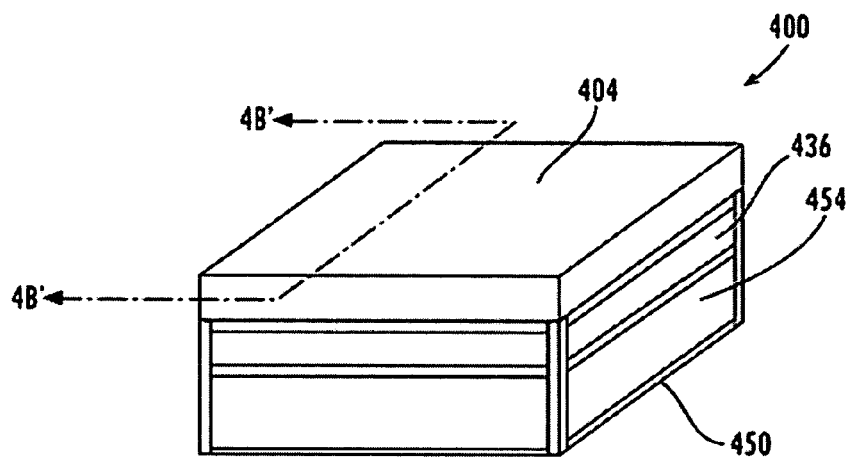
Figure 4B:
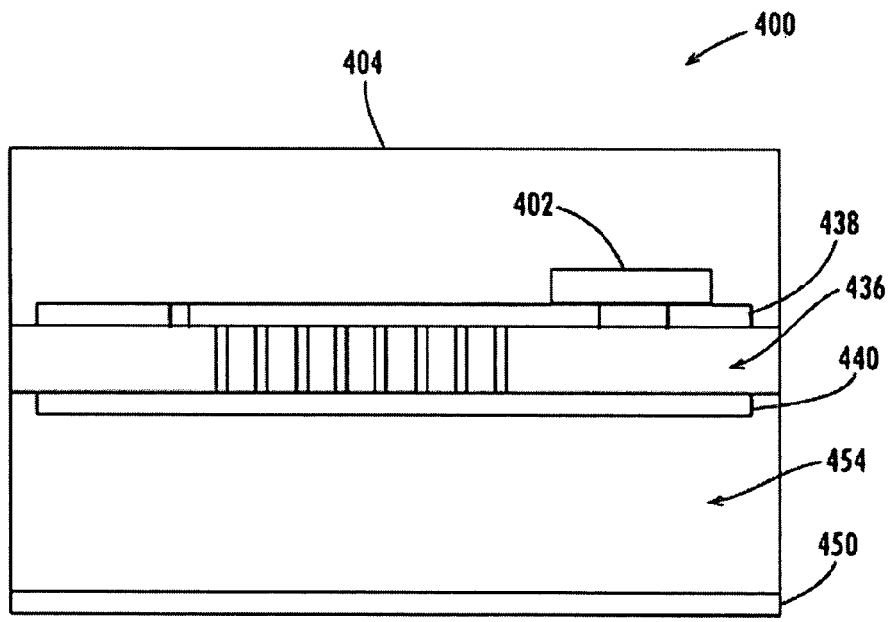

FIGS. 4A-4B show several views of a third organic dielectric filter according to an embodiment of the present invention.

Figure 5:
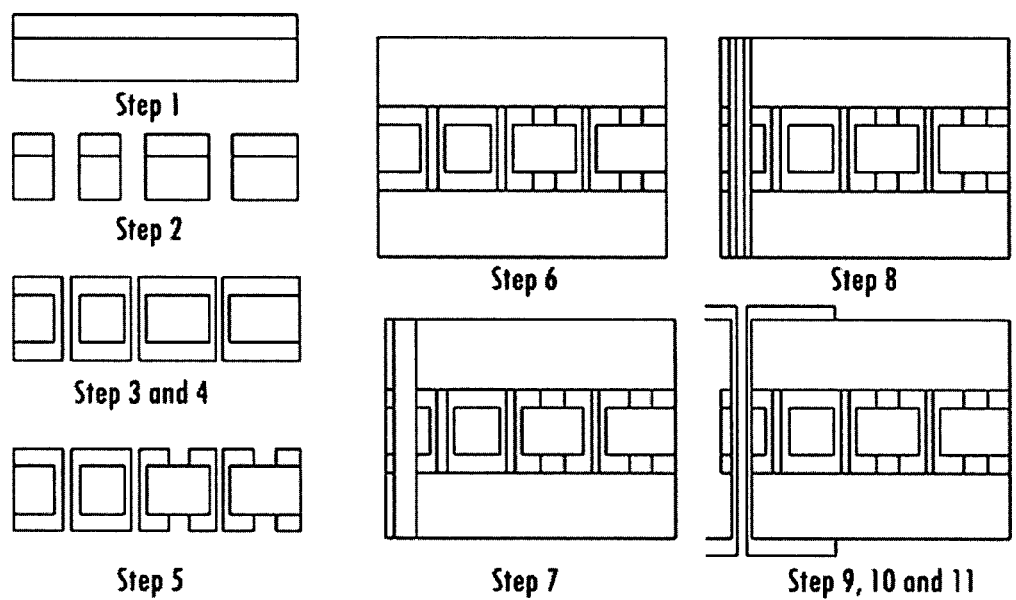

FIG. 5 illustrates a fabrication methodology for an organic dielectric filter according to the present invention, such as the first organic dielectric filter of FIGS. 2A-2C.

Figure 6:
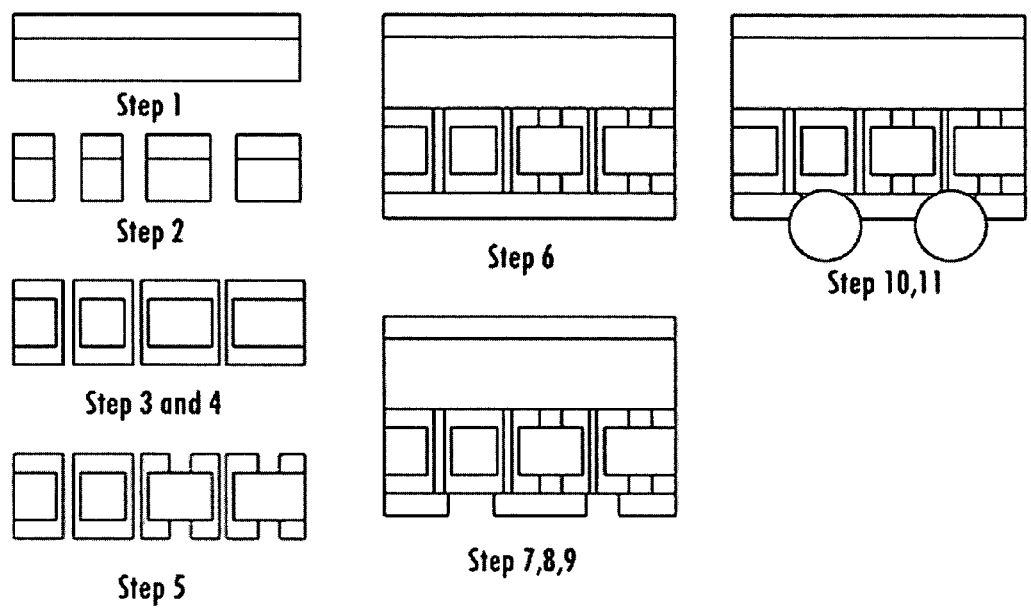

FIG. 6 illustrates a fabrication methodology for an organic dielectric filter according to the present invention, such as the organic dielectric filter of FIGS. 3A-3C.

Figure 7:
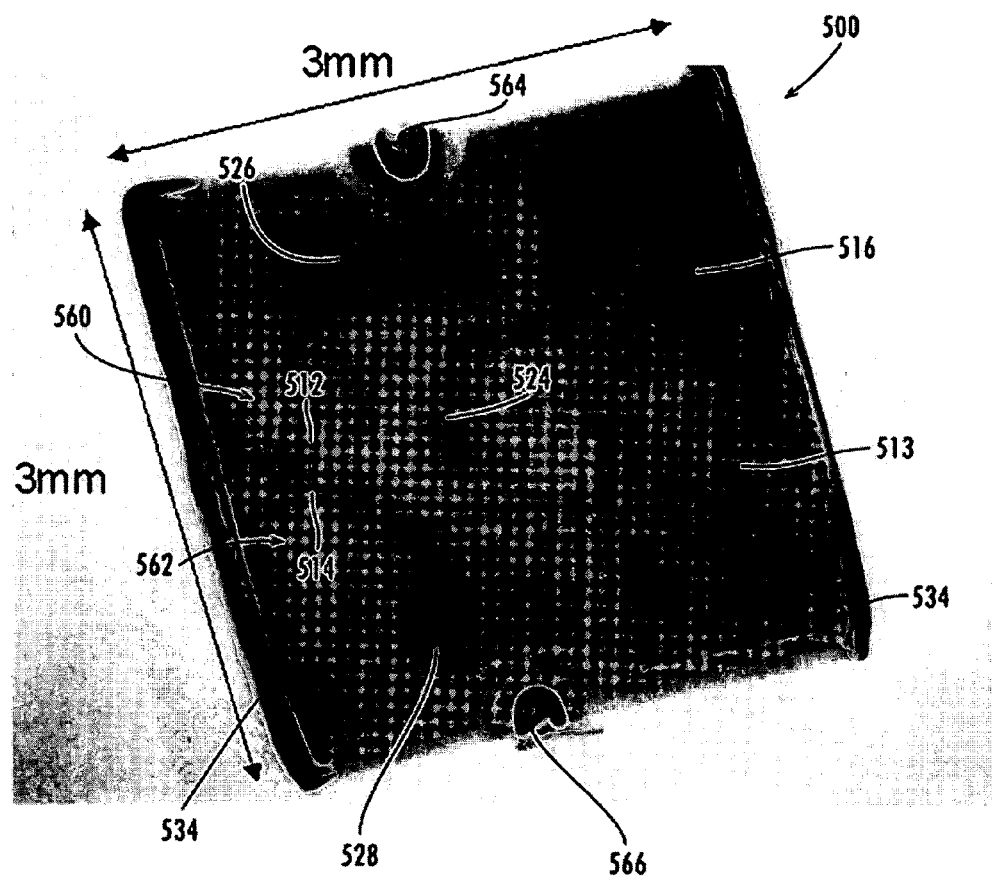

FIG. 7 is an X-ray from a top plan view of an organic bandpass filter in accordance with an embodiment of the present invention.

Figure 8:
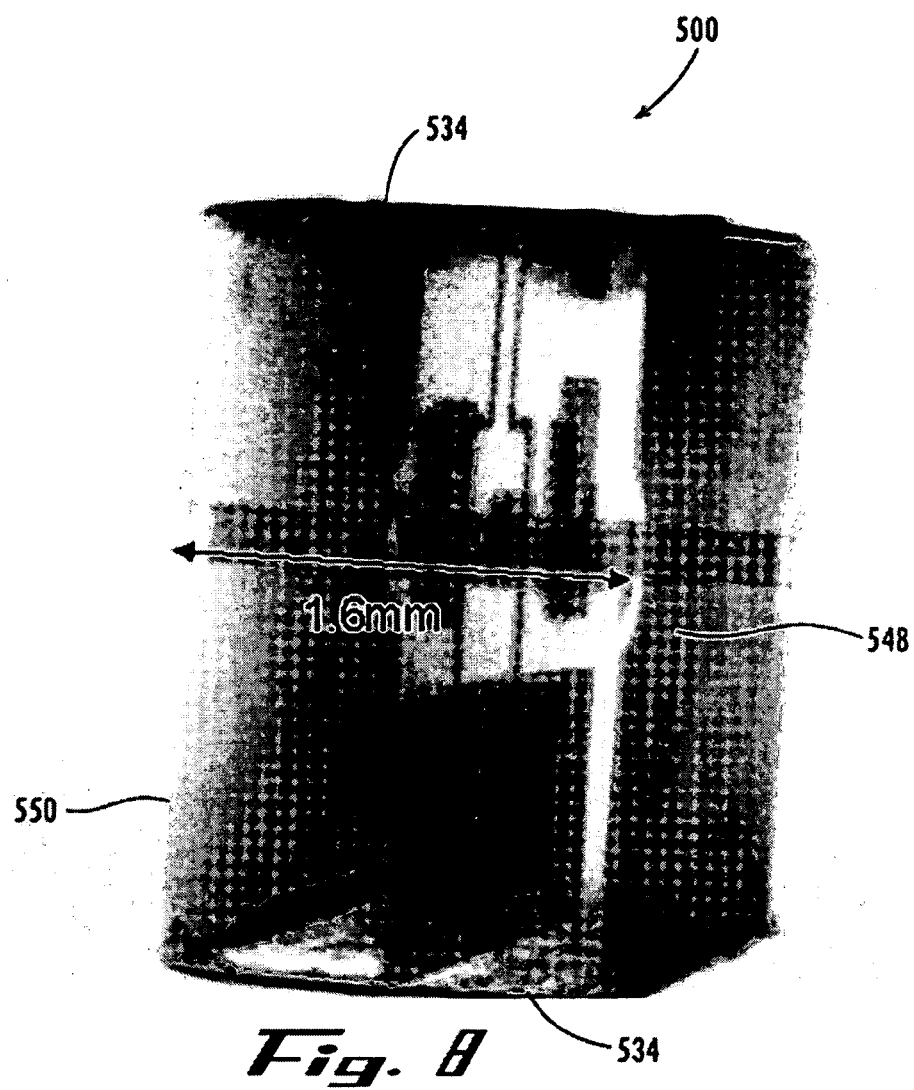

FIG. 8 is an X-ray from a side perspective view of the organic bandpass filter of FIG. 7.

Figure 9:
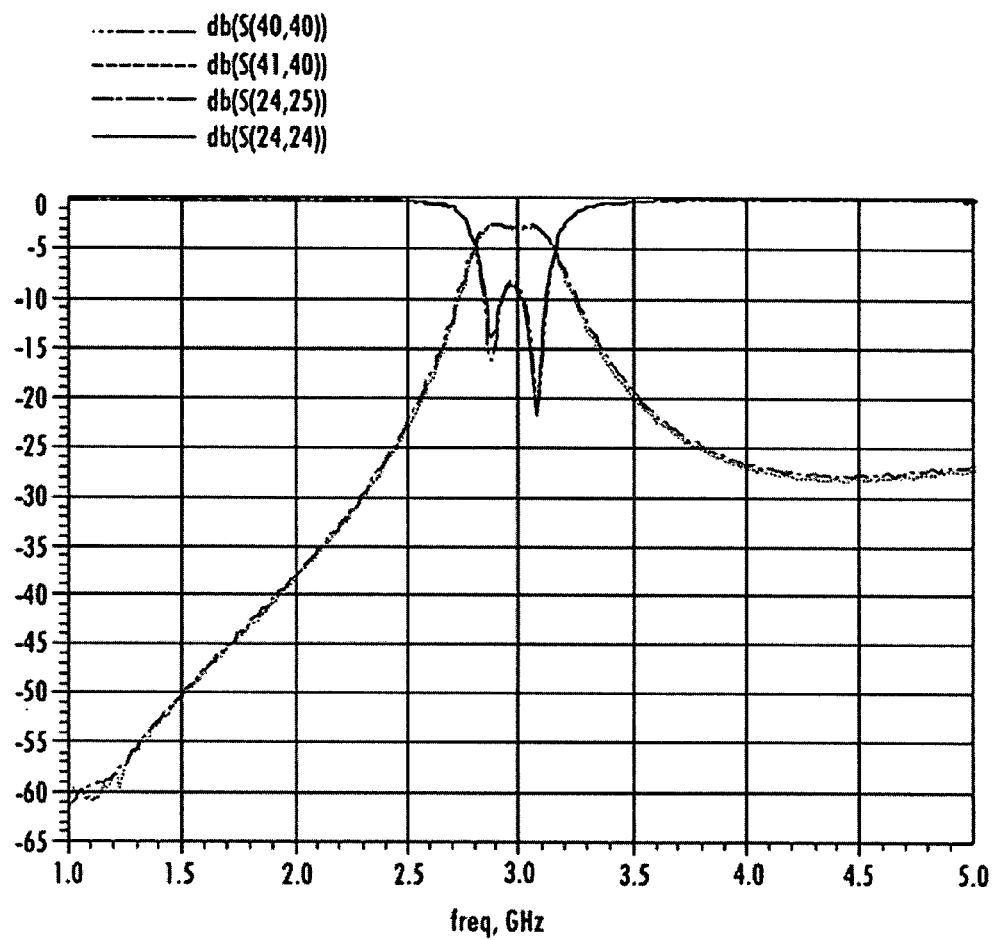

FIG. 9 is a graphical representation of a model to hardware correlation for the organic bandpass filter of FIG. 7.

Figure 10:
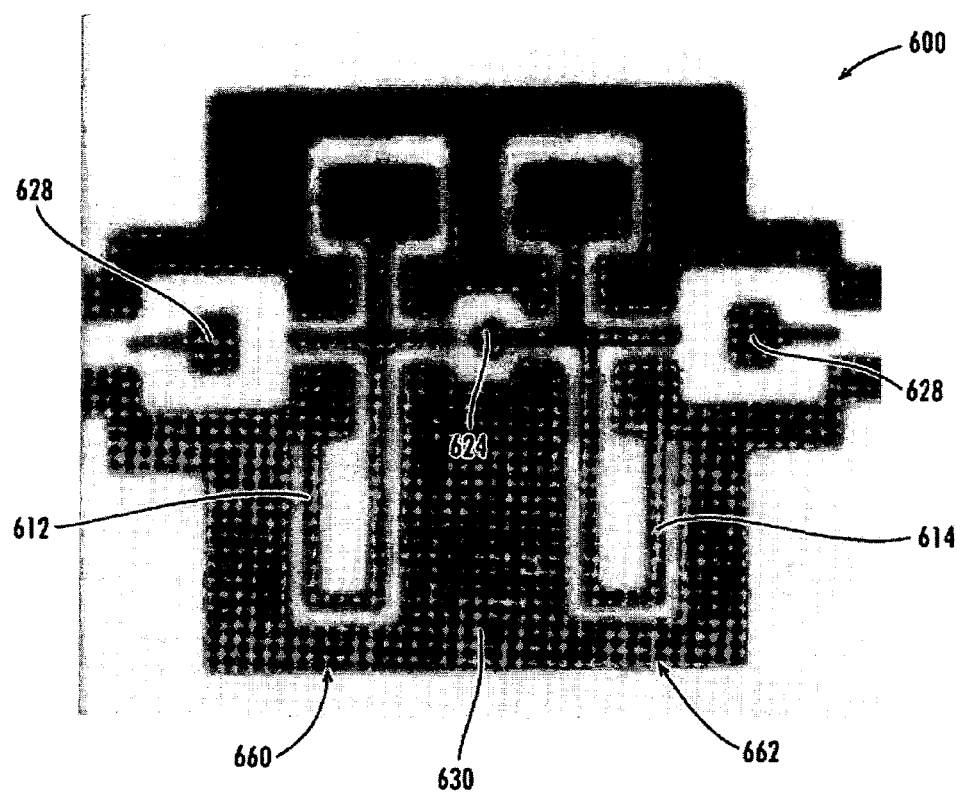

FIG. 10 is a picture from a top plan view of a BGA style organic filter, in accordance with an embodiment of the present invention.

Figure 11:
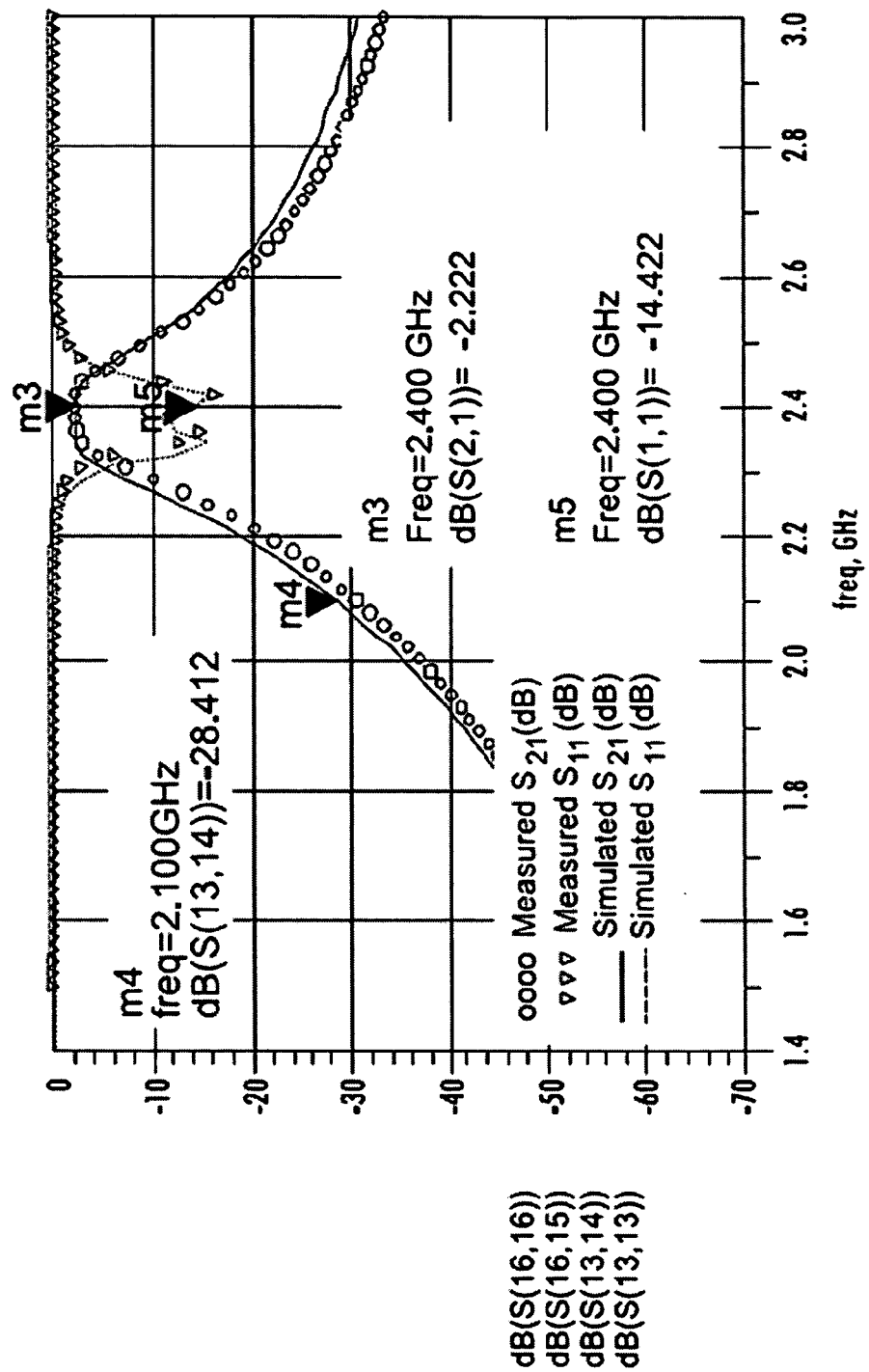

FIG. 11 is a graphical representation of measured and modeled data for the BGA style organic filter in FIG. 10.

Figure 12:
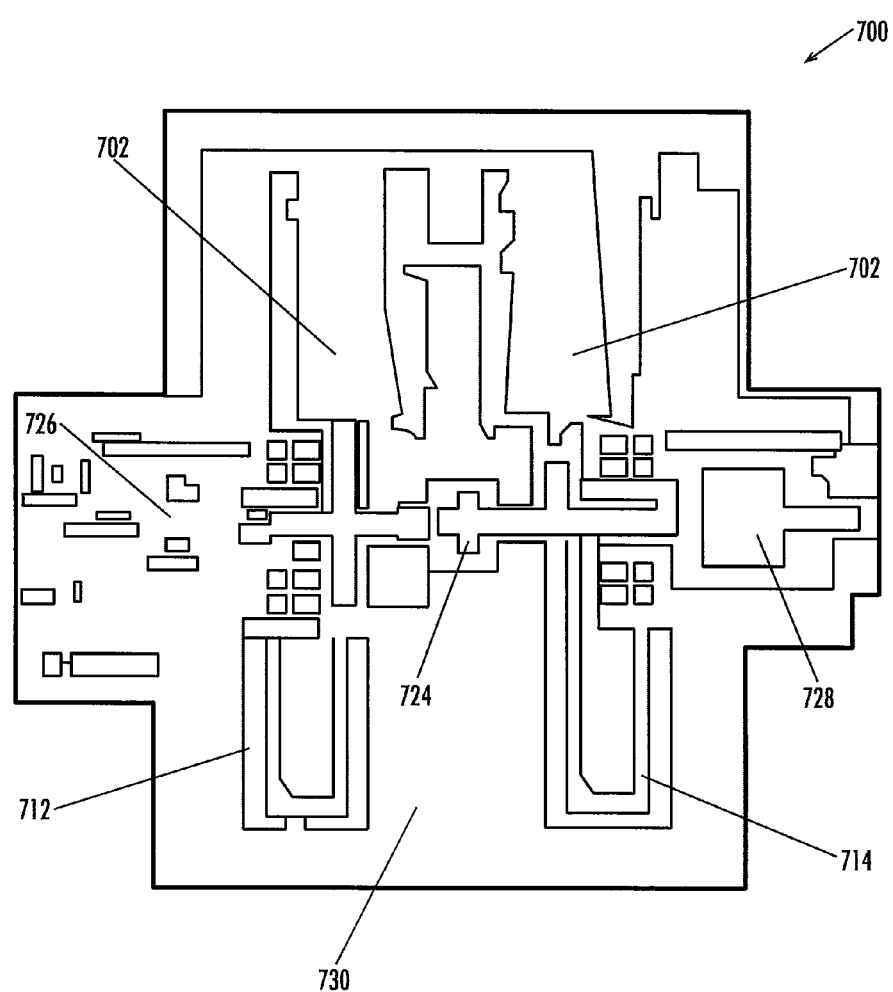

FIG. 12 is a picture from a top plan view of an organic dielectric filter that includes SMD capacitors in accordance with an embodiment of the present invention.

FIG. 13 is a graphical representation of a model to hardware correlation for the organic dielectric filter in FIG. 12.

Figure 14:
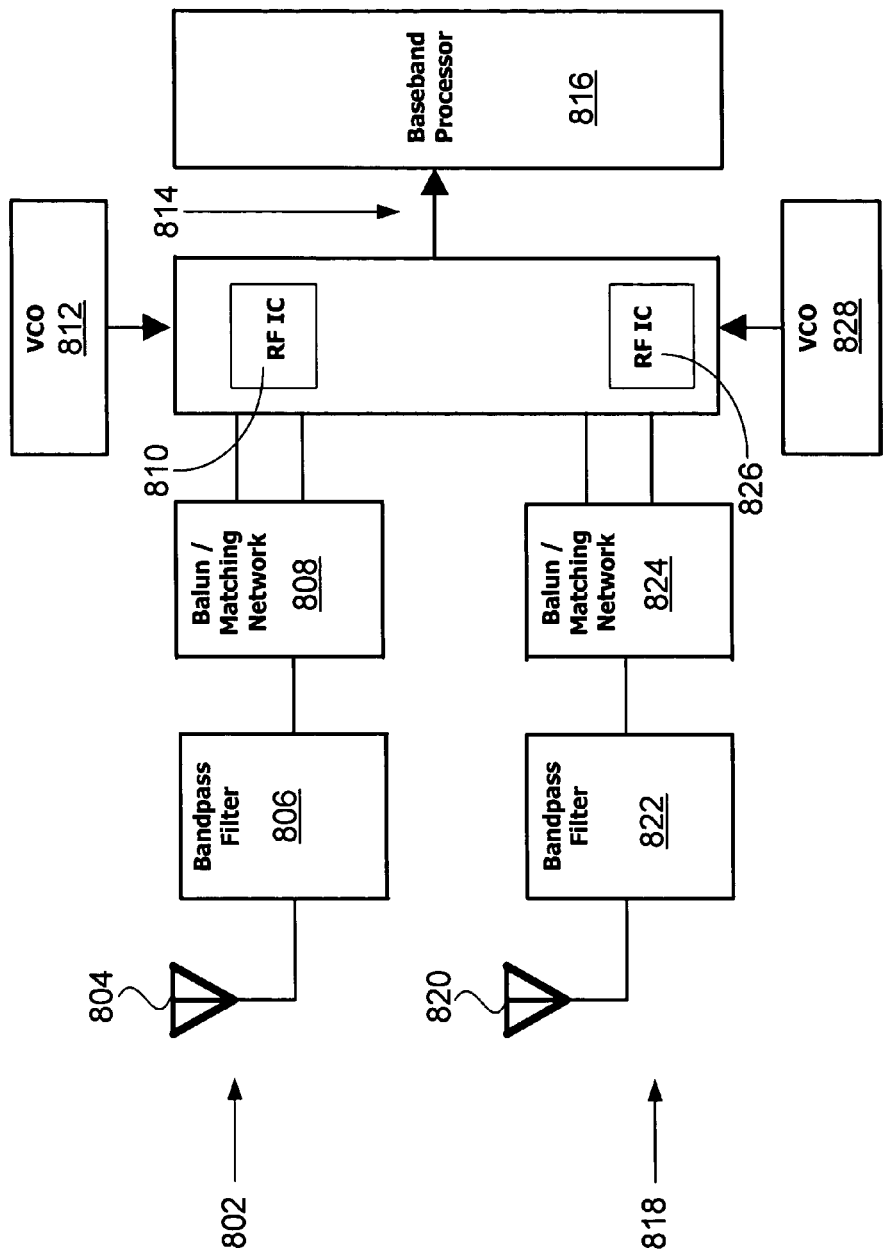

FIG. 14 illustrates an exemplary multi-band receiver portion of a transceiver in accordance with an embodiment of the present invention.

Figure 15:
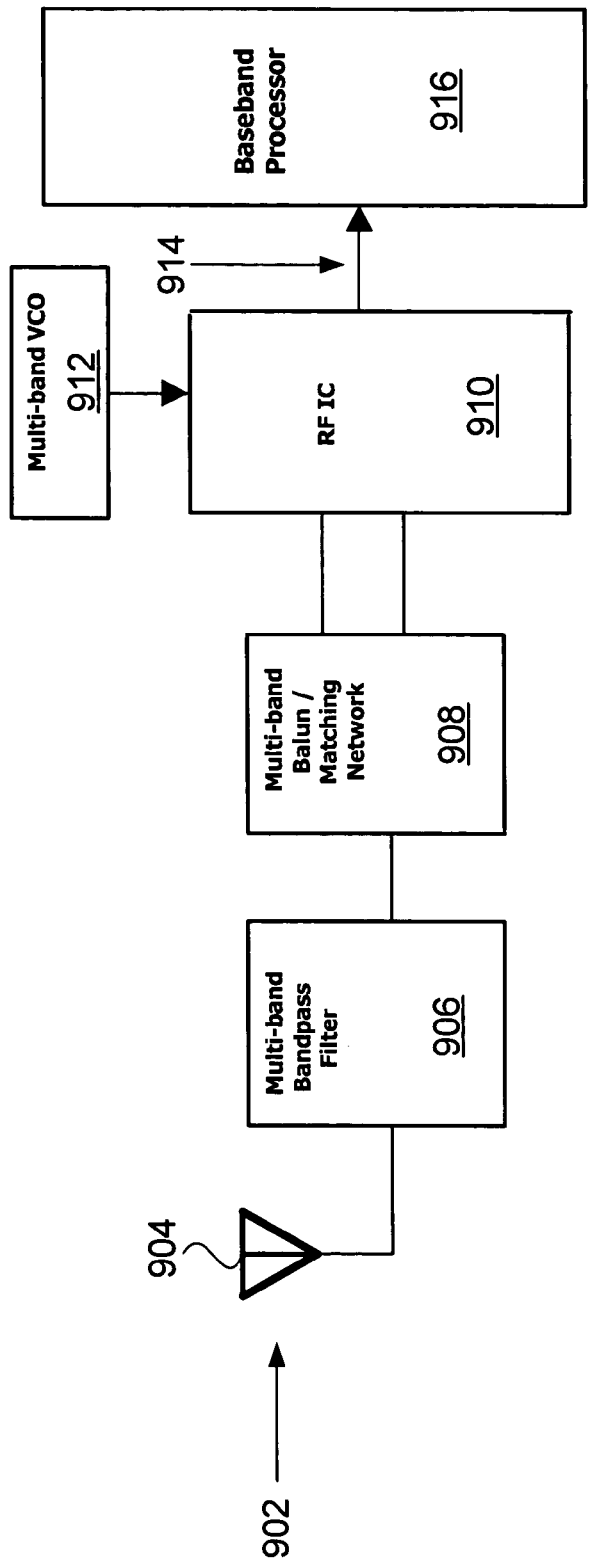

FIG. 15 illustrates another exemplary multi-band receiver portion of a transceiver.

Figure 16A:
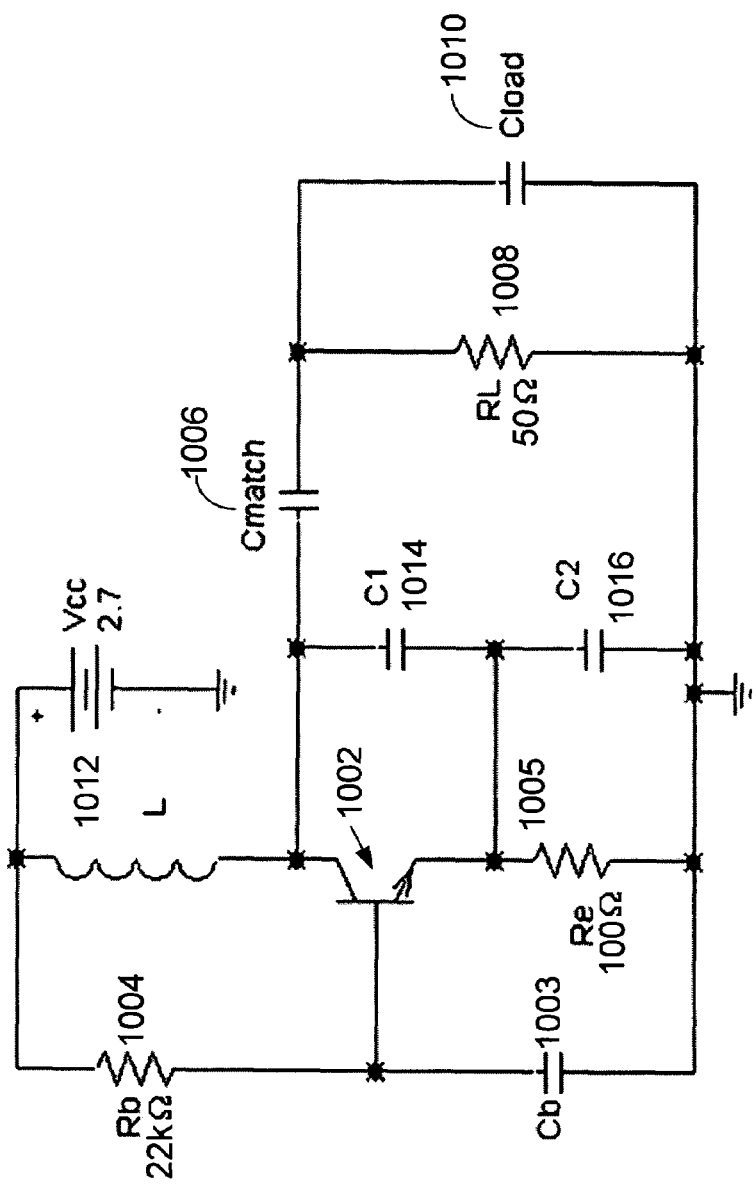

FIG. 16A illustrates a circuit diagram of an oscillator that can be implemented using high-Q passive components fabricated on organic substrates in accordance with an embodiment of the present invention.

Figure 16B:
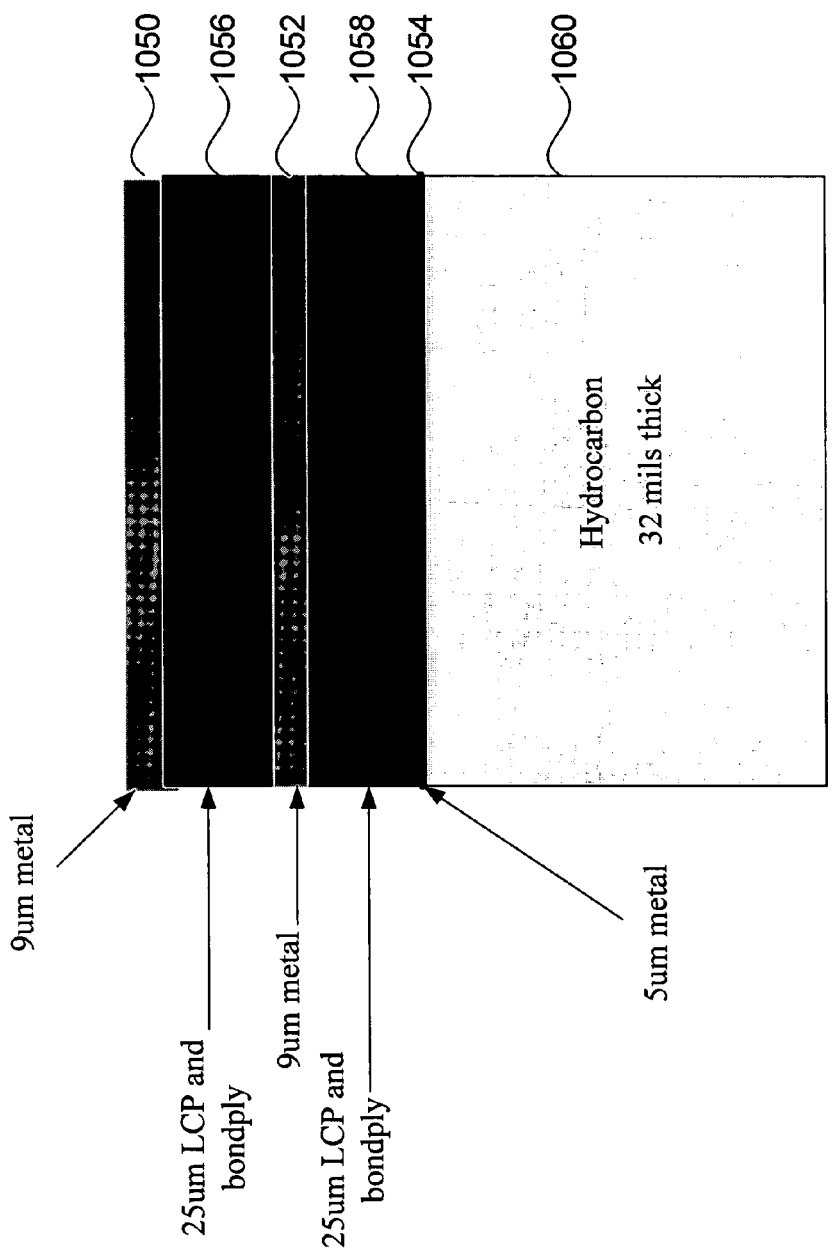

FIG. 16B illustrates an exemplary stackup for implementing the circuit diagram in FIG. 16A in accordance with an embodiment of the present invention.

Figure 16C:
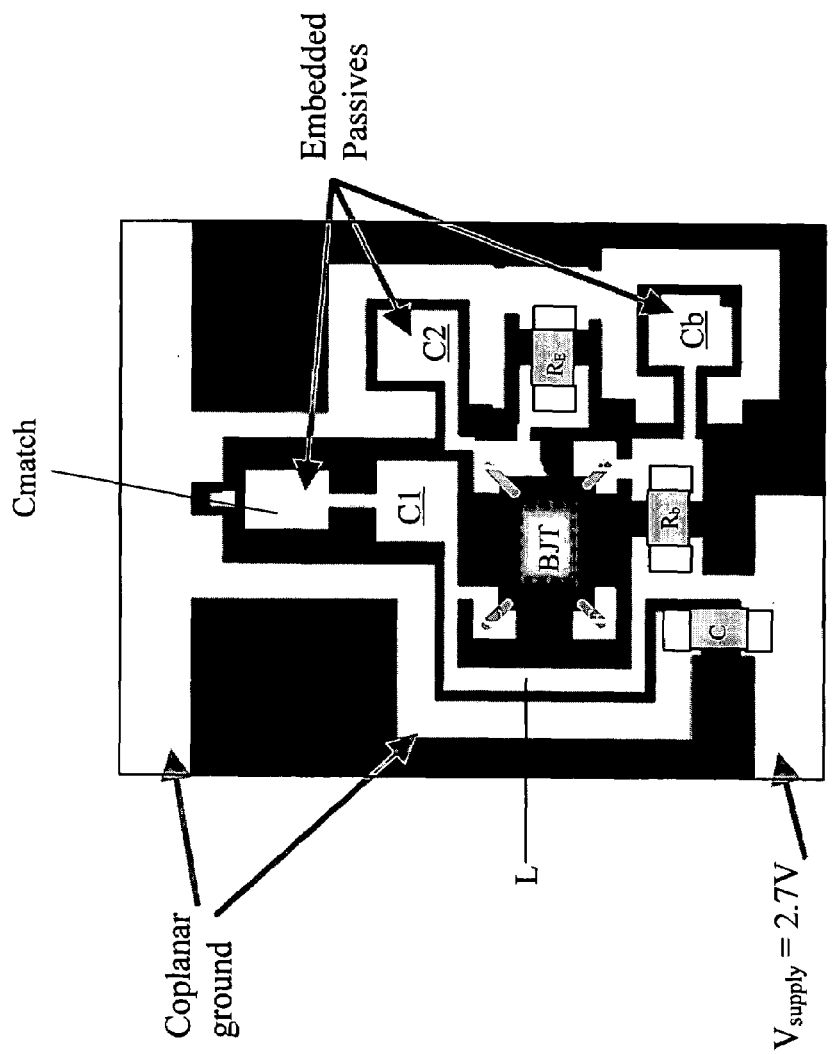
Figure 16D:
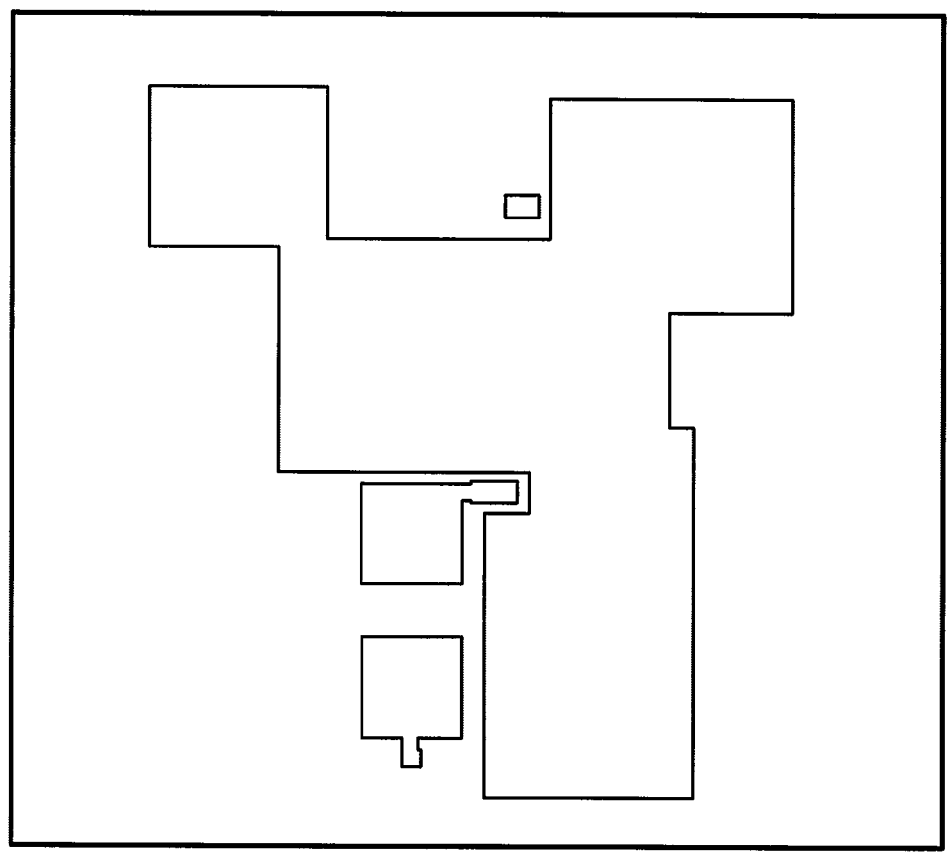
Figure 17:
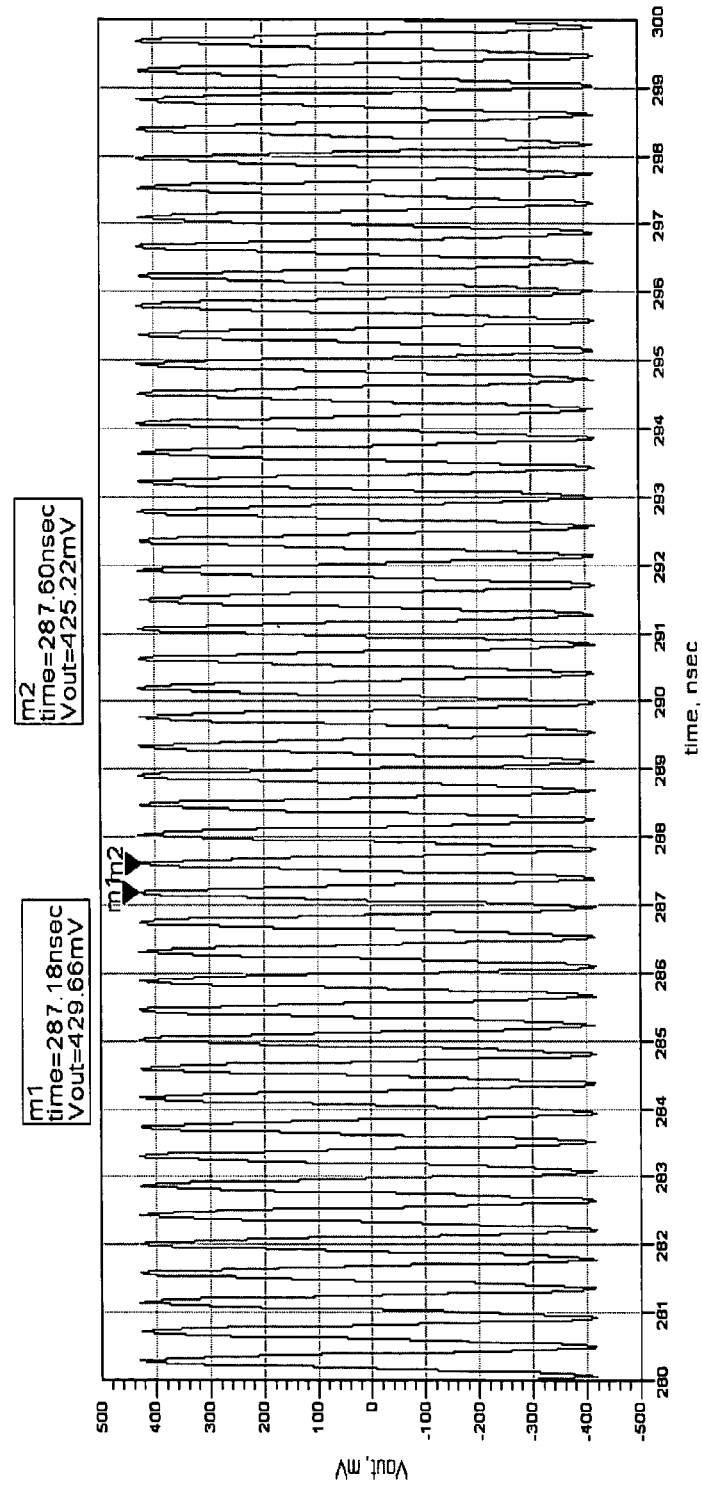

FIGS. 16C and 16D illustrate exemplary layouts corresponding to metal layers in FIG. 16B in accordance with an embodiment of the present invention.

Figure 17:
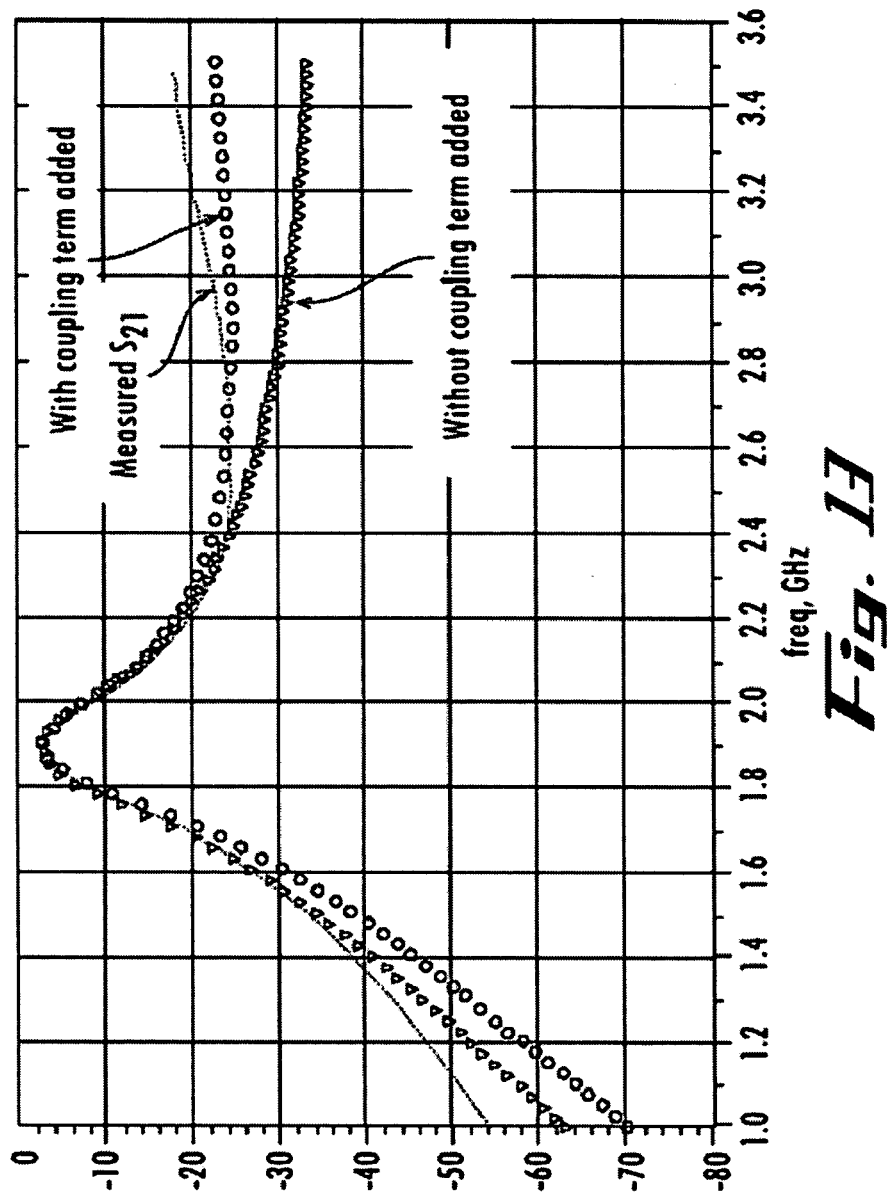

FIG. 17 is a simulated waveform for the exemplary circuit diagram of FIG. 16A.

Figure 18:
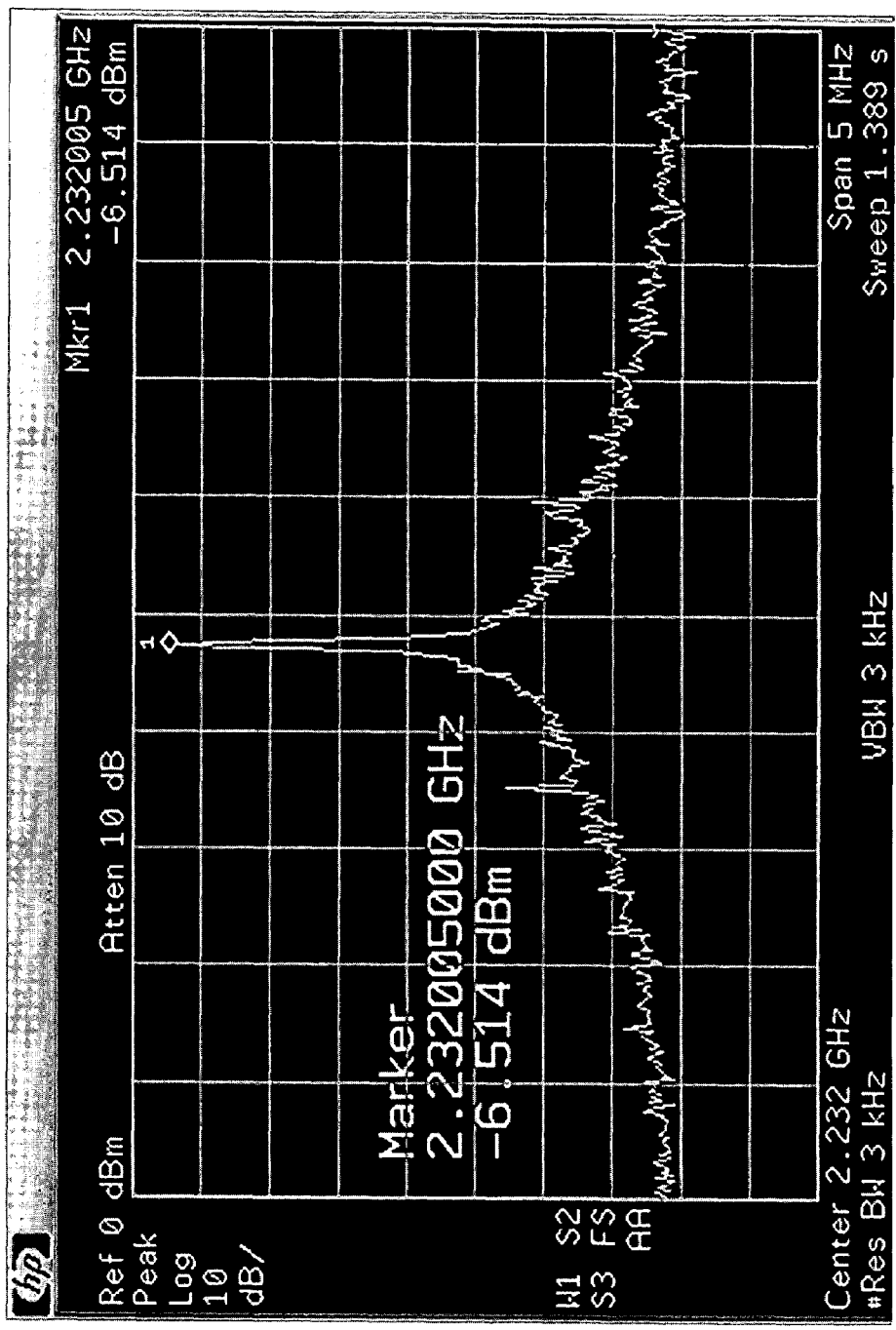

FIG. 18 is a measured output power for the fabricated oscillator of FIGS. 16A-D in accordance with an embodiment of the present invention.

Figure 19:
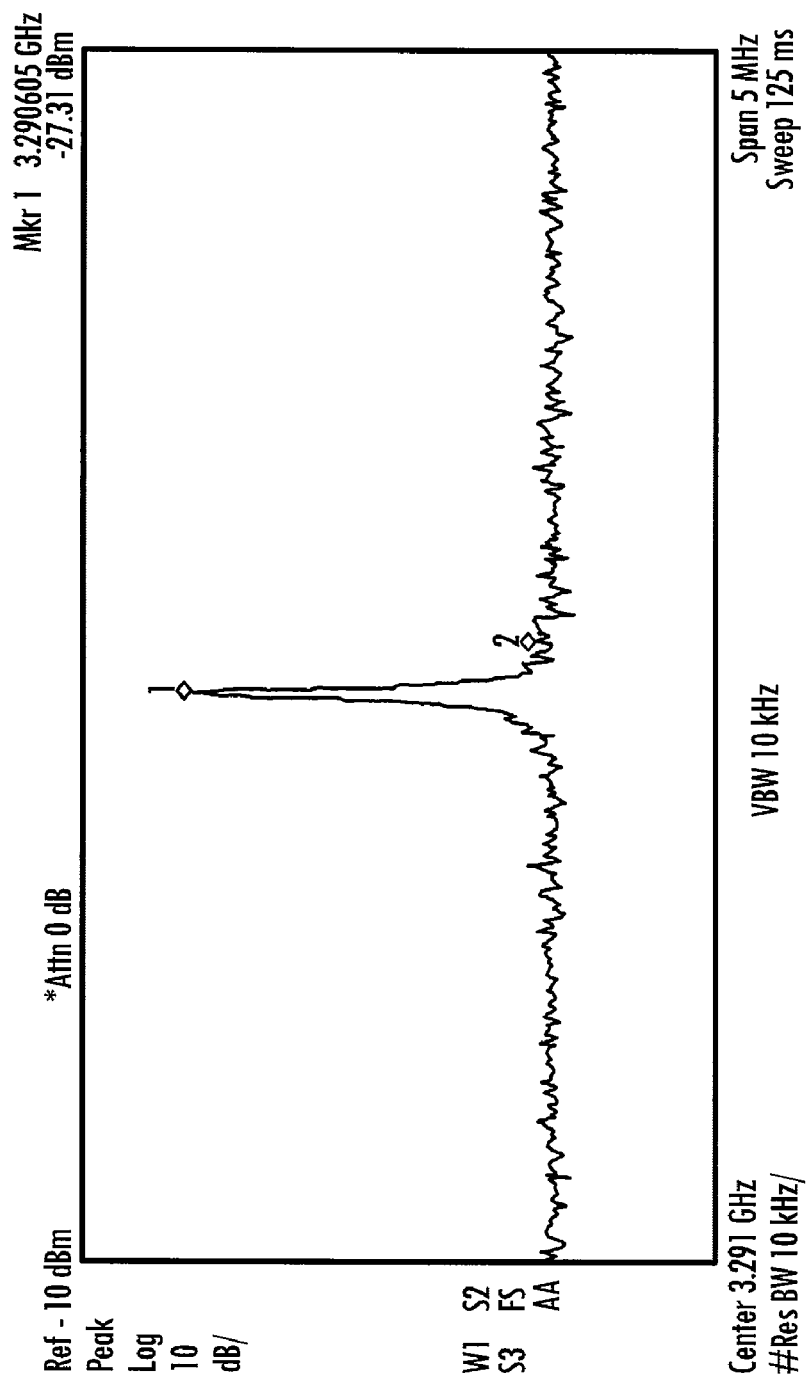
Figure 20:
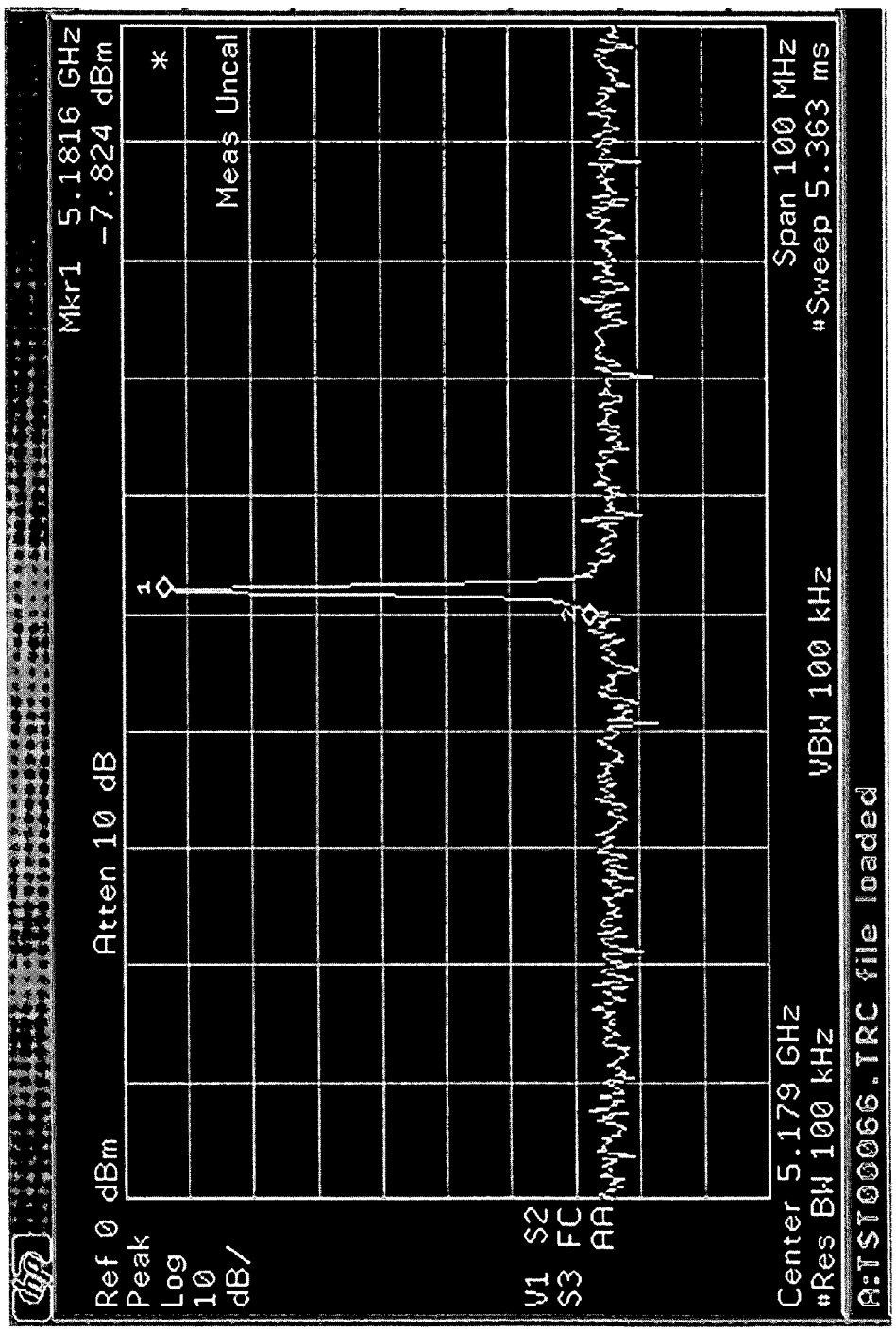

FIGS. 19 and 20 show the measured performance of the oscillator of FIG. 16A at 3.3 GHz and 5.2 GHz, respectively, when fabricated using an epoxy substrate in accordance with an embodiment of the present invention.

Figure 21:
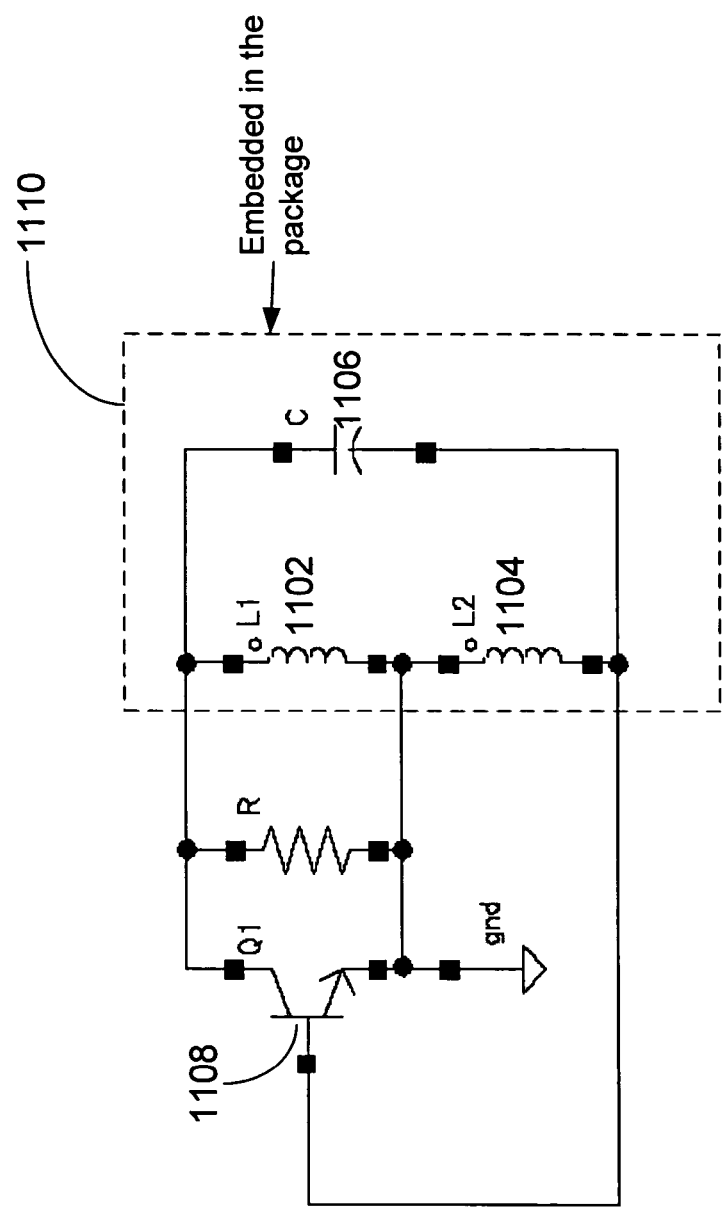
Figure 22:
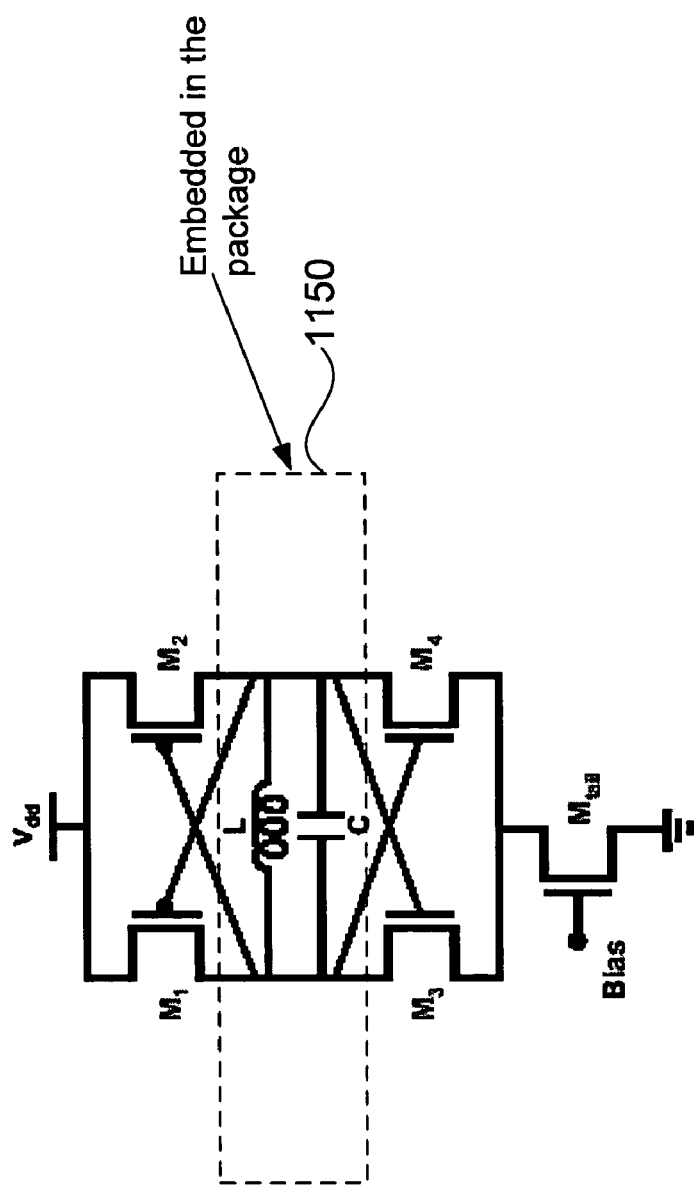

FIGS. 21 and 22 illustrate alternative circuit diagrams of oscillators that can be implemented in accordance with an embodiment of the present invention.

Figure 23A:
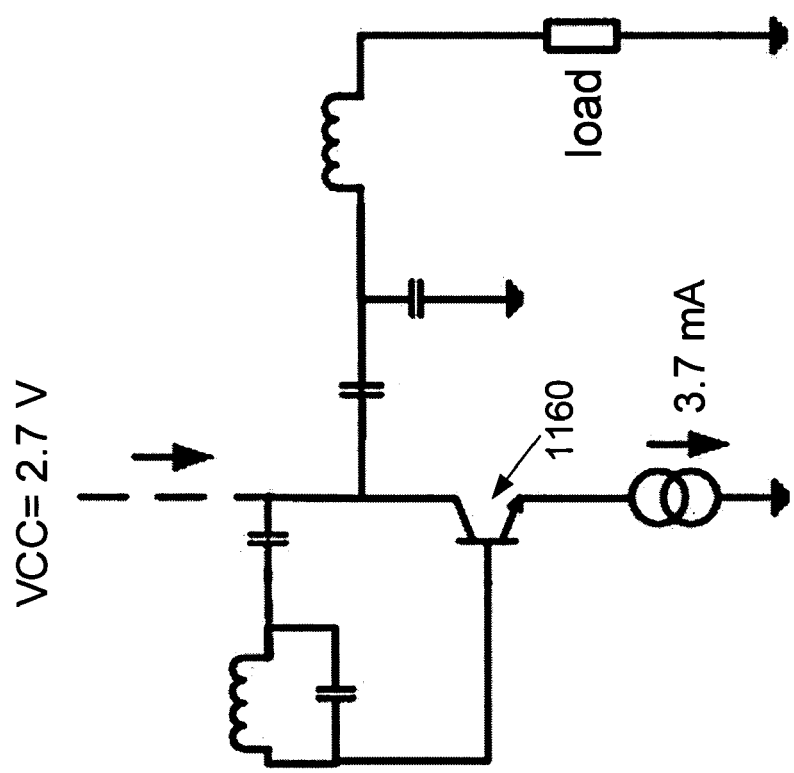

FIG. 23A illustrates another exemplary oscillator that can be implemented according to an embodiment of the present invention.

Figure 23B:
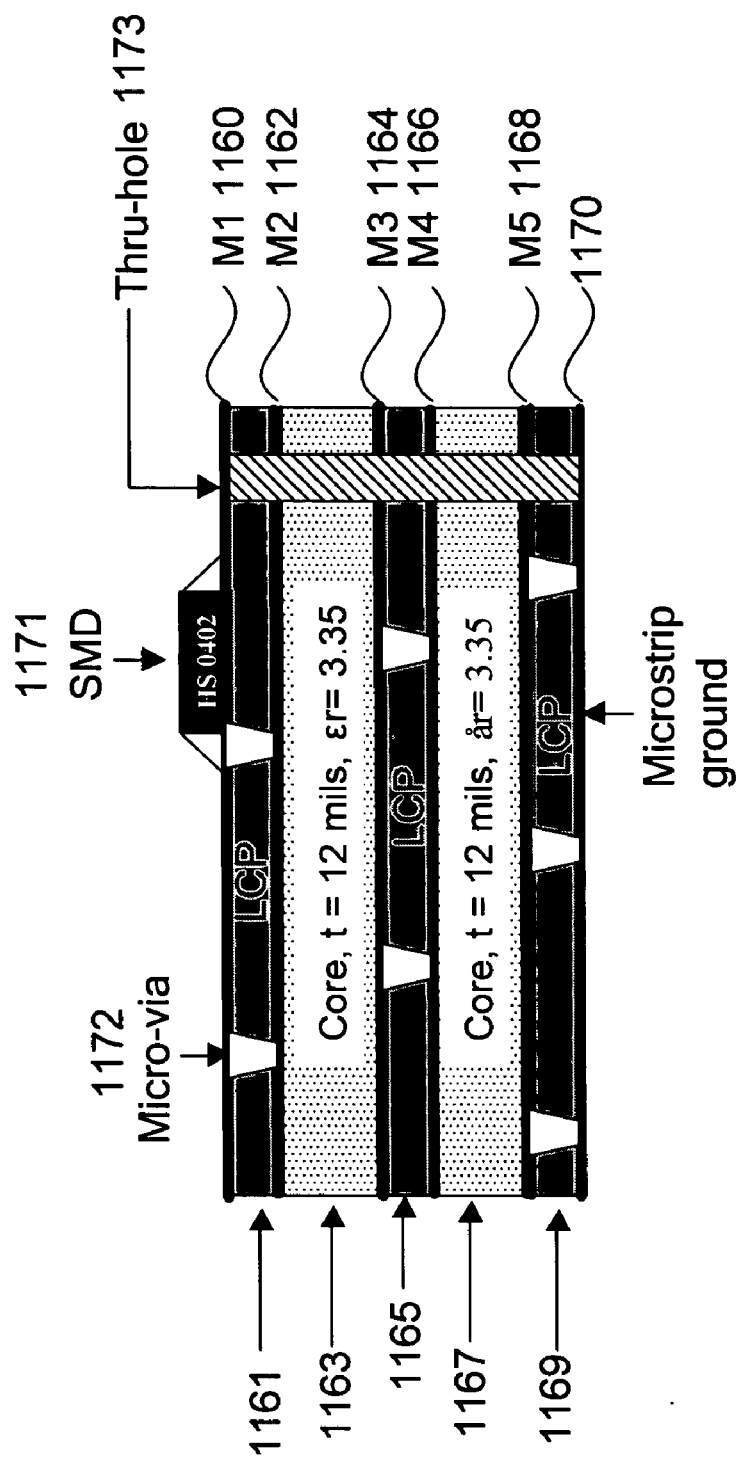

FIG. 23B illustrates an exemplary stackup for the oscillator shown in FIG. 23A in accordance with an embodiment of the present invention.

Figure 24A:
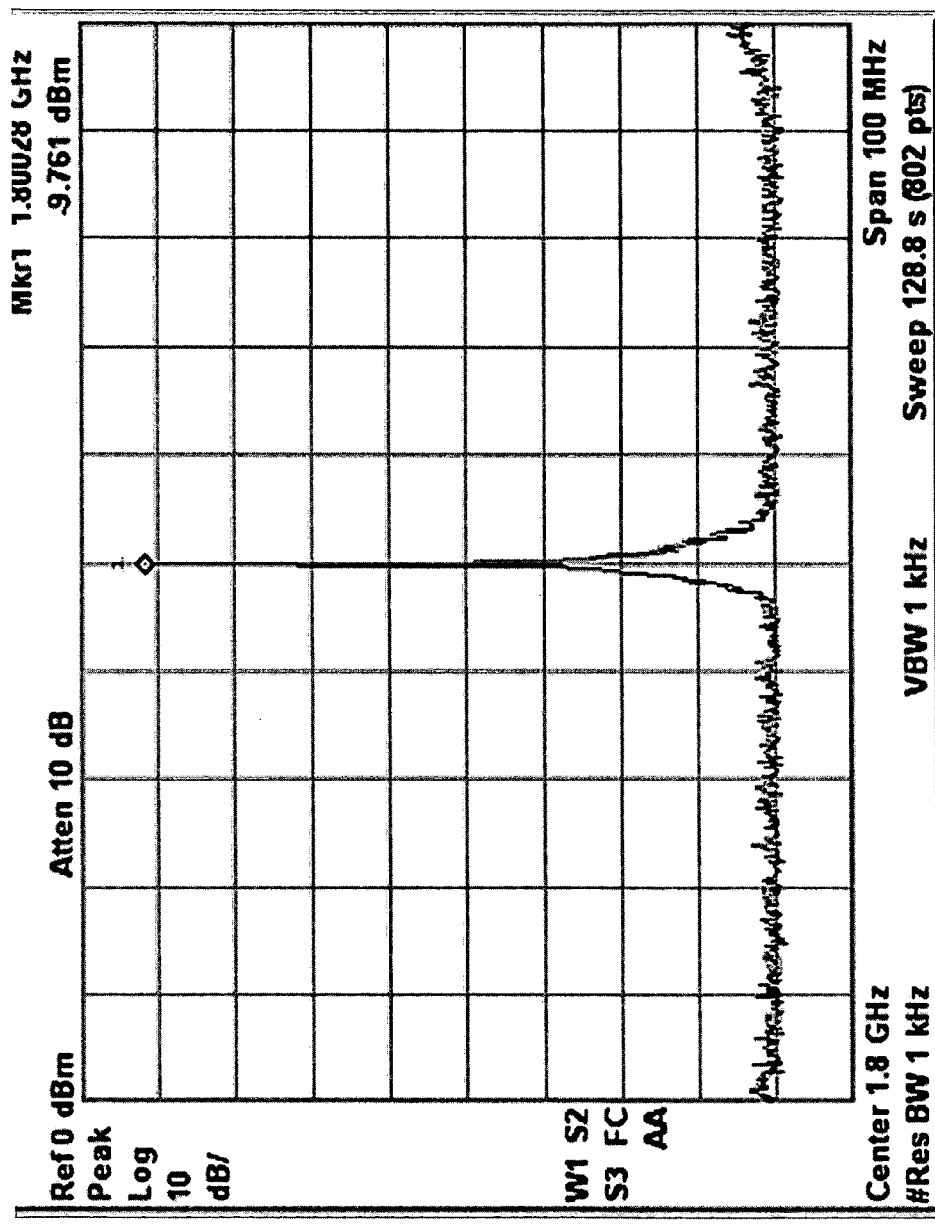
Figure 24B:
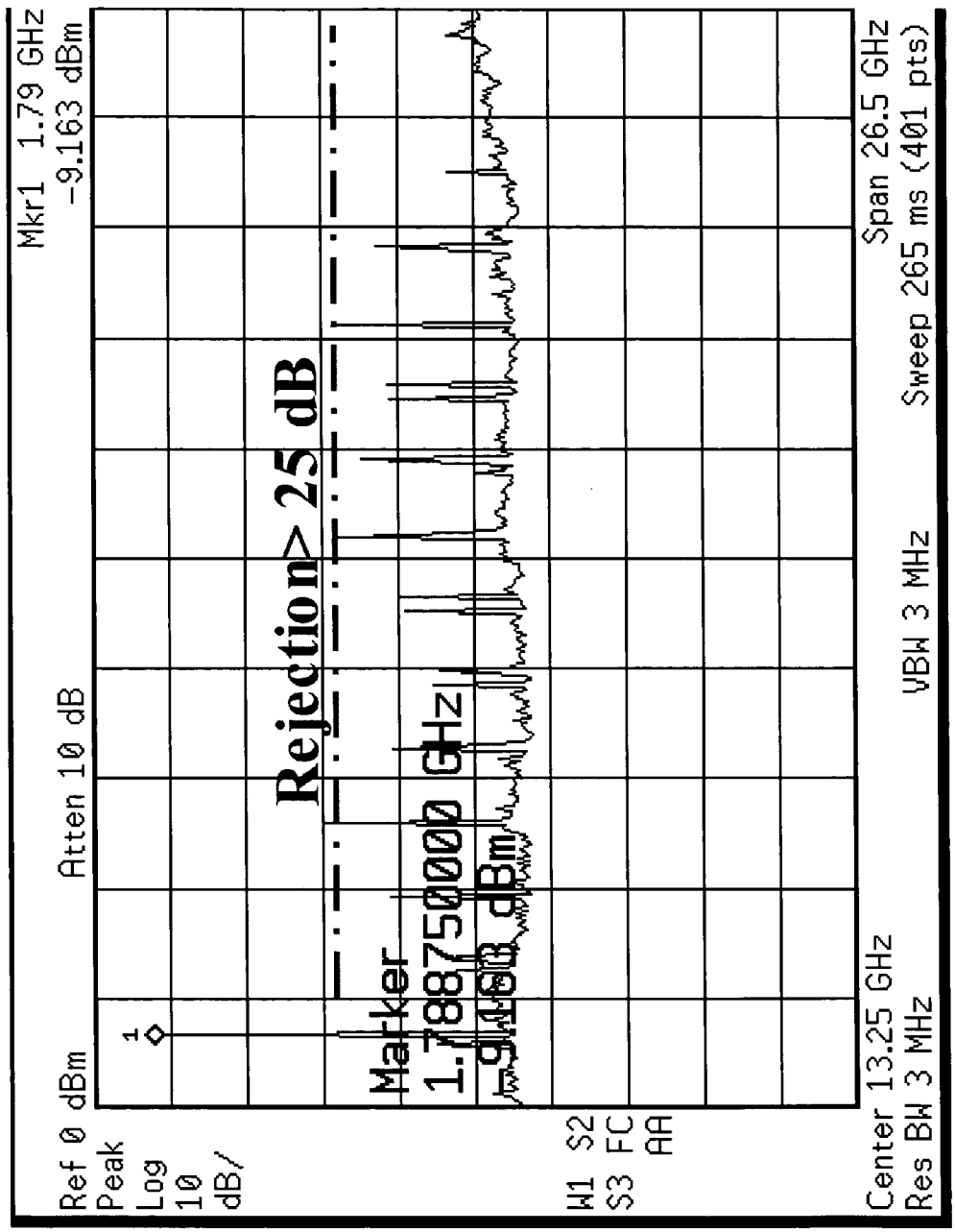
Figure 25:
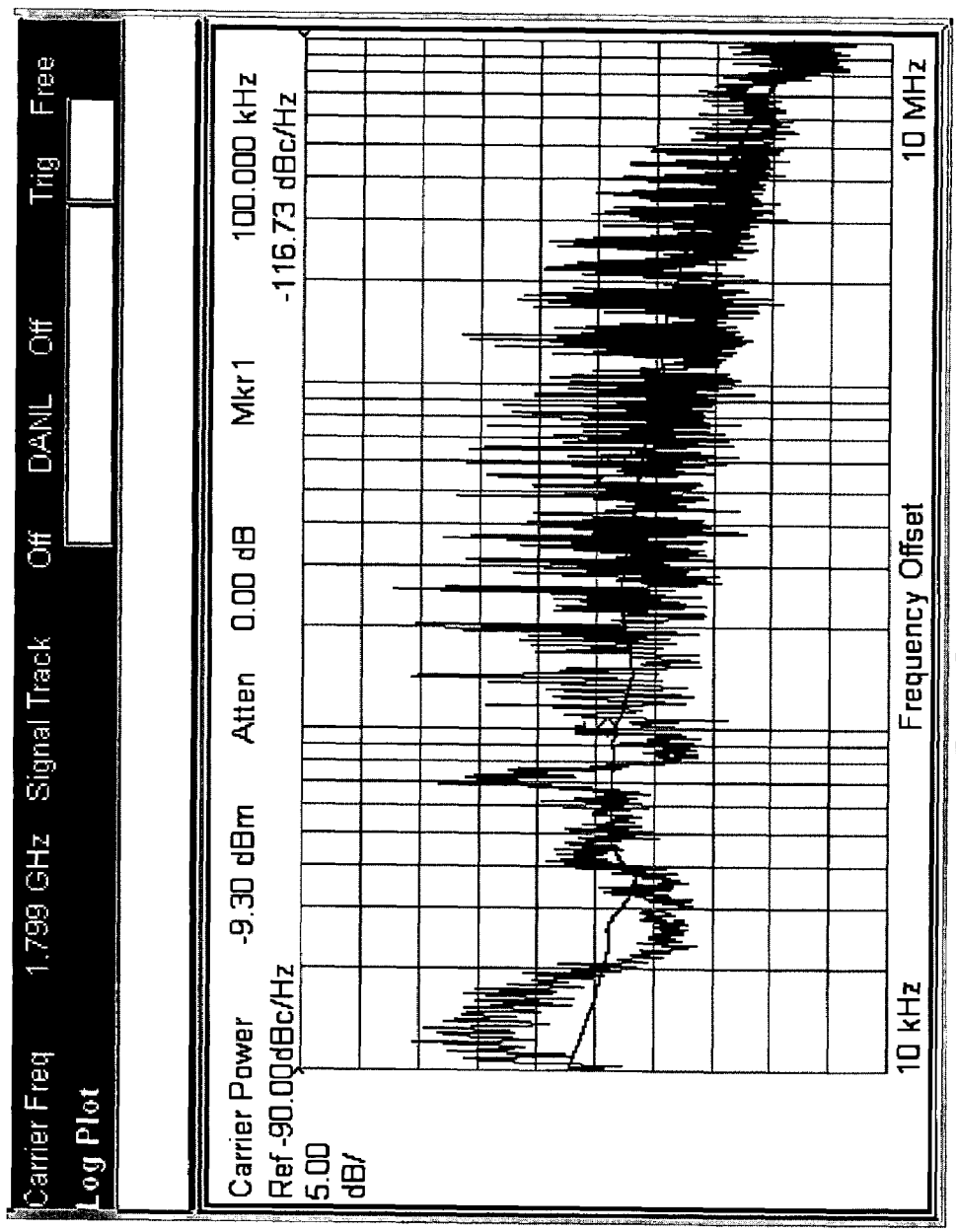

FIGS. 24A, 24B, and 25 show measured characteristics of the oscillator of FIGS. 23A and 23B.

FIG. 26 illustrates a comparison of voltage controlled oscillators fabricated with various technologies.

Figure 27:
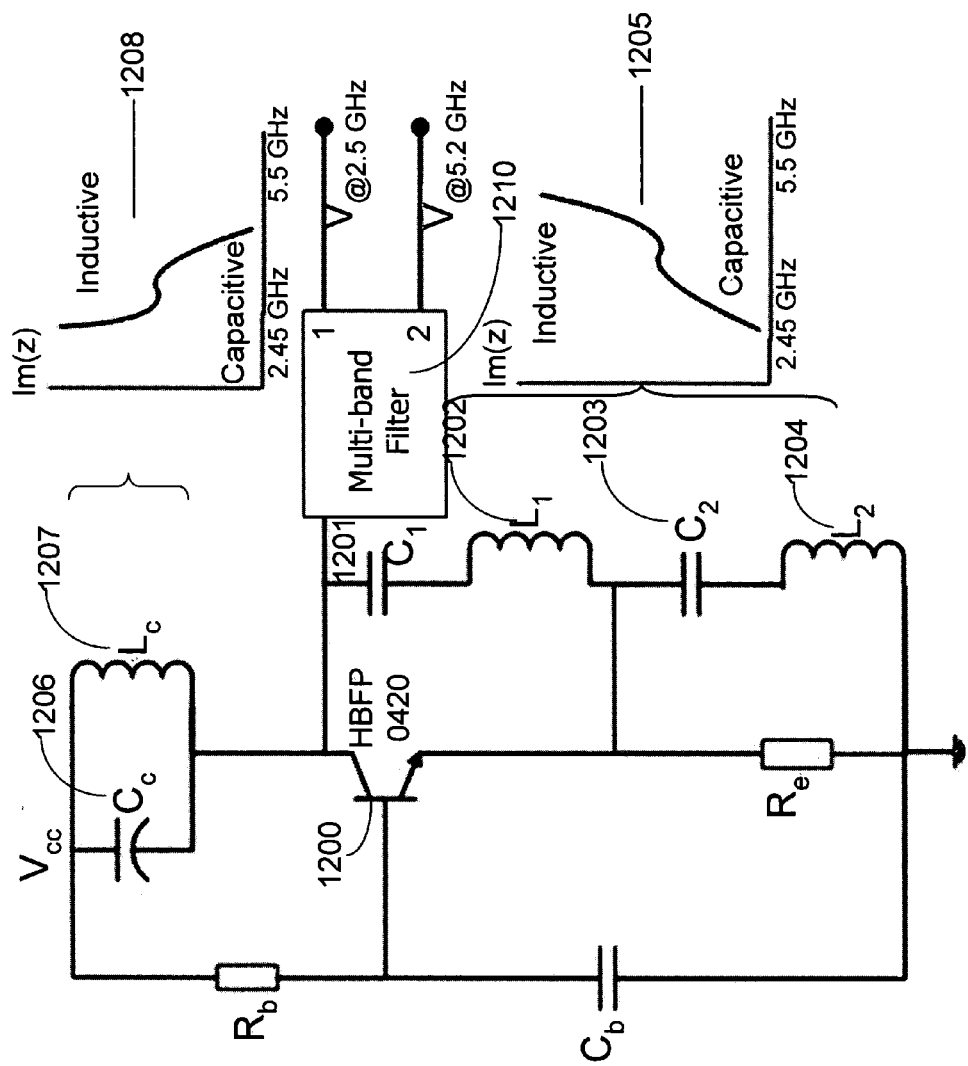

FIG. 27 illustrates an exemplary concurrent, multi-band oscillator in accordance with an embodiment of the present invention.

Figure 28:
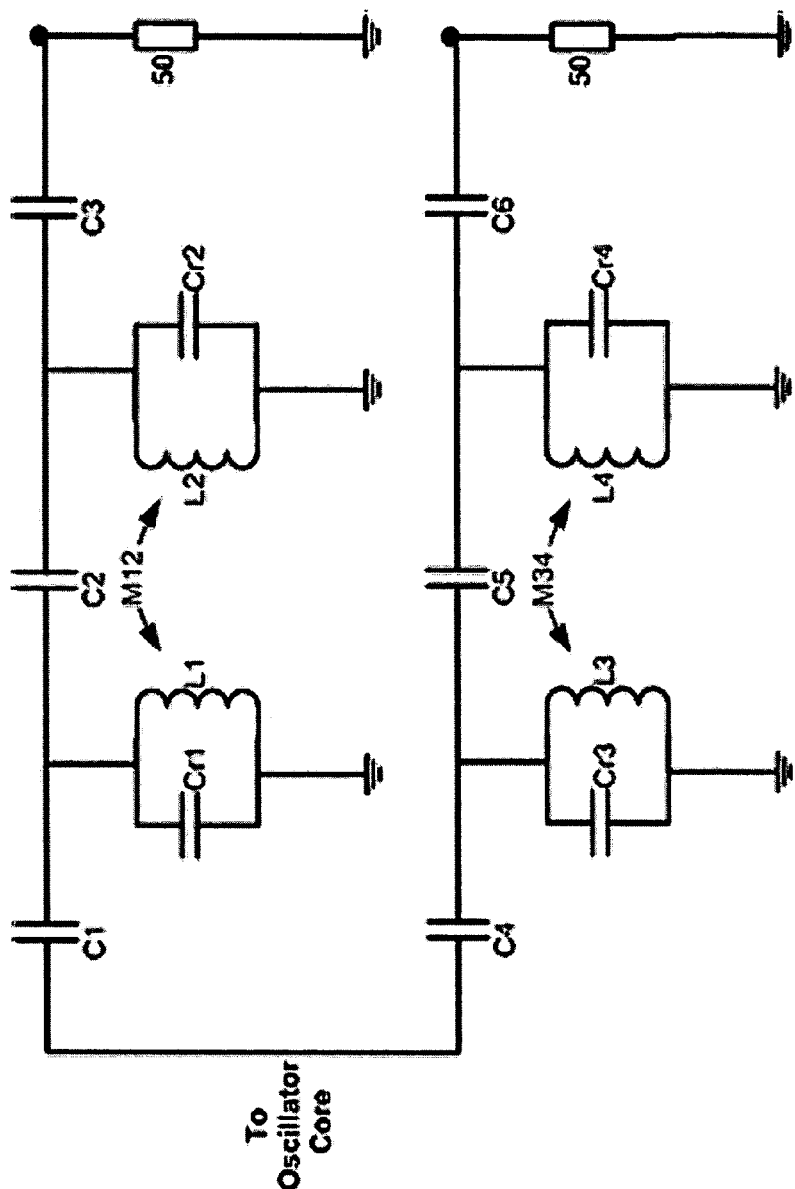

FIG. 28 illustrates a multi-band filter in accordance with an embodiment of the present invention.

Figure 29:
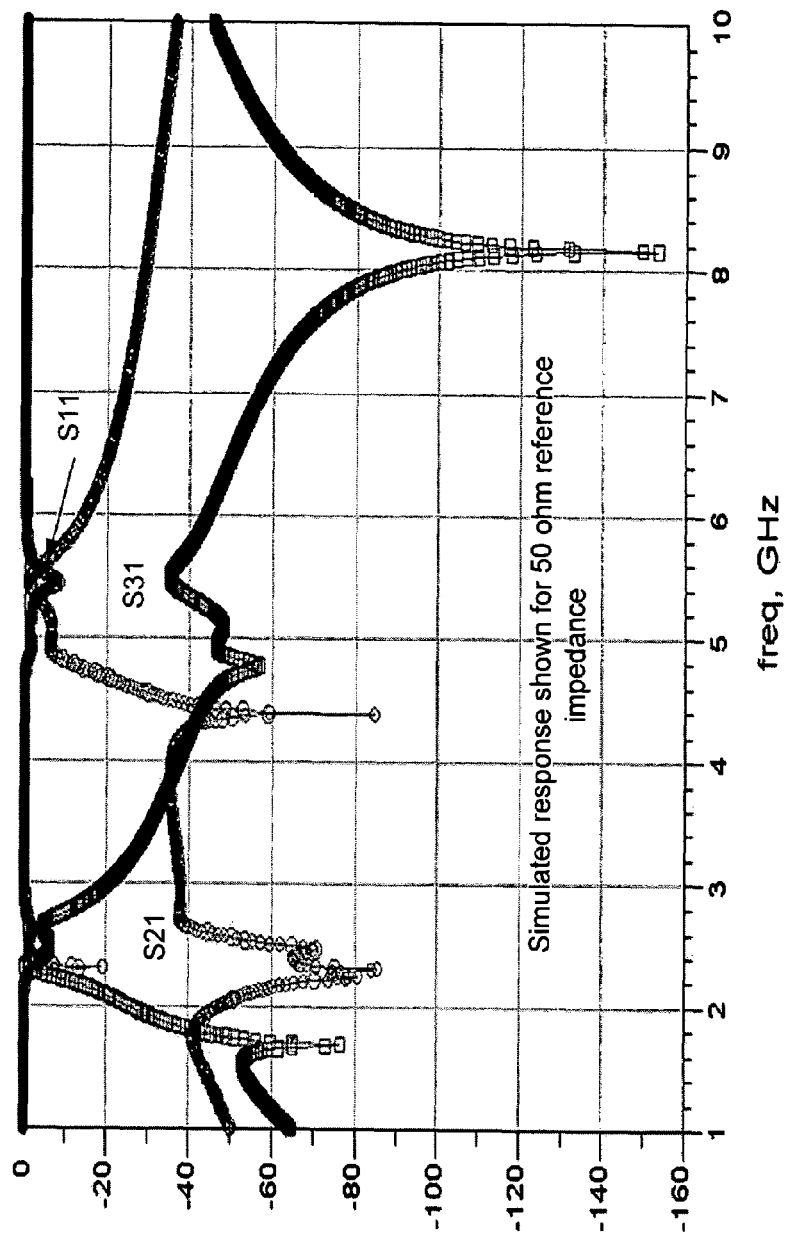

FIG. 29 shows a broad-band simulated response of a dual-band filter in accordance with an embodiment of the present invention.

Figure 30:
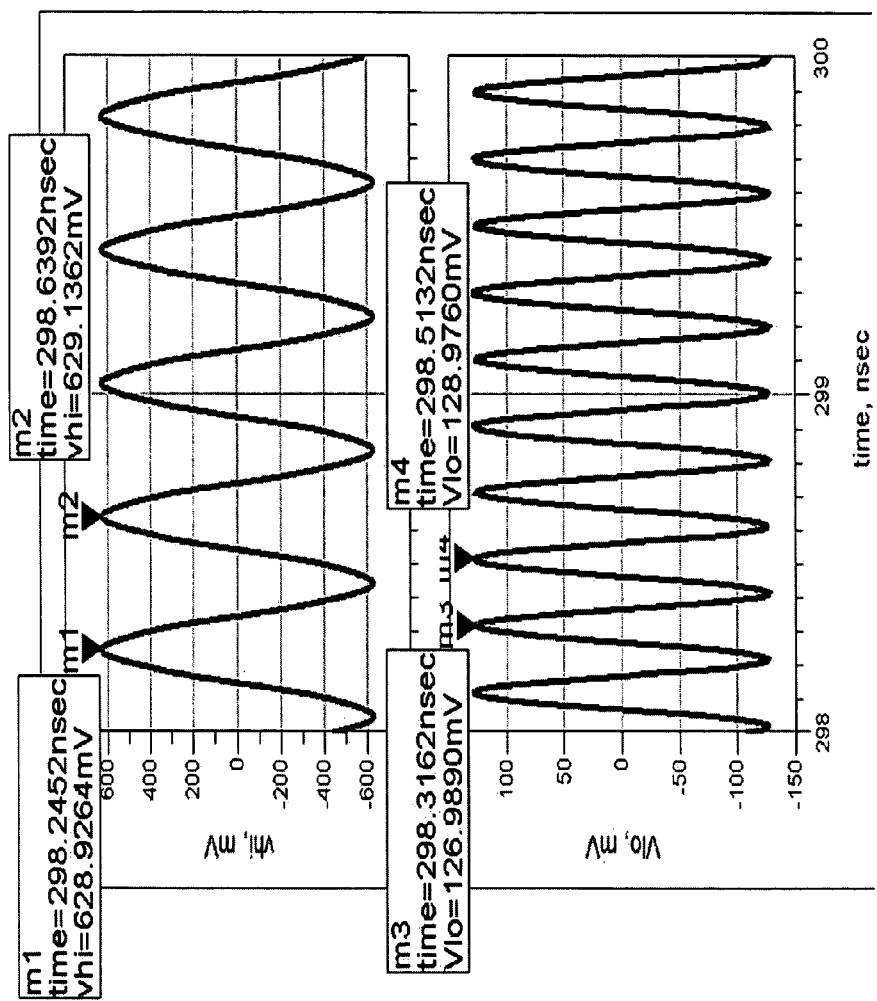

FIG. 30 shows a transient simulation of the oscillator of FIG. 27 in accordance with an embodiment of the present invention.

Figure 31A:
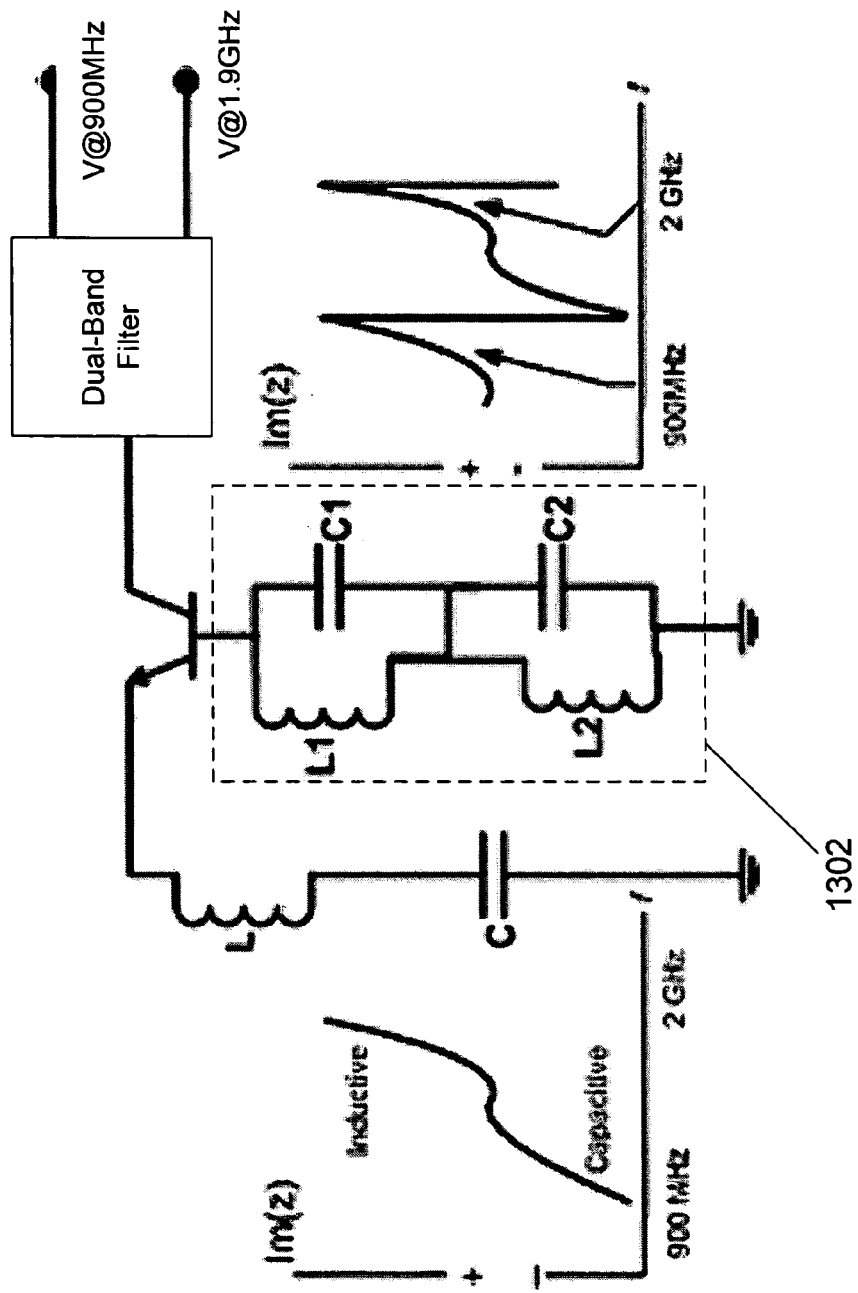

FIG. 31A shows another exemplary circuit of a concurrent, multi-band oscillator in accordance with an embodiment of the present invention.

Figure 31B:
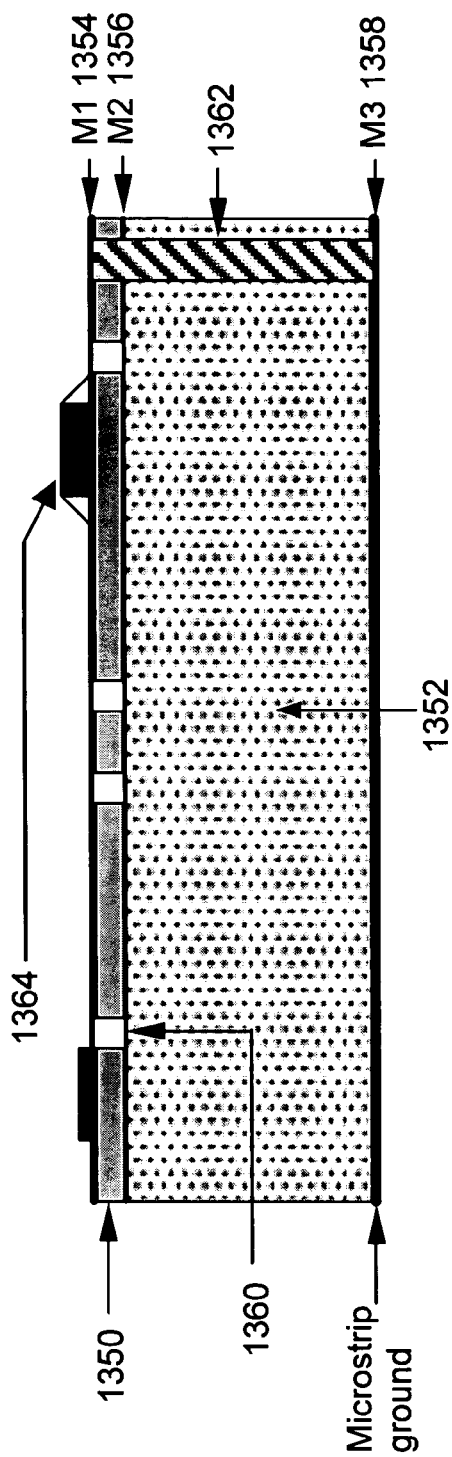

FIG. 31B illustrates an exemplary stackup for the oscillator of FIG. 31A in accordance with an embodiment of the present invention.

Figure 31C:
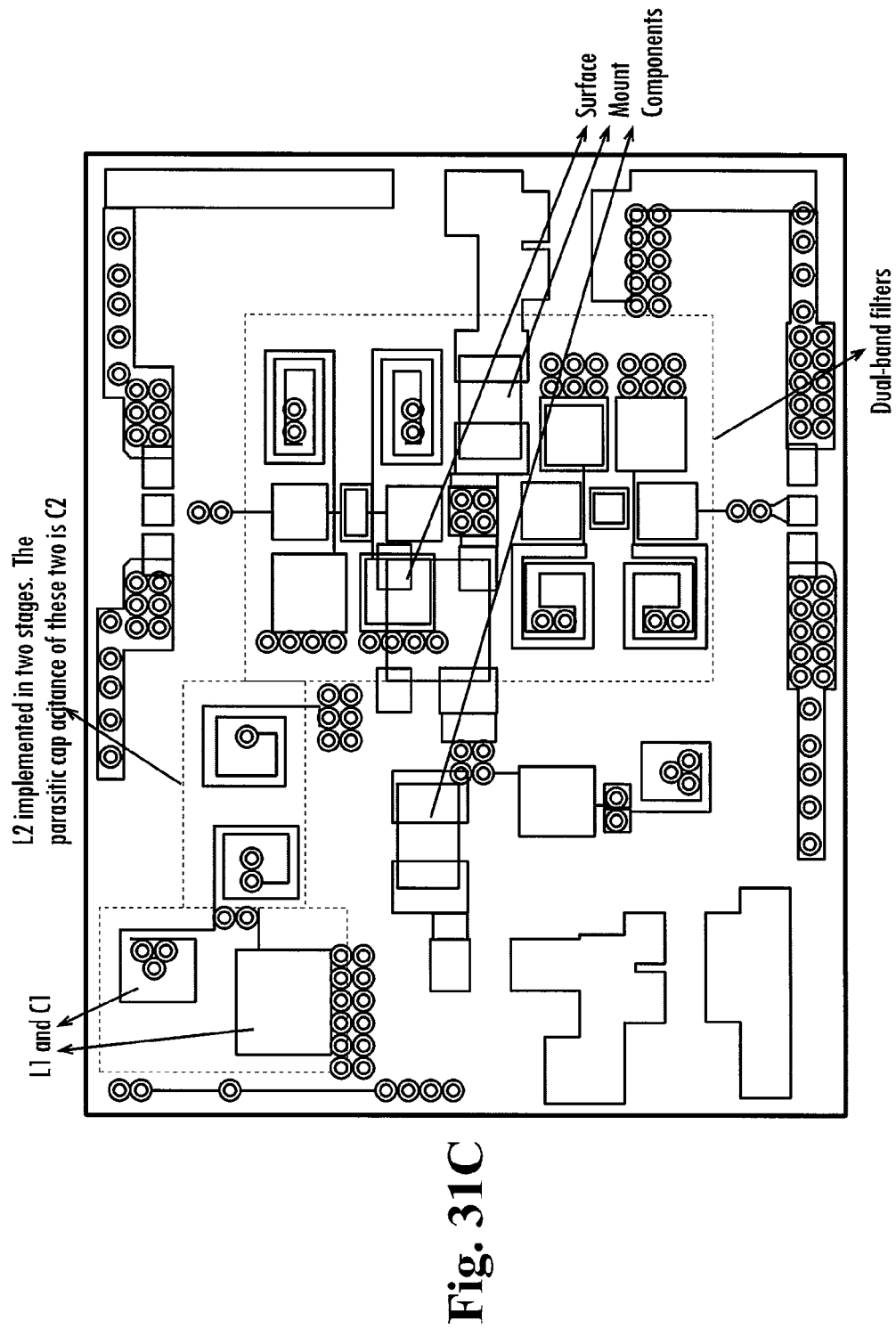

FIG. 31C shows a top view of a layout for the oscillator of FIG. 31A in accordance with an embodiment of the present invention.

Figure 32:
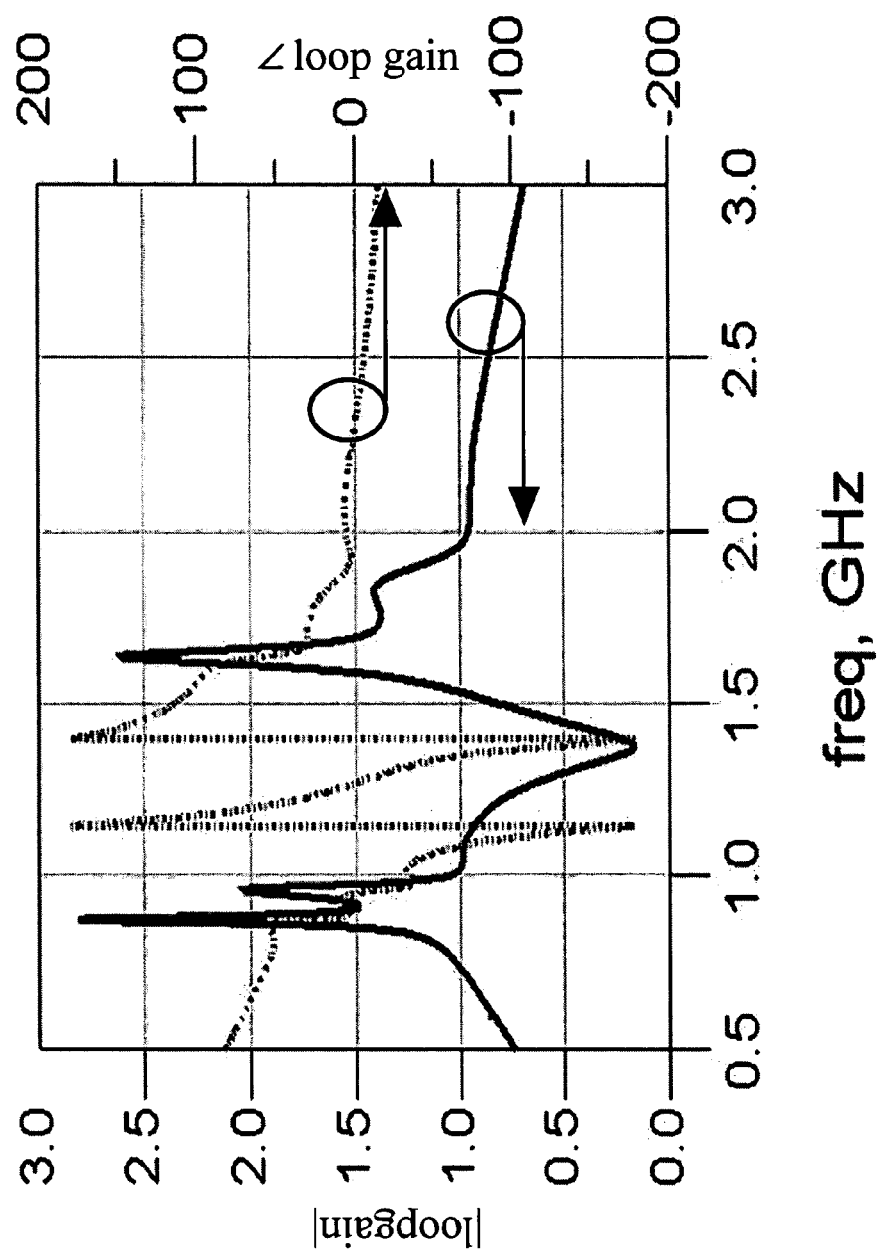

FIG. 32 shows the loop gain and the loop gain criterion of the oscillator of FIG. 31A.

Figure 33:
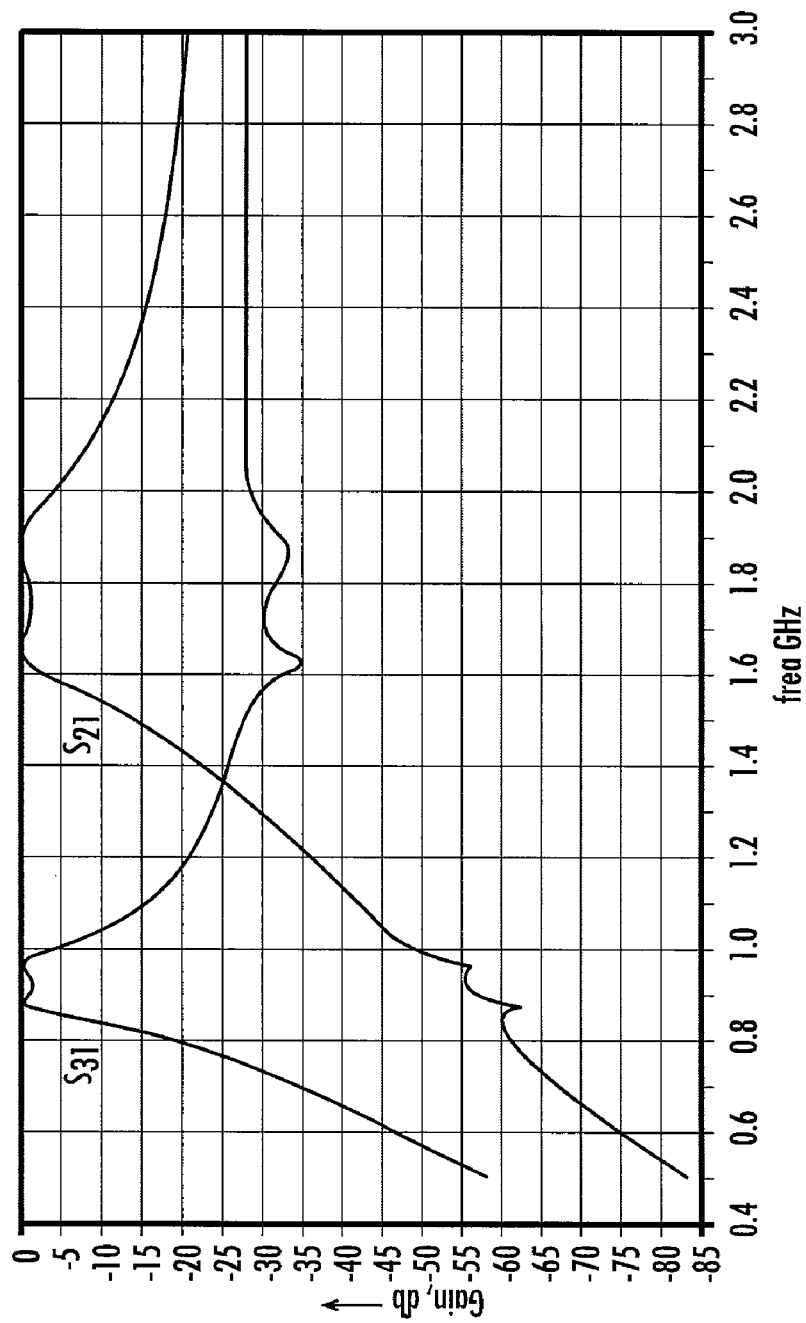

FIG. 33 shows a simulated response of a filter in accordance with an embodiment of the present invention.

Figure 34:
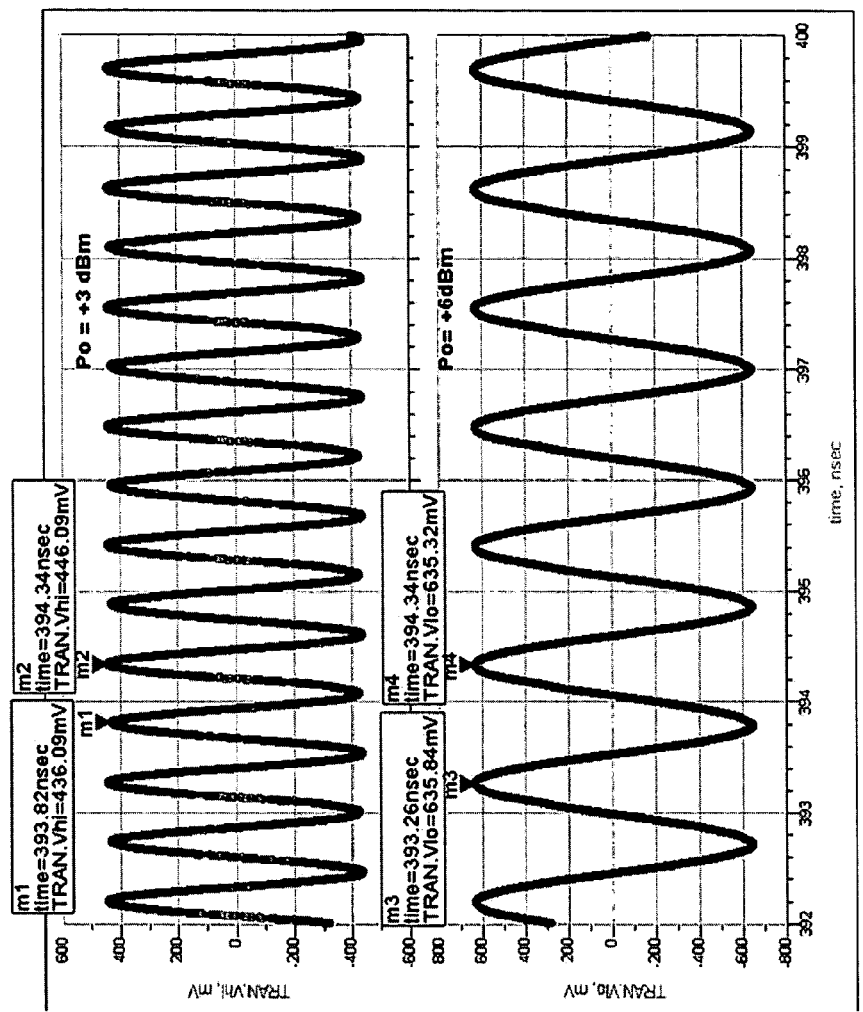

FIG. 34 shows a transient response of the concurrent, multi-band oscillator of FIG. 28A.

Figure 35:
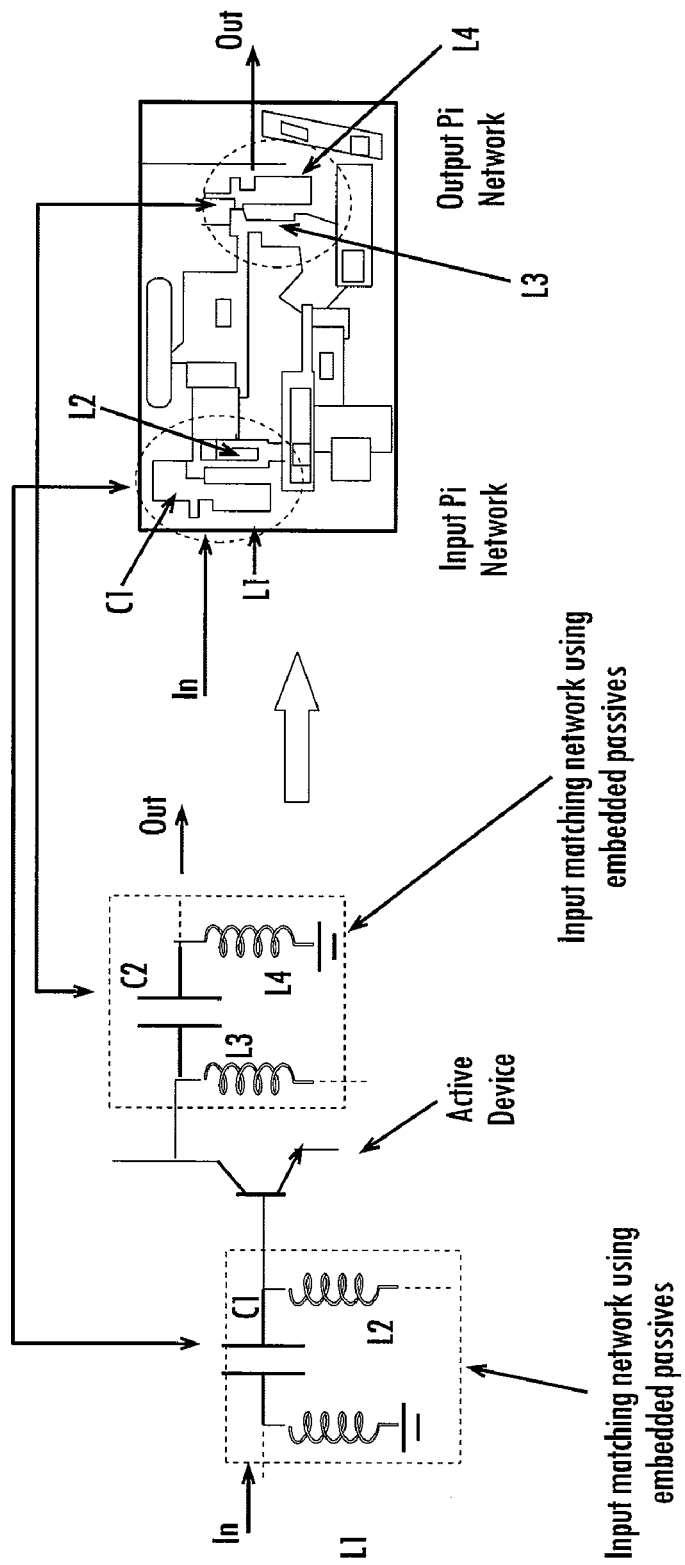

FIG. 35 shows an exemplary circuit diagram of a low noise amplifier in accordance with an embodiment of the present invention.

Figure 36:
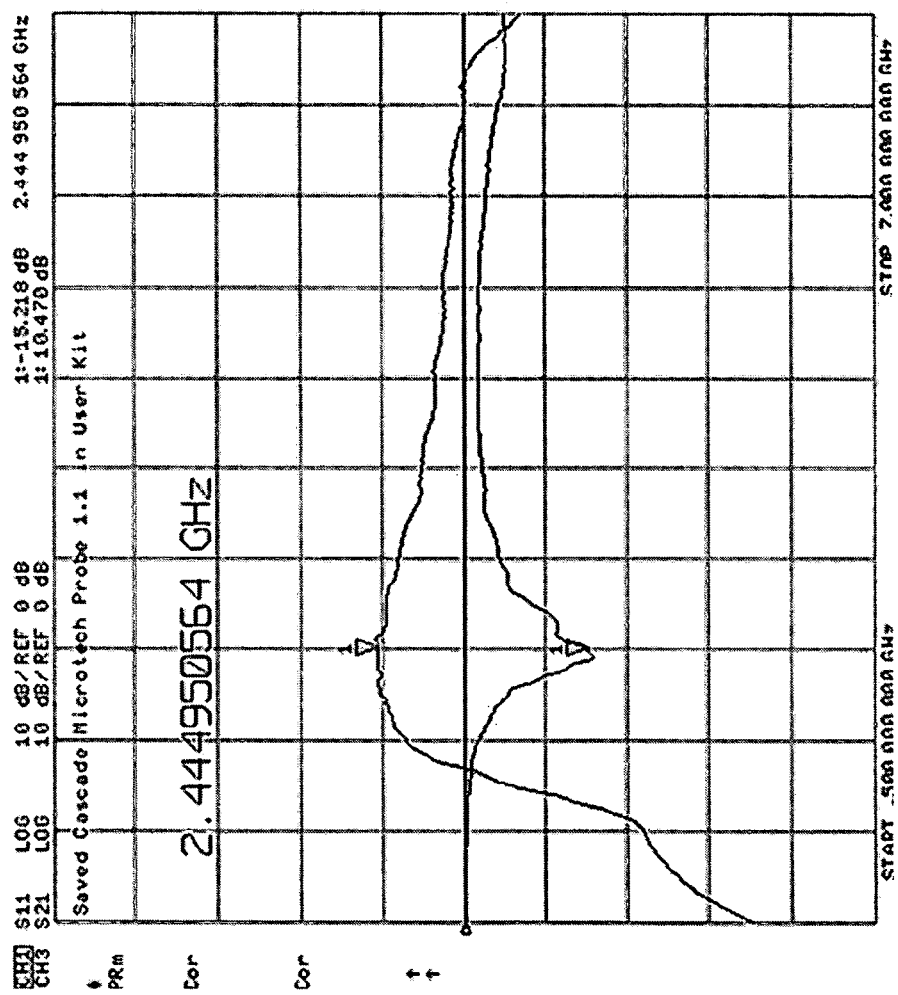

FIG. 36 shows the measured gain and input match for the low noise amplifier of FIG. 35.

Figure 37:
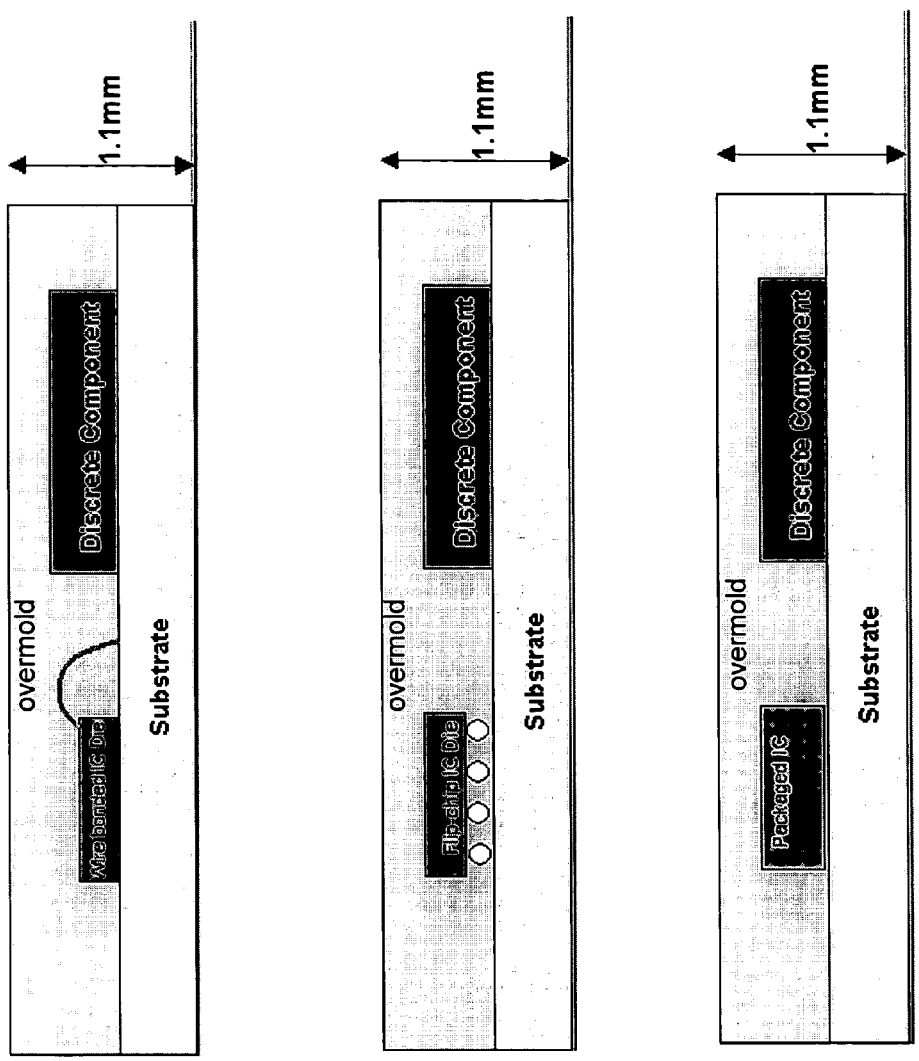

FIG. 37 shows the measured gain and input match for the low noise amplifier of FIG. 35.

FIGS. 38A-38F illustrate substrate variations according to an embodiment of the present invention.

DETAILED DESCRIPTION

The present inventions now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

I. Filters

The operation of a filter in accordance with the present invention is explained below with reference to the bandpass filter 10 of FIG. 1A. However, it will be appreciated by those of ordinary skill in the art that the teachings of the present invention readily apply to other integrated passive devices. Accordingly, the scope of the present invention is not limited to bandpass filters, but is inclusive of other devices such as but not limited to diplexer, duplexer, multiplexer, baluns, power combiner, band-stop/band elimination filter, power divider, low-pass filter, high-pass filter, voltage controlled oscillators (VCOs), and low noise amplifiers (LNAs).

With reference to the figures, FIG. 1A is an equivalent circuit diagram of a dielectric bandpass filter 10 in accordance with the present invention. In FIG. 1A, inductors 12, 14 cooperate with their corresponding capacitor 16, 18, respectively, to form resonators 20, 22, respectively. The inductors 12, 14 correspond to the stripline or CPW/strip-line or CPW/microstrip inductors discussed below with reference to FIGS. 2-4. The capacitors 16 and 18, respectively, correspond to the capacitors formed on the same layer as inductors 12 and 14 or by using discrete capacitors. The capacitor 24 corresponds to the capacitor formed for the purposes of inter-resonator coupling. In FIG. 1A, capacitors 26 and 28, respectively, provide matching to the desired impedances at the input and output. In addition, M is the magnetic coupling between the inductors 12 and 14. The inductances of inductors 12 and 14 could also represent equivalent inductance components of the resonators, and capacitances of capacitors 16 and 18 could represent capacitance components of the resonators. While the circuit topology shown in FIG. 1A depicts one embodiment of a two pole filter, and an additional pole can be attained by the mutual inductance between inductors 12, 14 and the capacitor 24. In addition, resonators may be added with the required coupling elements by adding more inductors and capacitors in various configurations to achieve transfer characteristics that emulate such responses as first order, second order to nth order butterworth, chebychev, elliptic, blinkoff, symmetric, asymmetric, notch added filters using topologies such as nodal capacitor coupled, nodal-inductor coupled, shunt-input geometry, input geometry or mesh capacitor coupled.

The stopband characteristics of a filter is a prime factor in determining the isolation between the transmitting and receiving paths in duplexer designs. It is well known that the stopband rejection may be enhanced, either by increasing the number of resonators as mentioned earlier, or by adding transmission zeros.

FIG. 1B is an alternative equivalent circuit diagram 10 of a dielectric filter using transmission lines or inductor resonator elements, wherein the inductors 112 resonate at a desired center frequency. The physical parameters of the circuit 110, such as the number of turns, length of conductor, outer and inner diameter, can be altered to resonate the inductor 112 at the desired frequency. This reduces the number of components required to achieve a filtering function by removing the need for capacitors of the resonators. However, a disadvantage is the increase in length of the metallization to increase the capacitance, though the increased inductance could increase loss in the circuit. If the inductor element becomes too large or too lossy, then it may be desirable to use an alternative circuit design, such as that illustrated in FIG. 1A. It should be noted that in the circuits of FIG. 1A and FIG. 1B, the coupling between the components can be achieved by magnetic coupling, electric coupling or a combination thereof.

Illustrative physical layouts of dielectric filters in accordance with the equivalent circuit diagram of FIG. 1A are depicted in FIGS. 2-4. The dielectric filters of FIGS. 2-4 have a two-pole structure and an additional pole attained by the mutual inductance and the capacitor 24 according to the equivalent circuit diagram shown in FIG. 1A.

With general reference to FIGS. 2A-2C, illustrated is a surface mounted device (SMD) embodiment of the filter illustrated by the circuit of FIG. 1A in accordance with the present invention. Specifically, the organic bandpass filter 200 comprises inductors 212 and 214, which are meandering inductors formed close to each other on an organic dielectric layer 236 (which can be a thin laminate such as LCP or PPE, but is not limited to these) and is preferably configured as either a shorted hybrid CPW-stripline (where lines that form meandering inductors 212 and 214 are connected to a coplanar ground, that is, in-built shielding 230), or a stripline in the presence of coplanar in-built shielding 230 and additional grounds 248 and 250 that are connected to the plated through holes 232 and/or external shield electrodes 234.

Since these inductors are very close to each other, the magnetic coupling between these filters, represented by M in FIG. 1A, can increase the pass bandwidth of the filter, thereby decreasing its performance. However, an inter-resonator parallel plate coupling capacitor 224, (with or without the coplanar in-built shielding 230) formed using two disconnected metal plates (one plate formed using patterning conductive layer 238 and the other plate formed using patterned conductive layer 240) and shown as capacitor plates 224a, 224b is provided. The capacitor plates 224a, 224b sandwich the first organic dielectric layer 236 in such a manner that each plate of the inter-resonator coupling capacitor electrode is connected to separate resonators which helps compensate the effect of the magnetic coupling and helps make very compact filters. The center capacitance can be as small as femptoFarads or as large as picoFarads for achieving the specified bandwidths. The smaller capacitance helps reduce the bandwidth. Additionally, capacitor 224 in parallel with the mutual inductance equivalent gives a pole in the lower band or upper band.

The bottom plate formed by the conductive layer 240 connects to inductor 212 using one or more microvias in the organic dielectric layer 236, such as the vias 244 with pads 246 for landing and capturing the via. First and second shield electrodes 248, 250 formed respectively on the organic core layers 252, 254, wherein the core layers 252 and 254 are disposed so as to sandwich the organic dielectric layer 236 there between. A first resonator 260 formed by inductor 212 and capacitor 216 and a second resonator 262 formed by inductor 214 and capacitor 218 are electrically coupled to each other through the parallel plate capacitor 224, whereby an inter-resonator coupling is effected in combination with said magnetic coupling and electric coupling.

In a dielectric filter according to the present invention, where the inductors do not provide the needed capacitance in the desired length, the inductors 212, 214 can be connected in similar fashion as the capacitor 224 to separate grounded/shunted parallel plates 216a and 218a, respectively, of capacitors 216 and 218, respectively, using the same first organic dielectric layer 236 as the sandwiched dielectric, which then together form the resonator pairs 260, 262.

The equivalent inductance L obtained with one of the meander inductors, 212, 214, and the equivalent capacitance C due to one of the capacitors 216, 218, resonates approximately at frequency Fo, the center frequency of the filter, as defined by Equation (1) below:

whereby $$Fo \sim \sqrt{1/(LC)} \qquad (1)$$

The capacitor plates 216a and 218a have a corresponding ground plate 217 on the opposite surface of the organic dielectric layer 236. Having a common plate does cause coupling between the capacitors which has to be accounted for during the design by including it as the mutual inductance between the parasitic inductance of each capacitor 216, 218. This coupling can be used to achieve further poles; however if the coupling causes problems in the passband during the synthesis stage it could be reduced by either dividing plate 217 into separate plates or by adding several vias on pads 274 that connect plate 217 to in-built shielding 230 on the side of the inductors 212 and 214, thereby helping excess currents to sink and thereby reducing coupling between components.

In addition, parallel plate/interdigital capacitors 226 and 228, can be used on either side of the first and last resonator elements 260, 262 at the input and output terminals of the device for impedance matching purposes. Alternatively, inductors or transmission lines or a combination of capacitor (s), inductor(s) and transmission line(s) can be utilized, as desired. If capacitors 226, 228 are used for matching purposes, it follows the center capacitance is that of capacitor 224 in terms of the nominal capacitances required, that is, the capacitance from capacitor 226 and capacitor 228 are proportional to capacitor 224.

A dielectric filter according to the embodiment of the present invention illustrated in FIGS. 2A-2C can comprise at least two external shield electrodes 234 respectively formed on different side surfaces of the laminated structure, which comprises at least the organic dielectric layer 252, 236, 254, and that are connected to the shield electrodes 248 and 250. This may or may not be desired for shielding purposes in a CPW topology, wherein the use of plated through holes 232 on the four corners is sufficient. Utilizing the plated through holes 232 may save additional room required for the external shield electrodes 234 and also may save the processing cost involved. However, in stripline and microstrip filter topologies, plated through holes 232 and external shield electrodes 234 together provide the connection for the shorted inductors/resonators and capacitors at any point along the respective sides. Alternatively, the CPW topology with coplanar in-built shielding 230 on the same plane of the first dielectric layer provides the shielding internally, and provides for the ground connectivity to the resonators/inductors and capacitors. However, in general, in more noisy environments it may be preferred to also have the external ground electrodes.

The dielectric filter 200 also comprises an external input terminal electrode 264 and an external output terminal electrode 266 which are formed on one side surface of a laminated body comprising at least dielectric sheets 252, 236, 254, and an external ground electrode, (such as shield electrodes 248, 250, through holes 232 or side shield electrodes 234) formed between said external input and output terminal electrodes 264, 266 on one side surface.

The shield electrodes 248 and 250 formed on the dielectric core layers 252 and 254, respectively, are preferably of the shape and patterned to leave room for the landing terminals of input and output terminal electrodes 264 and 266. For purposes of illustrating the present invention, the shield electrodes 248, 250 are shown in FIGS. 2B and 2C, but not 2A.

The first organic dielectric layer 236 can comprise single side copper LCP laminate or the like, such as PPE, N6000, epoxy based N4000-13, or any other suitable low loss dielectric.

The protective layers 270, 272 are formed on shield electrodes 248, 250 opposite dielectric core layers 252, 254, respectively, to protect the structure from environmental affects such as oxidation and also to create a pattern for solder to flow on to the input output terminals 264 and 266 and ground pads formed by plated through holes 232. The protective layers 270, 272 may comprise a solder mask, or in more demanding applications, with higher tolerances, other materials such as prepreg or LCP may be desired. For purposes of illustrating the present invention, the protective layers 270, 272 are shown in FIGS. 2A and 2B, but not 2C.

In the dielectric filter according to the present invention, as illustrated in FIGS. 2A-2C, an initial step to making a connection between devices using vias 244 is done by drilling through holes (as small in diameters as the thickness of the dielectric used) through the LCP layer (or any other appropriate organic dielectric) and copper layer. Then both sides of LCP copper laminate are metallized, such as by electroless or vacuum deposited copper. Copper is then electroplated on both sides of laminate to form the metallized patterns 238, 240 on the organic dielectric layer 236. The copper is then printed and etched to define the key filter components.

In the dielectric filter according to the embodiment illustrated in FIGS. 2A-2C, the dielectric core layers 252, 254 can be laminate LCP or appropriate dielectric with generally larger thickness than the first substrate and aluminum, copper, Molybenum metal (for high power applications) on both sides of filter to a given thickness to encapsulate components. All metals are preferably electroplate and etched and patterned on top and bottom of the device to leave space for signal input and output.

In a dielectric filter according to the embodiment illustrated in FIGS. 2A-2C, the side wall ground shield electrodes 232, 234 can be fabricated, if desired, by single or multiple connected drilled and plated through holes or using a saw cutting device and then connected via electroless or sputter seeded copper in the through hole. The copper can be electroplated in the through hole and on the surface. The copper can then be printed and etched to form SMD connection. The process flow for a two layer plus the packaging of the SMD device is explained in greater detail in connection with FIG. 5.

With reference to FIGS. 3A-3C, illustrated, is a BGA/CSP embodiment of an organic bandpass filter 300 in accordance with the present invention. Essentially, all of the internal structure in the filter depicted in FIGS. 2A-2C and FIGS. 3A-3C are similar except the packaging is different, and thereby, the means by which you package it. For example, in FIGS. 3A-3C the thin laminate (e.g., the organic dielectric layer 336) is not packaged between two thick cores, but is packaged with one core layer 354 on one side and a first protective layer 370 on the opposite side substrate 336. The opposite side of the thicker core 354 is metallized to form a shield electrode 350, and a second protective layer 372 is disposed over the shield electrode 350. The protective layers may comprise a solder mask, or in more demanding applications, with higher tolerances, other materials such as prepreg or LCP may be desired.

This packaging of filter 300 renders a microstrip or CPW/microstrip filter device with only shield electrode 350. Instead of using through holes to connect the device input/output and ground terminals, solder balls 380 are utilized. Side wall ground shield electrodes 334 are used to connect the in-built shielding electrodes 330 and shield electrode 350 and, if desired, to solder balls 380.

Alternatively, this could be done by plated through holes, if provided. As discussed above, having both plated through holes 332 and side wall shield electrodes 334 is not typically necessary, and generally they can be utilized in the alternative of one another. For purposes of illustrating the present invention, side wall grounded shield electrodes 334 are shown in FIG. 3A-3C. The solder balls 382 connect the input and output terminals to the bandpass filter. The solder balls and the packaging is constructed using the methodology provided below in connection with FIG. 6. The protective layer 370 (also known as a passivation layer mask, solder mask, bondply layer or low temperature thermoset, thermopolymer material compound to inner laminate) may be utilized to provide openings for the solder balls, as well known in the art.

With reference to FIGS. 4A-4B, illustrated is an embodiment of a filter device 400 in accordance with the present invention, which utilizes discrete capacitors 402 and external shielded formed by a metallic case or cap 404. Essentially, all internal structure in FIGS. 2A-2C and FIG. 3A-3C are similar except the packaging is different in the embodiment of FIGS. 4A-4B, and thereby the means by which you package it. For example, in FIGS. 4A-4C, an organic dielectric layer 436 (e.g., a thin laminate substrate) is not packaged between two thick cores, but only one core layer 454 on one side, wherein a shielding electrode 450 is metallized on the opposite side of the core layer 454. On the other side of the organic dielectric layer 436 is a metallic cap 404 with the appropriate height, which is used to provide a second ground reference. The organic dielectric layer 436 is metallized on opposing surfaces by patterned conductive layers 438 and 440, which are electrically connected by at least microvias in layer 436, as discussed with regard to the embodiments of FIGS. 2 and 3. Instead of using a thicker core on both sides of the substrate 436, this embodiment uses a core layer on one side and air as a dielectric on the other. This renders itself into a stripline or CPW/stripline device. Through holes are used to connect only the core metal to the internal metallic structure whereas the metallic cap 404 is connected using solder connections to the relative terminals. The metallic cap 404 can have openings where needed for the input and output terminals. It is important to note that the embodiment is not restricted to using discrete capacitors. The capacitors shown in FIGS. 4A-4B can also be embedded in the substrate, if needed, as discussed previously.

The following are examples of various embodiments of the present invention, wherein each illustrative embodiment discloses several aspects of the invention.

II. Illustrative Methods for Fabricating Stand Alone Filters

An illustrative process for fabricating an LCP based IPD, such as the filter illustrated in FIGS. 2A-2C, configured as a surface mount device (SMD) in accordance with an embodiment of the present invention is now described with reference generally to FIG. 5. Initially, a starting material is selected, which is preferably a reinforced or non-reinforced LCP laminate that can be unclad, or cladded with copper foil on one or both sides of the LCP, as illustrated in Step 1. Alternate materials include other low loss organic laminates like PPE, PTFE composites, hydrocarbon ceramic composites, BT resin composites (e.g., Speedboard C), and thermosets (e.g., Hitachi MCL-LX-67F). Next, through vias are drilled through the LCP or other laminate and the layers of copper, as illustrated in Step 2. These microvias can be drilled with mechanical drilling, laser drilling or other suitable methods known to those skilled in the art.

Steps 3 and 4 involve the metallization of the through vias and laminate. In additive, semi-additive, or subtractive processes starting with unclad or copper clad LCP or other laminates, both sides of the LCP or other laminate and the vias are seeded using electroless plated, vacuum deposited copper or another deposition method to form a continuous copper film. To achieve the target metal thickness for the device, electrolytic plating is done to build the copper on both sides of the laminate and in the vias in a single step. The circuit definition for the filter component can be done using subtractive, semi-additive or fully additive processes with panel or pattern electroplating of the copper followed by print and etch steps to define the filter circuitry, as illustrated in Step 5.

The fabricated device circuits are then packaged using vacuum or non-vacuum lamination of LCP or alternate laminate materials as detailed above in connection with Step 1, and/or Al, Cu, Mo metal (for high power applications) on both sides of the filter to provide sufficient thickness to encapsulate components, as illustrated in Step 6. The internal and external metal layers are connected, as needed, using plated through holes that can be drilled mechanically or with laser, photo, or plasma processes to provide signal and ground connections and SMD terminals, as illustrated in Step 7. The two edges of the device without the through hole can also be slotted using mechanical drill/rout/mill, laser cutting, or sawing processes to provide for additional shielding of the device during subsequent metallization. The drilled through holes and shielding slots are seeded with electroless plated or sputter/vacuum deposited copper to provide a bus layer in substantially the same manner as described above in connection with Step 3, as illustrated in Step 8.

With reference to Steps 9, 10, and 11, the final metal thickness for the outer layers is built up by electroplated copper in the through holes, shielding slots, and on the top and bottom surfaces. Subtractive, semi-additive, or additive processes may be used to define the outerlayer ground circuits and SMD terminals for connection, with print and etch processing of the copper, as described above in connection with Steps 4 and 5. The device is then finished with the addition of terminal metals appropriate for SMD assembly and soldering processes. These finishing metals on the device terminals are common plated metals or alloys like electroless Ni—Au, immersion tin, immersion silver, electroplated Ni—Au, solder (HASL), or organic finishes (OSPs) and the choice depends on the intended application.

The fully fabricated wafer is then singulated into individual filter components. The singulation can be done using high speed dicing saws or alternate methods such as punching or routing/milling. An advantage of this fabrication process is the ability to fully electrical test the components either before or after singulation.

Another illustrative process for fabricating an LCP based IPD, such as the filter illustrated in FIGS. 3A-3C, configured as a ball grid array (BGA) or chip scale package (CSP) in accordance with an embodiment of the present invention is now described with reference generally to FIG. 6. Initially, a starting material is selected, preferably a reinforced or non-reinforced LCP laminate that can be unclad, or cladded with copper foil on one or both sides of the LCP, as illustrated in Step 1. Alternate materials include other low loss organic laminates like PPE, PTFE composites, hydrocarbon ceramic composites, BT resin composites (e.g., Speedboard C), and thermosets (e.g., Hitachi MCL-LX-67F). Next, through vias are drilled through the LCP or other laminate and the layers of copper, as illustrated in Step 2. The microvias can be drilled with mechanical drilling, laser drilling or other suitable methods known to those skilled in the art.

Steps 3 and 4 involve the metallization of the through vias and laminate. In additive, semi-additive, or subtractive processes starting with unclad or copper clad LCP or other laminates, both sides of the LCP or other laminate and the vias are seeded using electroless plated, vacuum deposited copper or other common deposition methods to form a continuous copper film. To achieve the target metal thickness for the device, electrolytic plating is done to build the copper on both sides of the laminate and in the vias in a single step. The circuit definition for the filter component can be done using subtractive, semi-additive or fully additive processes with panel or pattern electroplating of copper followed by print and etch steps to define the filter circuitry, as illustrated in Step 5.

The fabricated device circuits are then packaged using vacuum or non-vacuum lamination of LCP or alternate laminate materials detailed above in connection with Step 1, and/or Al, Cu, Mo metal (for high power applications) on both sides of the filter to a given thickness to encapsulate components, as illustrated in Step 6.

On the other side of the filter component, a cover coat material, liquid photo imagable (LPI), or dry film solder mask is deposited using standard processes such as spin coating, curtain or roller coating, dry film lamination, spray coating and others, as illustrated in Steps 7, 8 and 9. This layer acts as a barrier to solder flow between terminals during subsequent reflow and component assembly. The component terminals are defined by opening windows in the cover coat/soldermask material to open the BGA pads for board level interconnection. This is done with processes such as photolithography or laser ablation. The device is then finished with the addition of terminal metals appropriate for BGA assembly and soldering processes. These finishing metals on the device terminals are common plated metals or alloys like electroless Ni—Au, immersion tin, immersion silver, electroplated Ni—Au, solder (HASL), or organic finishes (OSPs) and the choice depends on the intended application and compatibility with the solder or other alloy used for device-to-module/PWB interconnection.

With general reference to Steps 10, 11, 12, the interconnects are formed in the windows in the manner defined in Step 8 using Pb/Sn solder, or other lead free solders and metal alloys. Processes such as screen or stencil printing of solder paste and reflow, or plating processes can be used to form the bumps for interconnection. The BGA/CSP format of the filter components enables the testing of the components on the large area board prior to singulation. The testing can be done, for example, with probing techniques or using test sockets or fixtures.

The fully fabricated wafer is then singulated into individual filter components. The singulation can be done using high speed dicing saws or alternate methods such as punching or routing/milling. An advantage of this fabrication process is the ability to fully electrical test the components either before or after singulation.

III. Actual Devices

EXAMPLE I

An X-ray photograph of an organic bandpass filter 500 in accordance with an embodiment of the present invention is provided in FIGS. 7 and 8. The filter 500 comprises shorted hybrid CPW-stripline meander transmission line inductors 512, 514 formed close to each other on a first organic dielectric layer, which is a 50 µm thick layer of LCP, wherein the inductors 512, 514 are directly magnetically coupled to each other. Each inductor is connected to separate parallel plate capacitors 516, 518 by sandwiching the same dielectric sheet. An inter-resonator parallel plate coupling capacitor 524, is formed using two disconnected metal plates that sandwich the same organic dielectric sheet in such a manner that the each plate of the inter-resonator coupling capacitor electrode connects to separate inductors. In addition, a second organic dielectric layer and a third organic dielectric layer sandwich the first organic dielectric layer, and comprise a high frequency hydrocarbon material with a thickness of 30-40 mils, which are disposed so as to sandwich said first dielectric sheets there between.

The bandpass filter 500 further comprises an additional dielectric layer, in this case solder mask, provided on an outermost one of the shield electrodes to protect the outermost shield electrodes. The inductors 512, 514 did not provide the needed capacitance in the desired length, and therefore each are connected to a separate grounded/shunted parallel plate using the same first organic layer as the sandwiched dielectric, which then together form the resonator pairs 560, 562, as illustrated. In the illustrated device, parallel plate capacitors 526, 528 are utilized on either side of the first and last resonator elements at the input and output terminals of the device for impedance matching purposes. If greater density is desired multiple thin layers such as the first dielectric layer can be used to form multi (>2) plate capacitors.

The bandpass filter 500 further comprise two external ground shield electrodes 534 respectively formed on different side surfaces of a laminated body comprising said first through three or more dielectric layers and connected to said shield electrodes. Additionally these provide the connection for the shorted inductors/resonators and capacitors. Moreover, the presence of these external electrodes makes it a CPW/stripline topology, where the reference is on the same first dielectric layer provides the shielding internally, and also provides for the ground connectivity to the resonators/inductors and capacitors.

The bandpass filter further comprises an external input terminal electrode 564 and an external output terminal electrode 566 which are formed on one side surface of a laminated body comprising said first through three or more dielectric sheets. External side wall shield electrodes 534 (FIG. 7) are provided between said external input and output terminal electrodes on the side surfaces of the laminated body and external ground shield electrodes 548 are provided on opposing top and bottom surfaces of the laminated body and are electrically connected to the side wall shield electrodes 534.

The patterning of the external ground shields electrodes 548 on the top and bottom surfaces is required for leaving space for the signal input output as shown in FIGS. 7 and 8.

In the organic bandpass filter 500, the first step to making connection between devices is done by drilling through holes as small as 2 mils with pads as big as three times the size of the via through LCP and copper. Both sides of LCP copper laminate are then metalized via electroless. The copper on both sides of laminate is then electroplated, and the copper layer is printed and etched to define filter component.

The second and third organic dielectric layers are Rogers 4350 from Rogers Corporation with a generally larger thickness than the first organic dielectric layer, such as approximately 35 mils, with copper metal (for high power applications) on both sides of filter to a given thickness to encapsulate components. All metals are electroplate and etched and patterned on top and bottom of the device to leave space for signal input and output.

The side wall grounded shield electrodes 534 can be obtained by single or multiple connected drilled plated through holes and then connected via electroless or sputter seeded copper in through hole. Electroplate copper in through hole and on surface. Print and etch copper to form SMD connection. The copper electrodes may be electroless NiAu plate to prevent excess oxidation.

FIG. 9 shows model to hardware correlation for the organic bandpass filter 500 in FIGS. 7 and 8. The filter was measured using an HP 8720ES Vector Network Analyzer after performing a SOLT calibration. The measured data for the fabricated filter and simulated data is shown. As evident from FIG. 9, there is excellent correlation between measured data and simulated data. The organic bandpass filter 500 was fabricated using LCP for the first organic dielectric layer, and shows an insertion loss of only 1.88 dB at 3 GHz and a 1 dB bandwidth of 200 MHz. Such a filter would be suitable for IF frequency use in fixed wireless type receivers where the carriers frequency of the incoming signal is approximately 14 GHz and has to be down-converted to several lower frequency signals.

The organic bandpass filter 500 utilizes a CPW/stripline topology with only two metallization levels and all embedded passives in an organic substrate, which resulted in better performance than non-standardized multilayer (>5) ceramic processes, as seen in FIG. 9.

It is worth noting that while the Q of the capacitors for filter 500 was measured as high as 200 at 3 GHz using LCP, the Q for the inductor was kept at the required level of approximately 100 at 3 GHz. This was done to understand the advantages of using a material such as LCP without optimizing the design for the inductors. However, Qs exceeding 200 are also attainable for inductors on organic substrates. A resimulation for the filter circuit shown, but with Qs of 200 for the inductors, showed an insertion loss of 1.15 dB when simulated. A filter with a loss of 1.15 dB at the frequency and bandwidth can be alternatively achieved only by using the bulkier and costlier ceramic cavity and monoblock filters.

EXAMPLE II

Another organic bandpass filter 600 in accordance with an embodiment of the present invention is shown in the picture of FIG. 10. The filter 600 comprises shorted hybrid CPW-microstrip, meander inductors 612, 614 formed close to each other on a first organic dielectric layer, which is a layer of LCP, directly magnetically coupled to each other. The term "shorted" refers to one end of each inductor connected to the large metallic area, which in this case serves as the in-built shield 630 (also referred to as a coplanar ground ring). In addition, the filter 600 includes an inter-resonator parallel plate coupling capacitor electrode 624 with in-built shield 630 formed using two disconnected metal plates that sandwich the first organic dielectric layer in such a manner that the each plate of the inter-resonator coupling capacitor electrode connects to separate resonators. Yet further, the filter 600 includes a first shield electrode formed respectively on a second organic dielectric layer, which in this case is Rogers 4350 from Rogers Corporation, and which is disposed over the circuitry described above, so as to sandwich and substantially completely shield one surface of the filter.

The filter may further comprise a third organic dielectric sheet, if needed, provided on the outside of the shield electrode to protect the outermost shield electrode. In this filter, the inductors 612, 614 did not provide the needed capacitance in the desired length, and therefore each is connected to a separate grounded/shunted parallel plate (two plate) using the same first organic layer as the sandwiched dielectric, which then together form the resonator pairs. In addition, parallel plate/interdigital capacitors 626, 628 are utilized on either side of the first and last resonator elements at the input and output terminals of the device for impedance matching purposes. If greater density is desired, then multiple thin layers such as the first dielectric layer can be used to form multi (>2) plate capacitors. In addition, another dielectric layer such as lower temperature melt LCP compare to the higher melt temp LCP used as the first dielectric is laminated on the other side of the first substrate (not the same side as the second substrate), and then solder bump openings are made where ground and input output connections are required to connect the device to corresponding terminals on the board.

The CPW topology, where the reference is on the same first dielectric layer provides the shielding internally, provides for the ground connectivity to the resonators/inductors and capacitors. However in more noisy environments the external electrodes, such as those in Example I, could be added for added shielding.

In the second bandpass filter, the openings in the third substrate allow for the ground connection connected to the CPW ground and two other openings not connected to each other or the ground serving for input and output terminals.

The first step to making connection between devices is by drilling through holes (as small in diameters as the thickness of the dielectric used) through the first organic dielectric layer of LCP and copper. Then both sides of LCP copper laminate are metalized via electroless copper. Copper is then electroplated on both sides of laminate. The copper is then printed and etched to define filter component.

The second organic dielectric layer can be laminate LCP or another appropriate dielectric with generally larger thickness than the first organic dielectric layer with copper metal (for high power applications) plated on top of the filter to a given thickness of approximately 20-30 μm to encapsulate components. The third organic dielectric layer is laminate LCP or another appropriate dielectric with generally larger or smaller thickness than the first organic dielectric layer with copper plated in the openings to a given thickness to provide for solder landing pads. The openings in the third substrate are filled with screen solder paste and reflowed to form bumps.

FIG. 11 shows model to hardware correlation for the organic bandpass filter 600 in FIG. 10. In summary, the filter utilizes a CPW topology with only two metallization levels and all embedded passives in an organic substrate, which resulted in better performance than of non-standardized multilayer (>5) ceramic processes. As the adoption of lower loss materials, such as LCP, becomes more common, this design shows the feasibility of integrating very low loss filters for applications such as Bluetooth/WLAN in compact boards and packages.

The measured data for the filter 600 and simulated data is shown in FIG. 11. As seen there is excellent correlation between measured data and simulated data. The filter 600 has an insertion loss of only 2.22 dB.

It is worth noting that while the Q of capacitors may be as high as 300 using LCP, the Q for the inductor was kept at the required level of approximately 130. The insertion loss was 0.6 dB lower than the MLC filters with similar footprint. A resimulation for the filter circuit shown, but with Qs of 200 for the inductors, showed an insertion loss of 1.65 dB when simulated. A filter with a loss of 1.65 dB at the frequency and bandwidth desired of the Bluetooth/WLAN filter can be alternatively achieved only by using the bulkier and costlier ceramic cavity and monoblock filters.

EXAMPLE III

Yet another organic bandpass filter 700 in accordance with an embodiment of the present invention is shown in the picture of FIG. 12. The organic bandpass filter 700 comprises shorted hybrid CPW-microstrip meander inductors formed close to each other on a first organic dielectric substrate, such as epoxy based Vialux by E.I. du Pont de Nemours and Company, directly magnetically coupled to each other. In addition, the third bandpass filter comprises an inter-resonator parallel plate coupling capacitor electrode 724, with ground ring, formed using two disconnected metal plates that sandwich the same organic dielectric sheet in such a manner that the each plate of the inter-resonator coupling capacitor electrode connects to separate resonators.

The transmission line inductors 712, 714 did not provide the needed capacitance in the desired length. Since the dielectric is lossy for the capacitor application, each is replaced by a separate discrete capacitor 702, such as a chip capacitor or ceramic capacitor with one terminal of one capacitor connected to one resonator and the other shorted to the in-built shielding electrode 730. The same can be done for the other capacitor 724 where one terminal is grounded, i.e., connected to a CPW ground electrode 730 and the other terminal is connected to the resonator section. In addition, a parallel plate/interdigital capacitors 726, 728 are utilized on either side of the first and last resonator elements at the input and output terminals of the device for impedance matching purposes. If greater density is desired multiple thin layers such as the first dielectric layer can be used to form multi (>2) plate capacitors.

The organic bandpass filter 700 may further comprise another monoclad second organic dielectric layer that is laminated on the one side of the first organic dielectric layer (opposite the side of the discrete capacitors). In addition, it may further comprise multiple plate through holes going through first and second organic dielectric layer connected to the in-built shielding electrode 730 and metal sheet of the monoclad dielectric. This may or may not be desired for cost saving purposes, though adding these vias makes it a true CPW/microstrip hybrid device. The CPW topology, where the reference is on the same first organic dielectric layer, provides the shielding internally, and also provides for the ground connectivity to the resonators/inductors and capacitors. However in more noisy environments the external through holes can be added for added shielding.

The organic bandpass filter 700 may further comprise a third organic dielectric layer on the same side as the discrete capacitors 702 providing for protection of the circuits and seal the device from moisture uptake and corrosion. This material could be the same as solder mask materials, which would be used by the board manufacturers to protect other circuits on the board. In addition, the bandpass filter 700 may further comprise a metallic lid or cap/electromagnetic shield which encloses the device on the top surface and prevents EMI interference and radiation effects from affecting the performance of the filter.

FIG. 13 shows model to hardware correlation for the organic bandpass filter 700 in FIG. 12. In particular, FIG. 13 shows a model to hardware correlation for the filter with all embedded components, except the two discrete capacitors. As shown, there is very good agreement between measured and predicted results. The measured filter has a center frequency=1.9 GHz, a 1 dB passband of 60 MHz, and a 3 dB bandwidth of 120 MHz. The attenuation at 1.5 GHz is ~40 dB, as desired. The insertion loss is approximately 3.8 dB at 1.9 GHz, which is greater than the specification of 3 dB for such applications. This is due to the use of center and matching capacitors with Qs of 40 in Vialux rather than the required Q of 60 needed to achieve a lesser loss of 3 dB. This insertion loss can be lowered by using APPE™ or LCP™ from Rogers Corporation dielectric materials for the organic dielectric layer. Such a filter would be applicable in cellular phones as the intermediate RF filter or in cordless phones as the front-end RF filter.

As seen in FIG. 13, there is a discrepancy in the measured and predicted results beyond 2.5 GHz for $S_{21}$. This discrepancy is due to the coupling between the two discrete capacitors. The simulations were done for individual components and for optimizing the spacing between the inductors. The discrete capacitors were measured as individual components without any coupling between them. The tight spacing between the capacitors could have resulted in unwanted coupling effects which show up at frequencies greater than 2.5 GHz. After including a mutual coupling term between the two discrete capacitors, the results show better agreement with measurements.

Thus, the organic bandpass filter 700 utilizes a CPW topology with only two metallization levels and an epoxy based substrate along with discrete capacitors, which achieves the performance of non-standardized multilayer (>5) ceramic processes. Additionally, the MLC filters cannot be integrated with other components in the same layers of the ceramic package due to several reasons, a few of which include: firstly, because of the use of a filter-specific dielectric which is incompatible with other dielectrics; secondly, because of the specificity of certain attributes such as 100 μm thick aluminium conductor lines required to lower the attenuation present due to standard 5 μm lines used in ceramic processes. The design discussed in this section was fabricated using standard design rules pertinent to multilayer laminate boards and can be directly implemented on the board without the need for a separate surface mount device. Furthermore, the model to hardware correlation shows validity of the design tecchnique used.

IV. RF Transceivers

FIGS. 14 and 15 are illustrative of two respective approaches in which multi-band transceivers can be implemented according to an embodiment of the present invention. In particular FIG. 14 illustrates an exemplary multi-band receiver portion of a transceiver that uses multiple single-band paths, each of which may be selectable using switches. Referring to FIG. 14, two parallel paths 802 and 818 are provided for a multi-band receiver in which each path operates in a different frequency range (or band). In particular, path 802, which operates for a first frequency range, includes a single-band antenna 804 for receiving signals in the first frequency range, a bandpass filter 806, a balun /matching network 808, an RF integrated circuit 810 that is operable with a first voltage controlled oscillator 812. The RF integrated circuit 810 may include a single-band low noise amplifier (LNA), a mixer, one or more intermediate frequency (IF) filters, and perhaps a frequency downconverter. After processing by the RF integrated circuit 810, a common baseband signal 814 is received by baseband processor 816, which may include components such as flash RAM, an analog-to-digital converter (or a digital-to-analog converter in the case of a RF transmitter), and power management capabilities. Similarly, path 818, which operates for a second frequency range, includes a single-band antenna 820 for receiving signals in the second frequency range, a bandpass filter 822, a balun/matching network 824, an RF integrated circuit 826 that is operable with a first voltage controlled oscillator 828. The RF integrated circuit may include a single-band low noise amplifier (LNA), a mixer, one or more IF filters, and a frequency downconverter. After processing by the RF integrated circuit 826, a common baseband signal 814 is received by baseband processor 816.

FIG. 15 illustrates an exemplary multi-band receiver portion of a multi-band transceiver that uses only a single multi-band path 902. The multi-band transceiver may utilize narrow-band devices operational at specific multiple frequency bands and/or wide-band devices, with the range of frequencies covering multiple frequency bands. Referring to FIG. 15, path 902, which may operate for two or more frequency ranges, includes a multi-band antenna 904 for receiving signals in various frequency ranges, a multi-band bandpass filter 906, a multi-band balun/matching network 908, an RF integrated circuit 910 that is operable with a multi-band voltage controlled oscillator 912. The RF integrated circuit 910 may include a multi-band low noise amplifier (LNA), mixer, and frequency downconverter. After processing by the RF integrated circuit 910, a common baseband signal 914 is received by baseband processor 916, which may include components such as flash RAM, an analog-to-digital converter (or a digital-to-analog converter in the case of a RF transmitter), and power management capabilities.

Note that FIGS. 14 and 15 are exemplary in nature only and that many variations would be known to one of ordinary skill in the art. For example, a combination of the approaches shown in FIGS. 14 and 15 are possible, where there may be one single band path and another multi-band path. In addition, with respect to FIGS. 14 and 15, there may also be multiple filters along the signal paths and more than one mixer present. Likewise, there may be additional intermediate frequency stages utilized, which may not be shown in FIGS. 14 and 15. Further, the above approaches are applicable to the multi-band transmitter portion of the transceiver and would be readily recognized by one of ordinary skill in the art. For example, a digital-to-analog converter may be used to generate a signal that is filtered, amplified, upconverted by a frequency upconverter, and additionally amplified by a high power amplifier before transmission.

With respect to the choice between the exemplary approaches illustrated in FIGS. 14 and 15, or a combination thereof, several design considerations may be evaluated. In particular, frequency bands may be designated as either concurrent or non-concurrent based on the functionality required. In addition, multi-band devices may be designed for paths that are specified to be concurrent by using chip-package co-design methodologies. Many modifications to the above embodiments would be known to one of ordinary skill in the art.

Voltage Controlled Oscillators

High performance voltage controlled oscillators (VCOs) as shown in FIG. 14 may be utilized for the generation and regulation of carrier waves in an RF transceiver. The phase noise of an oscillator in an RF transceiver may determine the noise floor and interference issues. More particularly, the phase noise of the oscillator may degrade the receiver selectivity due to spreading of the transmitted signal and degrade the receiver sensitivity or receiver noise floor. Further, a high VCO phase noise may cause spurious emissions from a communications system. Therefore, it may be preferable to control certain specifications of the oscillator including reducing the phase noise.

The phase noise figure of an oscillator is inversely proportional to the quality factor (Q) of the oscillator's resonator and the power consumption of the oscillator. Because system power requirements oftentimes specify the power consumption of the VCO, it is not always possible nor desirable to increase the power consumption of the oscillator in order to reduce the phase noise. However, the Q of the resonator in the oscillator may be increased according to an embodiment of the present invention, thereby reducing the phase noise of the VCO. In particular, embodiments of the present invention may use high-Q passive components fabricated on organic substrates for the VCO that result in integrated devices with a low phase noise.

FIG. 16A illustrates a circuit diagram of a Colpitt's oscillator that can be implemented using high-Q passive components fabricated on organic substrates to achieve a high-performance oscillator according to an exemplary embodiment of the present invention. The Colpitt's oscillator in FIG. 16A was designed to operate at 2.2 GHz. Referring to FIG. 16A, the oscillator is packaged with a BJT 1002 (bipolar junction transistor) and high-Q inductors and capacitors fabricated on an organic substrate such as LCP (liquid crystalline polymer). The BJT 1002 may be, for example, a discrete BJT HBFP-0420 (SOT-343 packaging) from Agilent. The output of the BJT 1002 is matched to 50 Ω load (RL 1008) by using a capacitor Cmatch 1006. The output match increases the output power of the oscillator, which helps improve the phase noise performance of the oscillator. The frequency of oscillation can be determined by the parallel combination of the inductor L 1012 and capacitors C1 1014 and C2 1016. According to an embodiment of the present invention, at least a portion of the passive components in the oscillator circuit may be fabricated on an LCP-based substrate. Alternatively, in other embodiments, some of the passive components, including the resistors Rb 1004 and Re 1005 and capacitor Cb 1003, may be fabricated as discrete components such as surface mount components.

The layout for the passive networks shown in FIG. 16A was designed to achieve unloaded Qs of approximately 100 for the passive components in order to obtain near minimum phase noise performance for the oscillator. Increase in the unloaded Q of the resonant tank formed by inductor L 1012 and capacitors 1014 and 1016 beyond a certain point (e.g., 300) may have a diminishing effect on the phase noise performance of the oscillator. Hence, the use of organic substrates such as LCP as shown in FIG. 16B or polyphenyl ether may be used since they may provide Qs of over 100 for capacitors. In order to make the designs more compact, a two-layer cross-section was utilized for the substrate as shown in FIG. 16B. According to FIG. 16B, the layout includes metal layers 1050, 1052, and 1054. Metal layers 1050 and 1052 may be approximately 9 μm thick while metal layer 1054 may be approximately 5 μm thick. In addition, the layout includes LCP and bondply layers 1056 and 1058 along with hydrocarbon layer 1060. The LCP and bondply layers 1056 and 1058 may be comprise LCP that is approximately 25 μm thick. The hydrocarbon layer 1060 may be approximately 32 mils thick. It will be appreciated by one of ordinary skill in the art that the cross-section in FIG. 16B is for illustrative purposes only. Many other variations are possible, including varying the thickness of the metal layers and organic layers. In addition, the numbers of metal layers and organic layers may change depending on the number of components to be included and the specification of the components. Further, the hydrocarbon layer 1060 may be a PCB (printed circuit board) or even replaced by another material that provides for sufficient rigidity.

A layout for the circuit diagram shown in FIG. 16A is shown in FIG. 16C. The layout shown in FIG. 16C utilized a CPW (coplanar waveguide) topology where the ground is coplanar for all the devices. The discrete components used for biasing and decoupling (Rb, Re, and C) are also shown in FIG. 16C. In this particular case, Rb was 22KΩ, Re was 100Ω, and decoupling capacitor C (not shown in FIG. 16A) was 1000 pF. The layout shown in FIG. 16C corresponds to metal layer 1050 in FIG. 16B. FIG. 16D shows a layout for the metal layer 1052 in FIG. 16B. The layout in FIG. 16D includes the bottom metal plates (shown in the gray portion) corresponding to the top metal plates of the parallel plate capacitors in FIG. 16C.

It will be noted however that the layout corresponding to metal layer 1052 is not shown, but will be understood to contain other components, including the corresponding plates of the capacitors shown in FIG. 16C. One of ordinary skill would readily recognize that alternative topologies besides CPW shown in FIG. 16C are possible, including microstrip, stripline, or a combination of the foregoing.

The oscillator described above was simulated in Agilent's ADS (advanced design system) after including all the parasitics of the package as well the embedded passive components and the active device (e.g., the BJT). The biasing resistors (Rb and Re) were adjusted to provide a current of approximately 4 mA for which the BJT parameters are optimized. The total power dissipation in the device was approximately 10.8 mW. The output power delivered to the load was approximately −6 dBm. The waveform from that simulation is shown in FIG. 17 and indicated that there was no distortion in the sine wave nature of the output power. The output power decreased significantly as the load value was changed or the frequency was varied, which indicated a narrow band of frequency matching. This was due to the matching element, however, which was limited to a single capacitor Cmatch 1006 for compactness. Should a wider bandwidth of frequency matching be needed, the matching circuit could be modified to be an "L" or "PI" network to increase the bandwidth.

The oscillator was fabricated according to the layouts shown in FIGS. 16B and 16C. The output power of the fabricated oscillator was then measured using Hewlett Packard's 4407b series Spectrum Analyzer. As shown in FIG. 18, the frequency of oscillations was maintained at 2.25 GHz with a measured output power of approximately −6 dBm. When the DC supply voltage was varied from 2.7V to 4.0V, the frequency of oscillation changed from 3.25 GHz to 3.18 GHz with a measured output power of +3 dBm.

As an aside, the quality factor (Q) of the resonant tank circuit on the LCP substrate may be sufficiently high-perhaps in the range of 120-130. The sensitivity of an oscillator to the changes in the Q of the passive components can be analyzed as follows: The phase noise of −80 dBc/Hz is measured with a capacitor Q of approximately 300 and the inductor Q of around 100. So the equivalent Q of the resonant tank circuit is close to the Q of the inductor. When a high loss element such as a varactor diode (with Q of approximately 5-10 at 2 GHz) is added to the tank circuit the effective Q capacitive network becomes approximately 60. This Q is then raised to a higher value due to the high Q inductor. When the resonant circuit is replaced by a crystal with a Q of 10000 in series with a varactor diode of Q approximately 5-10, the change in the phase noise of the oscillator was trivial when compared to the obtained phase noise on the LCP substrate. This calculation rationalizes the capacitor Q of 300 to be sufficient for a high performing oscillator.

Oscillator designs similar to those shown in FIGS. 16B and 16C can be implemented using other organic substrates besides LCP. For instance, epoxy-based substrates such as FR-4 epoxy can be utilized. FIGS. 19 and 20 show the measured performance for a 3.3 GHz and a 5.2 GHz oscillator, respectively, that were fabricated using the epoxy substrate. While fabricated oscillators utilizing LCP-based substrates generally have lower phase noise figures, the 5.2 GHz oscillator fabricated using the epoxy substrate still meets the phase noise figure specifications of the IEEE 802.11a protocol.

In addition to the Colpitt's oscillator discussed above, other oscillators may be implemented in accordance with embodiments of the present invention. For example, FIG. 21 shows a schematic diagram of a Hartley's oscillator. A Hartley's oscillator includes two inductors L1 1102 and L2 1104 and a capacitor C 1106 that provides amplitude control, frequency selection, and feedback. For simplicity, the bias and decoupling circuitry are not shown in FIG. 21. In FIG. 21, the inductors L1 1102, L2 1104, and capacitor C 1106 provide positive feedback from the collector of the transistor 1108 to the base. The inductors L1 1102 and L2 1104 and the capacitor C 1106 are utilized to provided a feedback network such that the circuit becomes unstable and oscillates. The output of the oscillator may be input into a buffer amplifier that isolates the circuit as well as matches it to the load. Some or all of passive components shown in 1110 may be fabricated on an organic substrate such as LCP according to an embodiment of the invention. Another alternative oscillator that may be implemented according to an embodiment of the present invention is a cross-coupled oscillator as shown in FIG. 22. In FIG. 22, only one inductor is shown, but it is possible to use two inductors to maintain symmetry of the layout. The passive components shown in 1150 may be fabricated on an organic substrate such as LCP according to an embodiment of the present invention.

FIG. 23A illustrates another exemplary oscillator designed for 1.8 GHz that may be implemented according to an embodiment of the present invention. The active device 1160 in FIG. 23A may be a surface mountable BJT. FIG. 23B illustrates an exemplary stackup for the oscillator shown in FIG. 23A. Referring to FIG. 23B, six metal layers are shown, which include M1 1160, M2 1162, M3 1164, M4 1166, M5 1168, and microstrip ground 1170. In addition, organic layers 1161, 1163, 1165, 1167, and 1169 are shown. Organic layers 1161, 1165, and 1169 may comprise LCP. Organic layers 1163 and 1167 may be core layers with a thickness of approximately 12 mils and a dielectric constant of approximately 3.35. The passive components shown in FIG. 23A may be formed on one or more of metal layers M1 1160, M2 1162, M3 1164, M4 1166, and M5 1168. Micro-vias 1172 may be provided for connecting the metal layers and thruhole 1173 provides for connections to the microstrip ground.

FIGS. 24A, 24B, and 25 show the measured characteristics of the oscillator shown in FIGS. 23A and 23B. According to FIG. 24A, the center frequency measurement corresponds to 1.8 GHz. FIG. 24B shows that the harmonic rejection is greater than 25 dB. FIG. 25 shows the phase noise measurements obtained from an E 4407B spectrum analyzer.

FIG. 26 shows a comparison of VCOs fabricated with various technologies. Referring to FIG. 26, the VCOs fabricated with LCP according to embodiments of the present invention, which include the oscillator shown in FIGS. 23A and 23B (see 1190), were among the best performers in at least size and power consumption.

Multi-band Voltage Controlled Oscillators

As shown in FIG. 14, multi-band transceivers can use a single oscillator for each frequency band of interest such as VCOs 812 and 828. As shown in FIG. 14, each receiver for the a frequency band in interest may have a separate signal path from the antenna to the baseband processor (see e.g., signal paths 802 and 818). However, because the RF/analog blocks in a transceiver may occupy a major portion of the system, the multi-band transceiver with multiple single band paths as shown in FIG. 14 may be less efficient in size and power consumption compared to the multi-band transceiver with only a single multi-band path as shown in FIG. 15.

As discussed previously with regard to FIG. 15, using a single concurrent, multi-band VCO 912 instead of individual oscillators for the frequency bands of interest may reduce board design time and the size of a multi-band transceiver when compared to the one in FIG. 14. In FIG. 15, the individual oscillators have been replaced with a single concurrent, multi-band VCO 912 until the first down conversion stage after which individual intermediate frequency (IF) signals (e.g., baseband signal 914) are processed by the baseband processor 916.

Concurrent multi-band VCOs, including those shown in FIG. 15, can also be implemented by fabricating passive components on organic substrates as described above. These passive components include high-Q passive components found in multi-resonant configurations, narrow band filters, and matching networks. Active components such as the discrete BJT and components for biasing the BJT are not necessarily embedded in the organic substrate.

In a simple form, the concurrent, multi-band VCO can generate signals at two or more different frequencies by using an oscillator with a feedback network satisfying the Barkhausen/Nyquist criterion at two or more different frequencies. According to a preferred embodiment, such a feedback network can have dual-band characteristic by making use of the dual network properties of such a passive network at different frequencies. With respect to the passive network, an inductor at one frequency may act more like a capacitor at a different frequency, and vice versa. For example, the capacitive feedback of the Colpitt's oscillator shown in FIG. 16A at 2.5 GHz is transformed into inductive feedback at 5.2 GHz. This may allow the same passive network to be reused in an oscillator in generating two signals at different frequencies.

Aspects of such an approach described above may include one or more of a) simultaneous optimization of space and power requirements to achieve desired phase noise performance, b) reduced power consumption by using the power consumed for a single oscillator to generate two unrelated distinct frequencies without the use of fractional multipliers, c) lower phase noise reducing the loop-bandwidth and hence lock-in time of PLLs (phase-locked loops), d) lower costs by using customizable embedded bandpass filters, and e) high Q passive components in organic packages.

As an example, a multiple-signal generator circuit of a concurrent, multi-band VCO is shown in FIG. 27. The active device 1200 may be Agilent's HBFP 0420 (SOT-343 package) surface-mount BJT with a gain-bandwidth product ($f_t$) of 18 GHz at 4 mA and a forward emission coefficient (NF) of 1.3 dB at 2.5 GHz and 1.9 dB at 5 GHz with an available gain of 14 dB. With such feedback-type oscillators, it may be necessary to control the resonance of the passive components forming the feedback network since they determine the feedback factor, which may control the RF output power, phase noise, and figure of merit (FOM). As shown in FIG. 27, at 2.45 GHz, the series resonators (C1 1201, L1 1202 and C2 1203, L2 1204) provide capacitive reactance (see chart 1205) whereas the parallel resonator at the collector of the BJT (Cc 1206 and Lc 1207) provides inductive reactance (see chart 1208). Thus, at 2.45 GHz, the circuit in FIG. 27 functions as a Colpitt's oscillator with capacitive feedback from the collector to the emitter (similar to FIG. 16A). At a higher frequency such as 5.2 GHz, the series resonators (C1 1201, L1 1202 and C2 1203, L2 1204) provide inductive reactance (see chart 1205) whereas the parallel resonator at the collector of the BJT (Cc 1206 and Lc 1207) provides capacitive reactance (see chart 1208). Thus, at 5.2 GHz, the circuit functions as Hartley's oscillator (see FIG. 21) due to resonance and anti-resonance of the series (C1 1201, L1 1202 and C2 1202, L2 1204) and parallel resonators (Cc 1206 and Lc 1207), respectively. While implementing the series and parallel resonators, some of the components may be explicitly found in the corresponding layouts, but it is also possible that one or more of C1 1201, L1 1202 and C2 1202, L2 1204, Cc 1206 and Lc 1207 may be represented as parasitics of another component.

The C1 1201, L1 1202 combination provides an equivalent capacitance of approximately 0.85 pF at 2.45 GHz and the C2 1203, L2 1204 combination provides an equivalent capacitance of approximately 2.3 pF at 2.45 GHz. Likewise, the parallel resonator (Cc 1206 and Lc 1207) at the collector of the BJT 1200 provides an inductance of approximately 3.9 nH at 2.5 GHz and a capacitance of 0.05 pF at approximately 5.2 GHz. When designing the series and parallel resonators, the reactance may be designed to be substantially constant at the frequency of interest. The constant reactance enables the oscillator design to be narrow-band and the specifications for the subsequent filter 1210 to be relaxed. The large signal loop-gain was determined using Agilent's Advanced Design System (ADS) simulator. The circuit was biased at 4 mA from a 2.7 V DC supply. The loop-gain was adjusted to be 1.4 at 2.4 GHz and 1.5 at 5.2 GHz.

For a high $f_t$ (e.g., >30 GHz) transistor, the trans-conductance ($G_m$) remains almost constant at the concerned design frequencies. Hence the 2.4 GHz and 5.2 GHz signals have similar characteristics and amplitude. In such a multi-signal, non-linear circuit, issues such as inter-modulation distortion and harmonic distortion may be prevalent and may affect the output signal purity. For example the first harmonic of the 2.45 GHz signal, which may occur at 4.9 GHz, must be significantly attenuated (e.g., perhaps >40 dB) to avoid distortion at the 5.2 GHz output. Thus, a traditional T or Pi-type matching network cannot be used in such a circuit with multi-band characteristics. If power consumption is a concern, purely passive matching may be used over active buffers. For a concurrent, multi-signal VCO, narrow band (e.g., 100 MHz), low loss, high out-of-band attenuation, and multiple transmission zeros type filters may be desirable. The design of the filters involves sufficient attenuation of the inter-modulation products and less than 0.5 dB ripple in the pass band. In addition, each filter should provide at least a transmission zero in the pass-band of the other designed filter.

The multi-band filter 1210 following the core circuit may be inductively-coupled dual resonator-type as shown in FIG. 28 according to an illustrative embodiment of the present invention. The filters in FIG. 28 are Chebychev type with transmission zeros providing sufficient isolation between bands. Each filter is designed to match the core circuit at its pass-band frequency while providing very low insertion loss. The filters provide a rejection greater than 40 dB at the pass band of the other filter. An additional zero is provided at 8 GHz which is the intermodulation product of the two frequencies (2.4 and 5.5 GHz). Such a response is desirable to meet the isolation requirements from other modules, such as the antenna, power amplifiers, in a multi-band environment.

FIG. 29 shows the broad-band simulated response of the dual-band filter 1210 for 50Ω input and output impedances. FIG. 30 shows the transient simulation of the complete 2.53 GHz and 5.2 GHz concurrent multi-band oscillator shown in FIGS. 27 and 28.

According to another embodiment, a concurrent signal generator for producing signals at 900 MHz and 1900 MHz will be described. FIG. 31A shows the schematic of a base-type concurrent oscillator that uses multiple resonance of passive components. The bias network is not shown for simplicity. FIG. 31A uses the same active device as used for the 2.4/5.2 GHz oscillator (i.e., Agilent's HBFP 0420 (SOT-343 package) surface-mount BJT) described with respect to FIG. 27.

FIG. 31B illustrates an exemplary stackup for the base-type concurrent oscillator of FIG. 31A. The stackup includes a 1 mil thick LCP layer 1350 that is laminated on a 32 mil lower melt adhesive (core) layer 1352. FIG. 31B also shows three metal layers, M1 1354, M2 1356, and M3 1358, which may be copper. The LCP layer 1350 may be an LCP with a dielectric constant of 2.95 and a loss tangent of 0.002. The adhesive layer 1352 may have a loss tangent of 0.0035 with a dielectric constant of 3.38. Further, high density inter-metal micro-vias 1360, perhaps with diameters <100 µm, may be formed with high yield. The micro-vias 1360 enable the passive components to be closely packed together. Additionally, through-holes 1362 may be employed for connection with the microstrip ground metal layer 1358. The surface mount device 1364 in FIG. 31B can be Agilent's HBFP 0420 (SOT-343 package) surface-mount BJT. FIG. 31C shows a top view of a layout for the oscillator of FIG. 31A. Note that not all of the components $L_1L_2C_1C_2$ network 1302 are implemented as separate components in the layout of FIG. 31C. For example, referring to FIG. 31C, inductor L2 is implemented in two stages, and the parasitic capacitance of L2 is C2.

The circuit in FIG. 31A may be biased at 10 mA from a −1V and 2V supply. The base-type oscillator may operate in a multiple reflection mode. Reflections ($S_{11}$>1) may occur at the emitter and collector of the BJT due to negative resistance. The frequency at which the reflections occur may be controlled by the value of base inductance ($L_1L_2C_1C_2$ network 1302). The $L_1L_2C_1C_2$ network 1302 may provide an inductance of 14 nH at 2 GHz and 20 nH at 900 MHz. The loop-gain can be determined using large signal S-parameters as shown in FIG. 32. The loop gain criterion (1∠0°) is satisfied at 890 MHz and 1.92 GHz. The phase of the large signal loop gain is zero at 2.3 GHz, but the magnitude of loop-gain is less than 1 so oscillations are avoided at 2.3 GHz. The filter of the 900 MHz and 1.9 GHz concurrent signal generator is similar to the one shown in FIG. 28, but without the mutual inductive coupling (M12 and M34). The simulated response of such a filter is shown in FIG. 33. The concurrent multi-band oscillator in FIG. 31A was simulated in the time domain to provide output signal at 892.8 MHz and 1.92 GHz. FIG. 34 shows the transient response of concurrent multi-band oscillator of FIG. 28A.

Low Noise Amplifiers

Several aspects may be evaluated in the design of a low noise amplifier (LNA) for an RF application, including reasonable gain, a good input impedance match, high linearity, and the lowest possible noise figure (NF). If the LNA is to be used in a portable device, such as a cell phone, the need for low power consumption also becomes important. The NF of an LNA is a measure of the amount of noise added by the circuit to the incoming signal, and is defined as the ratio of Signal-to-Noise Ratio (SNR) at the input of the device to the SNR at the output as shown below:

$$NF = \frac{(SNR)_{in}}{(SNR)_{out}}$$

In a simplified form, the LNA includes an active device with passive matching networks at its input and output. These matching networks provide impedance transformation for minimum NF at the input and maximum power gain at the output. The use of high-Q embedded passives in organic substrates for implementing these matching networks results in lower NF and higher gain for the LNAs. Additionally, like the VCOs described above, the passives can also be used for implementing multi-frequency resonant circuits, thereby making the LNAs operational at multiple frequencies.

FIG. 35 shows a circuit diagram of an exemplary low noise amplifier and a corresponding photograph of the fabricated device. In particular, FIG. 35 illustrates an LNA circuit with an active device (e.g., a bipolar junction transistor) and the matching networks that will be embedded in an organic substrate. FIG. 35 also shows a photograph of the fabricated LNA with the transistor and bias circuit soldered on. FIG. 36 shows the measured gain and input match for the LNA of FIG. 35.

One of ordinary skill in the art would recognize that many other embodiments of the LNA are also possible. For instance, instead of an explicit matching network at the input, the capacitance looking into the base/gate of the transistor may be made part of the matching network. Depending on the size and performance requirements, some of the passives can be placed on-chip, leading to a design-segmentation. As indicated previously, with the design of the LNA, the passive Q-factor affects the NF and gain of the LNA.

Implementing Circuits in Low Form Factor Modules

With the drive towards embedding wireless functionality in consumer devices (flat-panel displays, PDAs, etc.), implementation of the above multi-band multi-mode RF transceivers in low-profile ultra thin modules may also be desirable. According to an embodiment of the present invention, the topology and circuits discussed previously may be implemented in low-profile modules (e.g., a maximum thickness of 1.1 mm).

FIG. 37 is illustrative of three embodiments of low form factor modules according to embodiments of the present invention. The term "substrate" in each of the above diagrams consists of a multilayer stackup, including Hydrocarbons like Rogers 4350B, single or multiple layers of LCP, single or multiple layers of high-K materials or any combination of the above. Several different types of ICs may be supported by the substrate, including wire-bonded IC die, flip-chip IC die, and packaged IC (e.g., a surface mount). In addition, discrete components may be supported by the substrate, including resistors. An overmold may also be used for encapsulating the ICs and discrete components as shown in FIG. 37. According to alternative embodiments of the present invention, an even smaller version of the low form factor may be obtained by embedding the IC and the discrete component within the substrate. In this alternative embodiment, an overmold may not be needed, thereby further reducing the form factor.

FIGS. 38A-38F provide exemplary multi-layer stackups according to an embodiment of the present invention. The embedded passives can be of microstrip, stripline, co-planar waveguide (CPW) topology, or a hybrid thereof. Depending on size and performance requirements, the devices can be designed such that they are optimized for high performance or for small size.

Figure 38A:
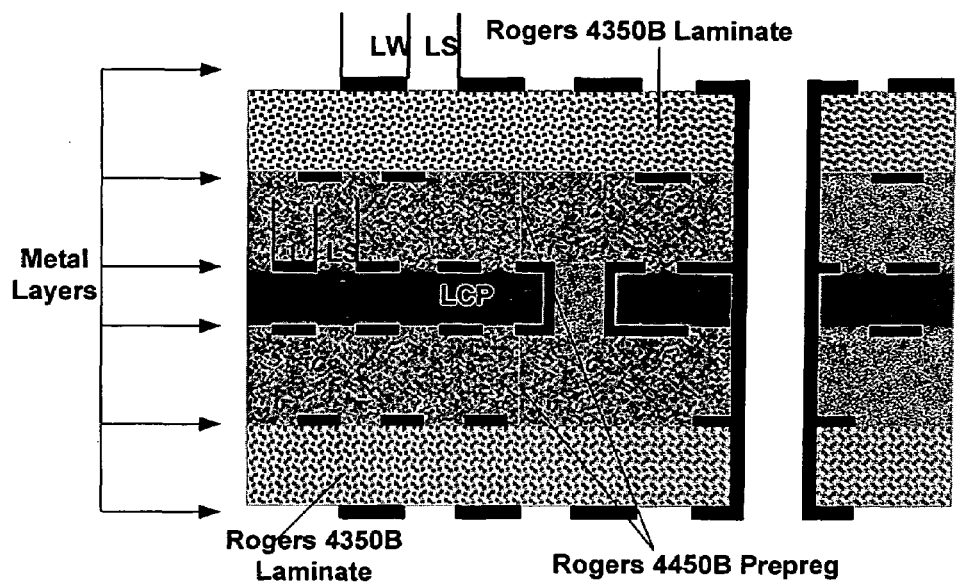
Figure 38B:
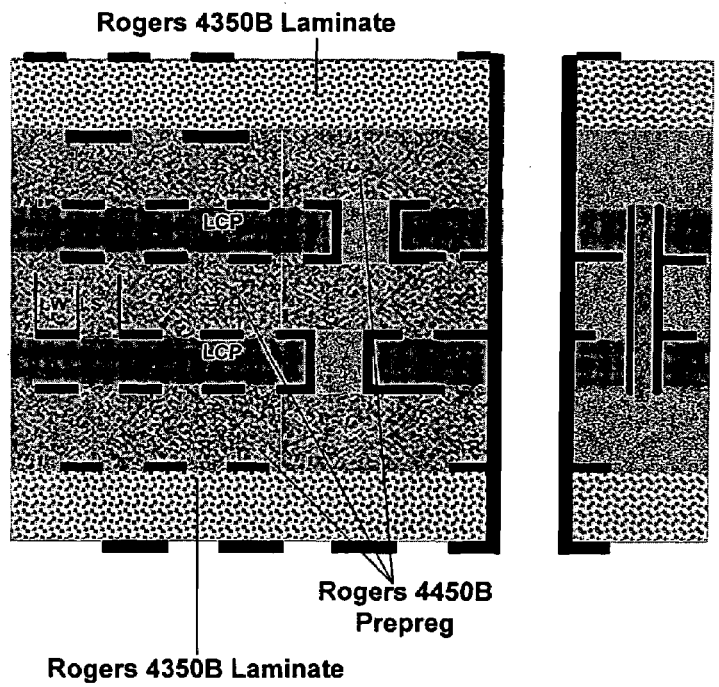

Specifically, FIG. 38A discloses six metal layers (metal being denoted by the dark lines). Both the top and bottom metal layers may function as ground shields. The metal layers on each surface of the LCP layer may contain inductors and parallel plate capacitors. The metal layers on the laminate layers adjacent the prepreg layers are optional and may contain additional components if desired, such as for added density. In accordance with an embodiment of the present invention, the inductors are preferably formed on the LCP layers and the capacitors are formed on either the LCP layer or the Laminate layers. FIG. 38B is an extension of FIG. 38A, in which an additional LCP layer with metal layers on opposite sides thereof has been added. More components, including parallel plate capacitors and inductors can be placed on this additional LCP layer. This additional LCP layer is separated from the other LCP layer by an additional prepreg layer, though the layer may be electrically connected by microvias.

FIG. 38C illustrates the layers shown in FIG. 38B, except that high K layers have been substituted as for the laminate layers. When compared to the laminate layers, the high K layers increase the separation and increase the capacitance for capacitor components that may be placed on the high K layers. Generally, the non-critical, lower-performing components would be placed on the high K layers. FIG. 38D illustrates three LCP layers that are separated by two prepreg layers. An aspect of the stackup shown in FIG. 38D compared to the previous stackups in FIGS. 17A-C is that this is an extremely thin stackup which may be on the order of a 0.3 mm thick substrate. Four metal layers are shown in FIG. 38D, which may contain components such as capacitors and inductors, providing for excellent density. FIG. 38D may be known as a high performance substrate. One of ordinary skill would recognize that the stackup in FIG. 38D is not limited to 3 LCP layers, but could contain additional layers, including another LCP layer that is separated from the other LCP layer by a prepreg layer.

Figure 38E:
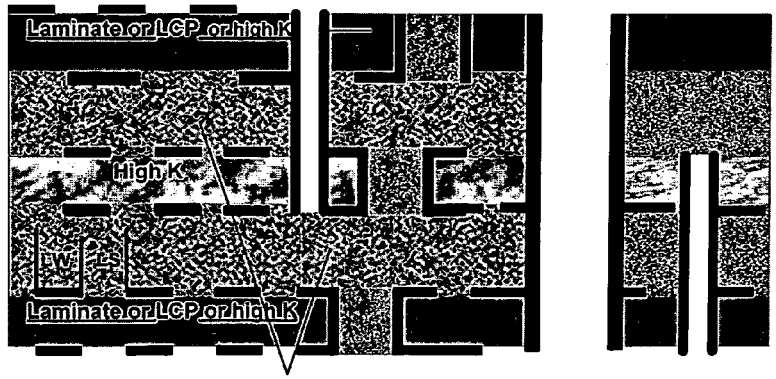
Figure 38F:
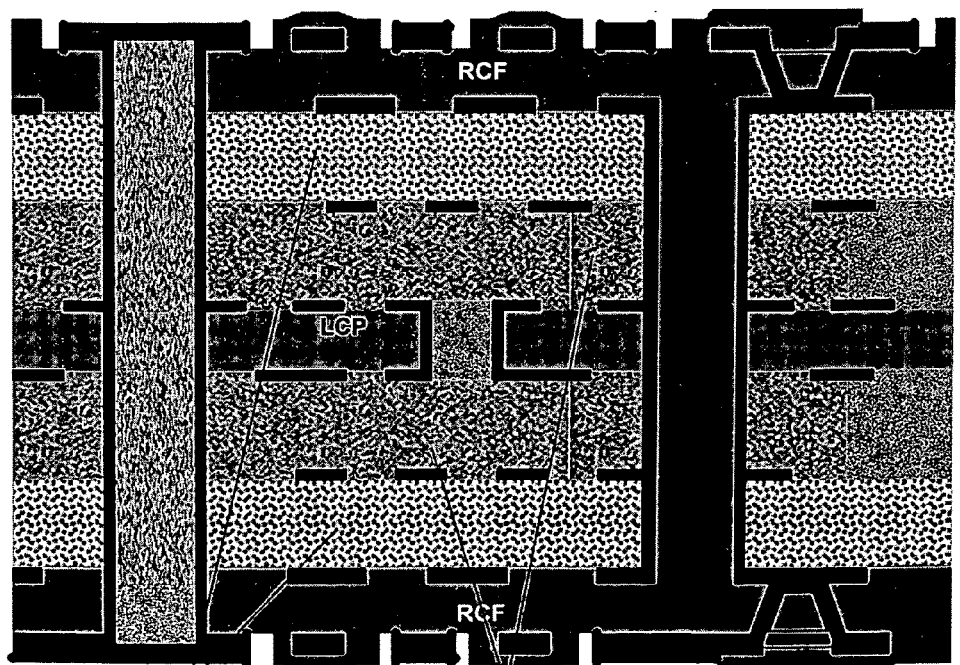

FIG. 38E illustrates an inner high K layer that is positioned between two laminate, LCP, or high K layers. In particular, the high K layer is separated from each laminate, LCP, or high K layer by prepreg layers on opposite sides of the high K layer. The high K layer and each of the laminate, LCP, or high K layers may contain metal layers on each surface to provide for integrated components such as inductor and capacitors. The stackup shown in FIG. 38E may be suitable for a baluns which may have a more relaxed performance specification. In such a case, the high K middle layer does not have to be fabricated with such stringent requirements (e.g., thickness), and is appropriate for use as an inner layer. FIG. 38F discloses a stackup similar to that shown in FIG. 38A, with the addition of exterior RCF (resin coated foil) layers. RCF (resin coated foil) allows for the same densities for lines and spacing and microvias but at a lower cost compared to high K and LCP. In addition, in FIG. 38F, the laminate layers could also be substituted with high K or LCP layers.

When working with hybrid CPW-stripline topology, the higher performance components will typically need to be further away from ground while the lower performance components may be closer to ground. For example, in FIG. 38B, inductors may be placed in the inner LCP layers while parallel plate capacitors may be placed on the laminate layers. However, parallel plate capacitors could also be placed on the inner LCP layers as well.

Accordingly, embodiments of the VCO and LNAs described above can be implemented in accordance with FIGS. 37 and 38A-F.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A multi-band RF device operable at a first frequency and a second frequency different from the first frequency, comprising:
    an active device;
    a first passive network in communication with the active device, the first passive network comprising a first matching network at an input of the active device;
    a second passive network in communication with the active device, the second passive network comprising a second matching network at an output of the active device; and
    an organic-based substrate having at least two metal layers, wherein the two metal layers are patterned to form at least a portion of the first passive network and the second passive network, wherein impedances of the first and second passive networks are different at the first frequency than the second frequency.

2. The multi-band RF device of claim 1, wherein the first and second passive networks comprise resonant circuits, and wherein the impedances of the first and second networks comprise reactance.

3. The multi-band RF device of claim 2, wherein the active device is a bipolar junction transistor, wherein the multi-band RF device is an oscillator, and wherein a first oscillation signal at the first frequency and a second oscillation signal at the second frequency are simultaneously generated.

4. The multi-band RF device of claim 1, wherein the active device is a bipolar junction transistor and wherein the multi-band device is a low noise amplifier operable for providing power gain at the first frequency and the second frequency.

5. A multi-band low noise amplifier for use in an RF application, comprising:
    an active device;
    a first matching network in communication with the active device, wherein an impedance of the first matching network at a first frequency is different than the impedance of the first matching network at a second frequency;
    a second matching network in communication with the active device, wherein an impedance of the second matching network at the first frequency is different than the impedance of the second matching network at the second frequency; and
    a multi-layer organic-based substrate having at least one metal layer, wherein the first matching network and the second matching are formed on the at least one metal layer and wherein the active device is mounted on the multi-layer organic substrate, thereby allowing the an output of the multi-band low noise amplifier to have desired power gains at the first frequency and the second frequency based at least in part on each of the first and second matching networks having the different reactance at the first frequency and the second frequency.

6. The multi-band amplifier of claim 5, wherein the active device is a bipolar junction transistor.

7. The multi-band amplifier of claim 5, wherein the multi-layer organic-based substrate comprises at least one of hydrocarbon and liquid crystalline polymer.

8. The multi-band amplifier of claim 7, wherein the first matching network is positioned at an input of the multi-band amplifier and the second matching network is positioned at an output of the multi-band amplifier.

9. The multi-band amplifier of claim 8, wherein the first matching network minimizes the noise figure for the multi-band amplifier at the input at both the first frequency and the second frequency.

10. The multi-band amplifier of claim 9, wherein the second matching network maximizes the desired power gains for the multi-band amplifier at the output at both the first frequency and the second frequency.

11. The multi-band RE device of claim 1, wherein the organic-based substrate comprises liquid crystalline polymer.

12. The multi-band RE device of claim 1, wherein the active device is a field effect transistor.

13. The multi-band RF device of claim 1, wherein the first passive network comprises a component embedded in the organic-based substrate.

14. The multi-band RE device of claim 1, wherein at least one of the metal layers is patterned to form at least a portion of a component included in the first passive network.

15. The multi-band RE device of claim 1, wherein the second passive network comprises a component embedded in the organic-based substrate.

16. The multi-band RE device of claim 1, wherein at least one of the metal layers is patterned to form at least a portion of a component included in the second passive network.

17. The multi-band amplifier of claim 5, wherein the first matching network comprises a component embedded in the organic-based substrate.

18. The multi-band amplifier of claim 5, wherein at least one of the metal layers is patterned to form at least a portion of a component included in the first matching network.

19. The multi-band amplifier of claim 5, wherein the second matching network comprises a component embedded in the organic-based substrate.

20. The multi-band amplifier of claim 5, wherein at least one of the metal layers is patterned to form at least a portion of a component included in the second matching network.

* * * * *

UNITED STATES PATENT AND TRADEMARK OFFICE
CERTIFICATE OF CORRECTION

PATENT NO.      : 7,489,914 B2                                              Page 1 of 1
APPLICATION NO. : 11/114733
DATED           : February 10, 2009
INVENTOR(S)     : Govind et al.

It is certified that error appears in the above-identified patent and that said Letters Patent is hereby corrected as shown below:

Column 1, line 17, insert the following paragraph:

--STATEMENT REGARDING FEDERALLY SPONSORED
RESEARCH OR DEVELOPMENT

This invention was made with U.S. Government support under agreement no. DMI-0120308, awarded by the national Science Foundation. The Government has certain rights in this invention.

This invention was further made with U.S. Government support under agreement no. DAAH01-99-D-R002-00, awarded by the United States Army. The Government has certain rights in this invention.--

Signed and Sealed this

Fourth Day of August, 2009

JOHN DOLL
*Acting Director of the United States Patent and Trademark Office*